(12) United States Patent
Bruhn, Jr. et al.

(10) Patent No.: US 10,845,397 B2
(45) Date of Patent: Nov. 24, 2020

(54) SYSTEMS AND METHODS FOR DETECTING LOAD COUPLING AND FOR DETECTING A LOAD TYPE

(71) Applicant: Control4 Corporation, Salt Lake City, UT (US)

(72) Inventors: Robert Don Bruhn, Jr., West Jordan, UT (US); Timothy Paul Spens, Saratoga Springs, UT (US)

(73) Assignee: WirePath Home Systems, LLC, Salt Lake City, UT (US)

( * ) Notice: Subject to any disclaimer, the term of this patent is extended or adjusted under 35 U.S.C. 154(b) by 74 days.

(21) Appl. No.: 15/419,677

(22) Filed: Jan. 30, 2017

(65) Prior Publication Data
US 2018/0219481 A1    Aug. 2, 2018

(51) Int. Cl.
*G01R 19/02*   (2006.01)
*G01R 19/175*  (2006.01)
*G01R 19/165*  (2006.01)
*H05B 47/10*   (2020.01)

(52) U.S. Cl.
CPC ........... *G01R 19/02* (2013.01); *G01R 19/165* (2013.01); *G01R 19/175* (2013.01); *H05B 47/10* (2020.01); *Y02B 70/126* (2013.01)

(58) Field of Classification Search
CPC ......... G01R 11/50; G01R 11/52; G01R 11/54; G01R 19/00; G01R 19/02; G01R 19/04; G01R 19/06; G01R 19/145; G01R 19/15; G01R 19/155; G01R 19/165; G01R 19/16571; G01R 19/16576; G01R 19/1659; G01R 19/175; G01R 31/02; G01R 31/024; G01R 31/026; H02H 3/382; Y02B 20/148; Y02B 20/146; H05B 39/02; H05B 39/04; H05B 39/048; H05B 39/0815; H05B 39/0845; H05B 39/0848; H05B 33/0815; H05B 33/0821; H05B 33/0824; H05B 33/0845; H05B 33/0848; H05B 33/0851;
(Continued)

(56) References Cited

U.S. PATENT DOCUMENTS 6,980,023 B1 *  12/2005  Wong ................. G01R 31/3167
                                                          326/14
9,279,835 B2    3/2016   Russell et al.
(Continued)

*Primary Examiner* — Steven L Yeninas
(74) *Attorney, Agent, or Firm* — Austin Rapp

(57) ABSTRACT

An electronic device for detecting a load type is described. The electronic device includes zero-cross circuitry configured to detect a line voltage zero cross and includes switching circuitry configured to perform switching based on the line voltage zero cross to supply a load voltage. The electronic device further includes load voltage measuring circuitry configured to measure the load voltage. The electronic device additionally includes a processor configured to determine a load type based on the load voltage measurement and configured to control the switching circuitry to drive the load based on the load type. An electronic device for detecting load coupling is also described. The electronic device includes load voltage measuring circuitry configured to measure load voltage without activating the load voltage. The electronic device also includes a processor configured to determine whether a load is coupled based on the load voltage measurement.

14 Claims, 26 Drawing Sheets

(58) Field of Classification Search
CPC ............. H05B 33/0854; H05B 33/089; H05B 41/3927
USPC ............... 324/76.77, 713, 762.01, 762.09; 327/74–79, 74–19; 315/291
See application file for complete search history.

(56) References Cited

U.S. PATENT DOCUMENTS

| | | | | |
|---|---|---|---|---|
| 2009/0027824 A1* | 1/2009 | Allen | .................. | H01H 9/56 361/170 |
| 2009/0096625 A1* | 4/2009 | Vanderzon | ............ | H02M 5/293 340/660 |
| 2010/0264831 A1* | 10/2010 | Nagaoka | ............ | H05B 33/0851 315/149 |
| 2010/0327778 A1* | 12/2010 | Schanin | ................ | H05B 39/08 315/309 |
| 2011/0121752 A1* | 5/2011 | Newman, Jr. | ........... | H05B 39/04 315/291 |
| 2011/0169426 A1* | 7/2011 | Sadwick | ............ | H05B 41/2824 315/307 |
| 2012/0007570 A1* | 1/2012 | Valenti | ................ | H02M 5/2573 323/235 |
| 2013/0187631 A1* | 7/2013 | Russell | ............. | G01R 19/2506 324/76.77 |
| 2013/0257406 A1* | 10/2013 | Hausman, Jr. | ............. | G05F 5/00 323/300 |
| 2014/0028196 A1* | 1/2014 | Takikita | ................. | H05B 37/02 315/130 |
| 2014/0081474 A1* | 3/2014 | Blakeley | ................... | G06F 1/26 700/291 |
| 2014/0159586 A1* | 6/2014 | Kido | ................... | H04B 10/116 315/151 |
| 2015/0301094 A1* | 10/2015 | Nastase | ................. | H01L 41/042 324/658 |
| 2016/0181911 A1* | 6/2016 | Knauss | ................. | G01R 19/16538 315/209 R |
| 2017/0069441 A1* | 3/2017 | Mishrikey | ............. | H02H 9/001 |
| 2018/0092174 A1* | 3/2018 | Mosebrook | ........ | H05B 33/0815 |

\* cited by examiner

SYSTEMS AND METHODS FOR DETECTING LOAD COUPLING AND FOR DETECTING A LOAD TYPE

TECHNICAL FIELD

The present disclosure relates generally to electronic devices. More specifically, the present disclosure relates to systems and methods for detecting load coupling and for detecting load type.

BACKGROUND

In recent years, the price of electronic devices has decreased dramatically. In addition, the size of electronic devices has continued to decrease. Further, electronic devices continue to increase in capability and convenience.

Decreasing prices and increasing capabilities of electronic devices has permitted modern devices to be conveniently used in homes and businesses. Many homes and businesses include multiple electronic devices to assist in everyday tasks. For example, electronic devices may be used for convenience and/or entertainment.

While some electronic devices may provide convenience and entertainment, many also require control. Moreover, these electronic devices consume electrical power and may consume other resources. Some electronic devices may not be compatible with other devices and some electronics may not be easy to use. Safety is also a concern with some electronic devices. As can be observed from this discussion, improvements to electronic device ease of use and/or safety may be beneficial.

DETAILED DESCRIPTION

Figure 1:
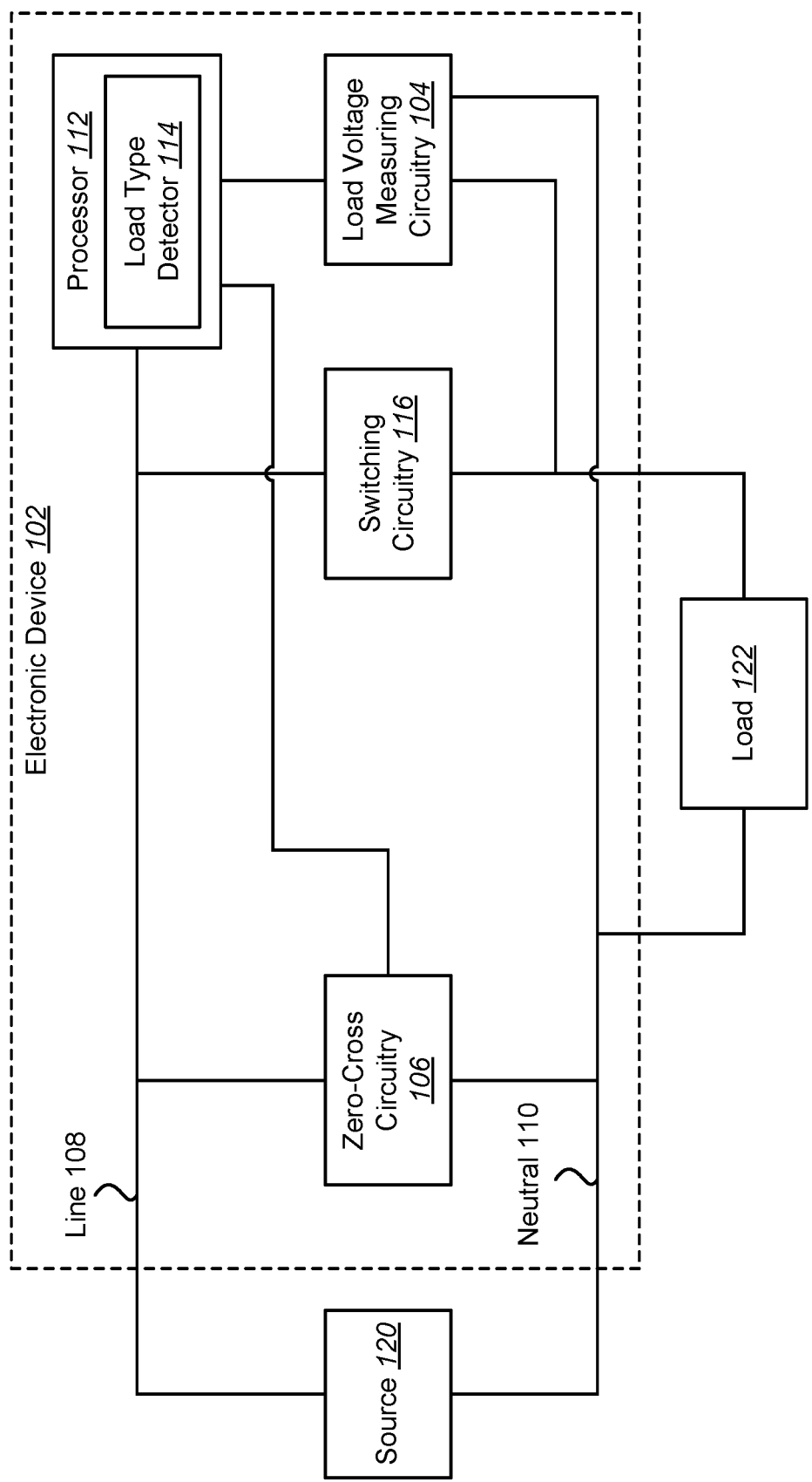
FIG. 1 is a block diagram illustrating one configuration of an electronic device for detecting a load type.

An electronic device for detecting a load type is described. The electronic device includes zero-cross circuitry configured to detect a line voltage zero cross. The electronic device also includes switching circuitry configured to perform switching based on the line voltage zero cross to supply a load voltage. The electronic device further includes load voltage measuring circuitry configured to measure the load voltage to produce a load voltage measurement. The electronic device additionally includes a processor coupled to the zero-cross circuitry, to the switching circuitry, and to the load voltage measuring circuitry. The processor is configured to determine a load type based on the load voltage measurement. The processor is configured to control the switching circuitry to drive the load based on the load type.

The processor may be configured to determine the load type based on the load voltage measurement by determining whether a load voltage spike is indicated by the load voltage measurement. A load voltage spike may be indicated in a case that the load voltage measurement exceeds a spike threshold.

The electronic device may include line voltage measuring circuitry configured to produce a line voltage measurement. The processor may be configured to determine the spike threshold based on the line voltage measurement.

In a case that a voltage spike is indicated, the processor may be configured to control the switching circuitry to drive the load in forward phase. In case that a voltage spike is not indicated, the processor may be configured to control the switching circuitry to drive the load in reverse phase.

The electronic device may include current measuring circuitry configured to measure a current to produce a current measurement. The processor may be configured to determine the load type based on the load voltage measurement and the current measurement. The processor may be configured to determine a zero-cross difference between the load voltage measurement and the current measurement to determine the load type or may be configured to determine a slope difference between the load voltage measurement and the current measurement to determine the load type.

A method for detecting a load type by an electronic device is also described. The method includes detecting a line voltage zero cross. The method also includes performing switching based on the line voltage zero cross to supply a load voltage. The method further includes measuring the load voltage to produce a load voltage measurement. The method additionally includes determining a load type based on the load voltage measurement. The method also includes driving the load based on the load type.

An electronic device for detecting load coupling is also described. The electronic device includes load voltage measuring circuitry configured to measure load voltage to produce a load voltage measurement without activating the load voltage. The electronic device also includes a processor coupled to the load voltage measuring circuitry. The processor is configured to determine whether a load is coupled based on the load voltage measurement. The processor may be configured to determine whether a load is coupled by comparing at least one amplitude aspect of the load voltage measurement to a first threshold or by comparing at least one timing aspect of the load voltage measurement to a second threshold.

The electronic device may include line voltage measuring circuitry configured to produce a line voltage measurement. The processor may be configured to determine whether a load is coupled by comparing at least one aspect of the line voltage measurement to at least one aspect of the load voltage measurement. The processor may be configured to determine whether a load is coupled by comparing a root mean square (RMS) value of a line voltage measurement to an RMS value of the load voltage measurement.

A method for detecting load coupling is also described. The method includes measuring load voltage to produce a load voltage measurement without activating the load voltage. The method also includes determining whether a load is coupled based on the load voltage measurement.

Some configurations of the systems and methods disclosed herein may relate to detecting load coupling and/or detecting load type. For example, some configurations may provide approaches for measuring the load voltage of a dimmer and utilizing the voltage to determine the load type (e.g., whether the load is inductive, resistive, or capacitive). The dimmer may then drive the load according to the load type.

Some electronic devices (e.g., phase cut dimmers) may change phase and activation (e.g., "turn on") times based on the type of load attached. Additionally or alternatively, adaptive phase dimmers may determine what type of load is attached to the dimmer and may accordingly drive the phase (e.g., forward phase or reverse phase) and/or activation/ deactivation times (e.g., "turn on/turn off" times).

In some approaches, a current waveform may be compared to line voltage to determine current lag and/or crest factor, which in turn may be used to determine what type of load is attached to the dimmer. However, these approaches may not always give an accurate indication of the attached load type. This may be due to delays in capacitive lighting power supplies and magnetic loads with power factors very close to 1. A load voltage circuit may be implemented in addition to or alternatively from these approaches. For example, load voltage timing versus current may be utilized to determine the load type. Additionally or alternatively, voltage spiking above a set threshold may be utilized to determine what type of load is attached.

In some configurations, load voltage may be monitored during a detect sequence on power up. Additionally or alternatively, load type detection may be initialized through a control system (e.g., a device control system, home automation system, etc.). For example, a control system may receive a command from an installer to detect a load type, which may cause a dimmer to run load type detection. If a load voltage spike is detected that exceeds a set threshold, then the load may be an inductive load and the dimmer may accordingly drive the load in forward phase.

Additionally or alternatively, the load voltage measuring circuitry may be utilized with current measuring circuitry to determine a lead or lag of current compared to load voltage. In some approaches, crest factor may be calculated between load voltage and current. For example, a crest factor may be calculated for the load voltage measurement and compared to a calculated crest factor for the current measurement. The lead or lag of current and/or crest factor are additional or alternative ways that a load voltage can be utilized to detect load type and/or drive the load in the correct phase. In some approaches, line voltage measuring circuitry may be utilized with the load voltage measuring circuitry to determine load type. In detecting the load type, for example, the load voltage may be monitored. If the load voltage exceeds the line voltage, the load may be an inductive load.

The load voltage circuitry, supporting circuitry and/or a processor with instructions (e.g., firmware on a central processing unit (CPU)) may allow an electronic device (e.g., dimmer) to detect and/or drive all load types properly. One or more of the features provided by the load voltage circuitry may make the electronic device (e.g., dimmer) safer to install and/or may make the electronic device last longer. Additionally or alternatively, utilizing the load voltage circuitry may reduce protection circuitry.

Some configurations of the systems and methods disclosed herein may relate to detecting whether an electronic device (e.g., dimmer) is loaded or unloaded without turning on the load. When electronic devices (e.g., dimmers) are turned on without any load, this may present issues on how to detect and/or drive a load that is not attached yet. This may also pose a safety risk to an installer (e.g., electrician). For example, an installer may potentially be electrocuted if he or she interfaces with a load wire (e.g., dimmer load wire) that is not terminated. Wiring an electronic device (e.g., dimmer) can cause damage to the electronic device and/or load, since they may not be properly detected and/or driven with the correct timing.

In some approaches, the load voltage circuitry may be utilized to determine if the electronic device (e.g., dimmer) is loaded (or not loaded) without activating the load supply (e.g., without turning the load or lack thereof on). This determination may be utilized to avoid activating (e.g., turning on) an unloaded electronic device (e.g., to leave the unloaded dimmer in the off state). This may protect the electronic device (e.g., dimmer) from shorting and/or may protect the installer from electrocution. In some approaches, a fault indication may be provided. For example, a fault status may be sent to a control system.

Some configurations of the systems and methods disclosed herein may utilize load voltage measuring circuitry to determine if an electronic device (e.g., dimmer) is loaded without activating the load supply (e.g., without turning on load voltage, without turning on power to the load, while the load voltage is deactivated, etc.). For example, electronic device may utilize the load measuring circuitry to obtain a load voltage measurement (e.g., voltage waveform). When the electronic device is powered up, a processor (e.g., CPU) may check the load voltage measurement from the load voltage measuring circuitry. In some configurations, if the load voltage measurement is not an alternating current (AC) waveform, or if the load voltage measurement is within a threshold from zero (e.g., 10% of line voltage), then the electronic device (e.g., dimmer) may be loaded.

When unloaded, the load voltage measurement (e.g., waveform) may be unique. For example, the load voltage measurement may exhibit a significant portion (e.g., a threshold amount, 93%, etc.) of the voltage peak (of line voltage, for example) on the positive side and another amount (e.g., a threshold amount, all or nearly all, 100%, etc.) of the voltage peak on the negative side at 240 volts (V). At 120 V, the load voltage measurement may exhibit a significant portion (e.g., a threshold amount, 91%, etc.) of the voltage peak (of line voltage, for example) on the positive side and another amount (e.g., a threshold amount, 18%, etc.) of the voltage peak on the negative side. It should be noted that the percentages may vary based on line voltage and frequency (e.g., 120 V versus 230 V, 50 hertz (Hz) versus 60 Hz, etc.), circuitry configuration, and/or load configuration. While some examples of voltages are given, the systems and methods disclosed herein should not be limited to these specific voltages, as the systems and methods contemplate other voltages and/or voltage ranges.

Additionally or alternatively, the load voltage measurement (e.g., waveform) may be shifted in time when the electronic device is not coupled to a load. For example, the trailing edge on the negative side may shift in time by an amount (e.g., a threshold amount, 960 microseconds ($\mu$s) to 1 millisecond (ms), etc.) in a working frequency range at 60% of the peak voltage. Additionally or alternatively, the leading edge on the positive side may shift by an amount (e.g., a threshold amount, by 260 $\mu$s, etc.) at 31% of the peak voltage. In some approaches, the processor may determine whether an electronic device is coupled to a load based on one or more aspects of the load voltage measurement. In one approach, the processor (e.g., CPU) may calculate an RMS voltage of a line voltage measurement. The processor may compare the RMS voltage of the line voltage measurement to the load voltage measurement (and/or an RMS voltage of the load voltage measurement). If the load voltage measurement is within a specified range, the processor may determine that the electronic device (e.g., dimmer) is not coupled to a load (e.g., is unloaded).

As used herein, the term "couple" and other variations thereof (e.g., "coupled," "coupling," etc.) may mean that one element is connected to another element directly or indirectly. For example, if a first element is coupled to a second element, the first element may be connected directly to the second element (without any intervening element, for example) or may be connected to the second element through one or more other elements. Lines in one or more of the Figures (e.g., in the block diagrams) may indicate couplings.

Detecting if an electronic device (e.g., dimmer) is loaded without activating the load supply (e.g., turning it on) may protect the electronic device from damage by eliminating the possibility of connecting the load hot (while the load supply is activated, for example). Additionally or alternatively, this may protect an installer from potential electrocution (if the installer were to interface with the load wire that is not terminated, for example). Accordingly, some configurations of the systems and methods disclosed herein may improve electronic device safety overall for installers.

Various configurations are now described with reference to the figures, where like reference numbers may indicate functionally similar elements. The systems and methods as generally described and illustrated in the figures herein could be arranged and designed in a wide variety of different configurations. Thus, the following more detailed description of several configurations, as represented in the Figures, is not intended to limit scope, as claimed, but is merely representative of the systems and methods. As used herein, the term "plurality" may indicate two or more. For example, a plurality of components may refer to two or more components.

FIG. 1 is a block diagram illustrating one configuration of an electronic device 102 for detecting a load type. The electronic device 102 may include load voltage measuring circuitry 104, a processor 112, switching circuitry 116, and/or zero-cross circuitry 106. The processor 112 may be coupled to the load voltage measuring circuitry 104, to the switching circuitry 116 and/or to the zero-cross circuitry 106.

Examples of electronic devices 102 include electronic circuits, integrated circuits, circuits with discrete components (e.g., resistors, capacitors, transistors, metal-oxide-semiconductor field-effect transistors (MOSFETs), etc.), computers, and/or devices that include one or more processors, memory cells, latches, logic gates, etc. For instance, the electronic device 102 may be a switch and/or dimmer that includes discrete components and a processor 112 (e.g., microprocessor) that may be used to detect a load type and/or load coupling. The processor 112 may include and/or access software in memory and/or firmware. For example, the electronic device 102 may include memory. The memory may be included on-board the processor 112 or may be separate from the processor 112. The memory may store instructions and/or data (e.g., samples, voltage samples, and/or current samples, etc.). Additionally or alternatively, the memory or a separate memory may store firmware. In some configurations, the electronic device 102 may be a MOSFET-based dimmer (e.g., not a TRIAC-based dimmer). For example, the electronic device 102 may not include any TRIACs in some implementations. Additionally or alternatively, the electronic device 102 may be a phase-cut dimmer in some implementations. In some configurations, the electronic device 102 may be housed within a wall box.

The electronic device 102 may be coupled to a source 120 (e.g., an alternating current (AC) voltage source) and/or to a load 122. For example, the electronic device 102 may be coupled to the source 120 on a line 108 coupling (e.g., line 108 terminal) and a neutral 110 coupling (e.g., neutral 110 terminal). For example, an AC voltage may be provided to electronic device 102 through the feed line 108. In some configurations, the source 120 may output an AC voltage (e.g., 240 V, 120 V, etc.). The AC voltage may be provided to the electronic device 102 between the line 108 (e.g., "hot") and neutral 110. The voltage between the line 108 and neutral 110 may be referred to as line voltage.

The electronic device 102 may be coupled to a load 122. For example, the switching circuitry 116 of the electronic device 102 may be coupled to the load 122. The load 122 may also be coupled to the electronic device 102 at neutral 110 (e.g., a neutral line). The switching circuitry 116 may activate or deactivate the load 122. For example, the switching circuitry 116 state may determine whether the load 122 is activated (e.g., whether voltage is supplied to the load 122, whether the load 122 is "turned on," etc.).

Some load types may include inductive, capacitive, and resistive load types. Inductive load types may have a magnetic inductor of some sort. One example of an inductive load is a magnetic transformer for low voltage (e.g., magnetic low voltage (MLV)) lighting. Inductive load types may have a waveform characteristic in which the phase of the current lags (e.g., comes after) the voltage waveform. However, some inductive loads may have very little current lag. For example, some toroidal MLV loads may have power factors that are very close to 1 (where resistive loads may have a power factor of 1). Accordingly, it may be difficult to accurately distinguish some inductive loads from a resistive load using only current lag, for example. This may cause a device to incorrectly detect an inductive load as a resistive load and incorrectly drive the inductive load in reverse phase. Some configurations of the systems and methods disclosed herein may help to ameliorate this issue.

Capacitive load types may have a detectable amount of capacitance. Examples of capacitive loads are dimmable fluorescent lights and electronic low voltage (ELV) lighting. Capacitive load types may have a waveform characteristic in which the phase of the current leads (e.g., comes before) the voltage waveform. However, some capacitive loads may exhibit a different waveform characteristic due to a power supply. For example, some capacitive loads may have a waveform characteristic in which the phase of the current lags a voltage waveform (e.g., line voltage waveform) due to an activation delay resulting from a power supply. This may cause difficulty in correctly detecting load type. Some configurations of the systems and methods disclosed herein may help to ameliorate this issue.

Resistive load types may exhibit current and voltage waveforms in phase with each other. For example, there may be no significant (e.g., discernible) lead or lag between current and voltage in resistive load types. Examples of resistive loads include incandescent and halogen lights.

In some configurations, the electronic device 102 may be a dimmer and/or may include a dimmer. For example, the electronic device 102 may be an adaptive dimmer that detects a load type. The load type may be detected in order to determine whether to drive the load 122 in forward phase or reverse phase. For example, inductive loads may be driven in forward phase. Capacitive loads may be driven in reverse phase. Driving capacitive loads in reverse phase may provide one or more benefits, such as extending device life and/or providing improved dimming performance. Resistive loads may be driven in either forward phase or reverse phase. Driving resistive loads in reverse phase may provide one or more benefits, such as reducing inrush current and/or reducing ringing. In some configurations, the electronic device 102 may additionally detect whether a load is coupled to the electronic device 102 (before detecting a load type, for example).

The zero-cross circuitry 106 may detect a line voltage zero cross (e.g., one or more zero cross times for the line voltage). For example, the zero-cross circuitry 106 may determine the time (e.g., position) where the line voltage crosses a zero point. In other words, the zero-cross circuitry 106 may determine the time when the value of the line voltage is zero. The time when the value of the line voltage is zero may be the line voltage zero cross. In some approaches, the zero-cross circuitry 106 may detect at time at which the line voltage switches from negative to positive or positive to negative. For example, the line voltage zero cross may be determined (e.g., estimated) as a time between positive and negative voltage samples (e.g., between a last positive voltage sample and a first negative voltage sample in a cycle or between a last negative voltage sample and a first positive voltage sample). One or more line voltage zero crossings (e.g., line voltage zero cross timings, time stamps, etc.) may be stored in memory in some implementations.

In some configurations, the one or more line voltage zero crossings may be indicated to the processor 112. For example, the zero-cross circuitry 106 may send a signal (e.g., a step signal, a bit, a code, etc.) to the processor 112 that indicates the timing for the one or more line voltage zero crossings. The processor 112 may utilize the line voltage zero cross(ings) to control the switching circuitry 116. For example, the processor 112 may control the state of the switching circuitry 116 (e.g., one or more states of one or more switches, MOSFETs, etc.) in order to coordinate the switch activation and/or deactivation with line voltage zero cross(ings).

The switching circuitry 116 may be configured to perform switching based on the line voltage zero cross to supply a load voltage (e.g., a load driving voltage when activated). For example, the switching circuitry 116 may perform switching based on a timing of the line voltage zero cross. For instance, the switching circuitry 116 may switch at (approximately) one or more line voltage zero crossings. In some approaches, the switching circuitry 116 may receive a control signal from the processor 112 indicating one or more times to perform switching based on the line voltage zero cross(ings).

In some configurations, for example, the switching circuitry 116 may include two switches (e.g., MOSFETs, MOSFETs with coupled drains, etc.). A first switch may be activated and a second switch may be deactivated at a rising-edge zero cross of the line voltage. The first switch may be deactivated and the second switch may be activated at a falling-edge zero cross of the line voltage. This switching pattern may be performed one or more times for one or more cycles of the line voltage.

A load voltage may be a voltage between electronic device 102 lines for a load (e.g., between load couplings, between load terminals, between the switching circuitry 116 and neutral 110, etc.). It should be noted that load voltage may be measurable whether a load 122 is actually coupled to the electronic device 102 or not. Additionally or alternatively, load voltage may be measurable whether a load 122 is activated or not. For example, a load voltage may exist whether or not a load 122 is coupled (e.g., attached) to the electronic device and/or whether or not the switching circuitry 116 is driving a load 122 (e.g., has activated a load 122). The load voltage may differ based on whether a load 122 is coupled to the electronic device 102 and/or based on whether a load 122 is activated.

The load voltage measuring circuitry 104 is configured to measure the load voltage to produce a load voltage measurement (e.g., a voltage waveform). For example, the load voltage measuring circuitry 104 may continuously capture the load voltage measurement (e.g., voltage waveform) by sampling the load voltage for one or more cycles of AC voltage (across the load 122, for instance). The measured load voltage and/or load voltage measurement may be provided to the processor 112. The load voltage measuring circuitry 104 may include discrete components (e.g., one or more resistors, capacitors, transistors, amplifiers, chip packages, etc.). In some configurations, the load voltage measuring circuitry 104 may only include discrete components.

In some configurations, the load voltage measuring circuitry 104 may capture a continuous time (e.g., analog) voltage waveform. The continuous time voltage waveform may represent how the load voltage varies over each cycle. In some configurations, the electronic device 102 may include and/or utilize an analog-to-digital converter (ADC) for capturing a discrete time (e.g., digital) voltage waveform of the load voltage by sampling the continuous time voltage waveform. For example, the ADC may sample at sufficient intervals to capture how the load voltage varies over one or more cycles. An example of a voltage waveform is described in more detail below in relation to FIG. 18. The digital voltage waveform may be one example of the load voltage measurement.

It should be noted that a load voltage measurement may be distinct from a line voltage measurement. For example, a load voltage measurement may indicate a load voltage across a load 122, while a line voltage measurement may indicate a line voltage across a source 120. In some configurations, the load voltage may be on a different side of the switching circuitry 116 than the line voltage. For example, the line voltage may be taken from the line 108 feed of the electronic device 102 (e.g., on the "front" side of the switching circuitry 116), while the load voltage may be taken from across the load 122 (e.g., on the "back" side of the switching circuitry 116). In some implementations of the systems and methods disclosed herein, no line voltage measurement (e.g., line voltage waveform) may be taken.

In some configurations, the electronic device 102 (e.g., load voltage measuring circuitry 104 and/or the processor 112) may determine one or more load voltage zero crossings. For example, the load voltage measuring circuitry 104 and/or the processor 112 may determine one or more times when the load voltage (e.g., load voltage measurement) crosses zero voltage. In some approaches, the load voltage measuring circuitry 104 and/or the processor 112 may determine the time when the load voltage is zero following a time when the load voltage is non-zero for a measurable duration. Additionally or alternatively, the load voltage measuring circuitry 104 and/or the processor 112 may determine a time when the load voltage crosses from a positive value to a negative value or crosses from a negative value to a positive value. Examples of voltage zero crossings are given in relation to FIG. 20.

In some implementations, the load voltage measuring circuitry 104 may determine and/or indicate one or more load voltage zero crossings to the processor 112. For example, the load voltage measuring circuitry 104 may send a signal (e.g., a step signal, a bit, a code, etc.) to the processor 112 that indicates the timing for the one or more load voltage zero crossings. Additionally or alternatively, the processor 112 may utilize the load voltage measurement (e.g., voltage waveform) to determine one or more load voltage zero crossings. One or more load voltage samples and/or load voltage zero crossings (e.g., load voltage zero cross timings, time stamps, etc.) may be stored in memory in some implementations.

The processor 112 may direct the operation of the electronic device 102. In some configurations, the processor 112 may include a processor and instructions in memory (e.g., software, firmware, or both) for controlling the electronic device 102. In some configurations, the processor 112 may include a load type detector 114 for performing load type detection. In some configurations, the load type detector 114 may perform one or more load type detections. For example, each time the electronic device 102 power cycles (e.g., each time power is initially provided and/or restored to the electronic device 102), the load type detector 114 may detect the load type. In some approaches, load type detection and/or determination may be performed while the electronic device 102 is in an initial set-up mode (e.g., during "boot-up," during a detection mode, etc.). In some configurations, the load type detector 114 may perform load type detection multiple times to determine the load type. For example, the load type detector 114 may perform load type detection a number of times (e.g., three) and may determine a load type if all of the detections indicated the same load type. In another example, the load type detector 114 may perform load type detection a number of times (e.g., three, five, etc.) and may determine a load type that is indicated the most. For example, if four detections out of five indicate an inductive load type and one detection indicates a resistive load type, the load type detector 114 may determine (e.g., select) an inductive load type as the detected load type.

The load type detector 114 may determine a load type based on the load voltage measurement. One or more approaches may be implemented to determine the load type based on the load voltage measurement. In some approaches, the load type detector 114 may determine the load type by determining whether a load voltage spike is indicated in the load voltage measurement. For example, inductive loads may produce a load voltage spike in some cases. In particular, if switching (e.g., deactivation) is not performed at a current zero cross, inductive loads may produce a load voltage spike, which may be indicated in the load voltage measurement. Because switching (e.g., deactivation) may be initially timed (e.g., approximately synchronized) with the line voltage zero cross, switching (e.g., deactivation) may not initially occur at the current zero cross, thereby producing a spike for inductive loads.

In some approaches, the load type detector 114 may determine whether a load voltage spike is indicated based on a spike threshold. For example, if the load voltage measurement exceeds the spike threshold, then the load type detector 114 may determine that the load voltage spike is indicated. In some configurations, the spike threshold may be predetermined and/or static. For example, the spike threshold may be set at a particular voltage. For instance, the spike threshold may be 50 V. It should be noted that the spike threshold value may be selected, set, and/or dependent on line voltage (e.g., 120 V, 230 V, etc.) in some configurations. Accordingly, different spike thresholds may be utilized for different configurations of the systems and methods disclosed herein. In some approaches, the spike threshold may be applied to a particular time segment of the load voltage measurement. For example, a time segment of the load voltage measurement corresponding to a period after a switch deactivation may be compared to the spike threshold. In some configurations, the time segment of the load voltage measurement may be based on the line voltage zero cross. For example, the time segment may be a range before and/or after the line voltage zero cross. For instance, the time segment may be on the order of a number of microseconds or milliseconds before and/or after the line voltage zero cross. It should be noted that the time segment range may vary depending on frequency. In a case that the spike threshold is exceeded, the load type detector 114 may determine that a voltage spike is indicated and/or that the load 122 is an inductive load. For example, if the spike threshold is exceeded, the processor 112 may control the switching circuitry 116 to drive the load 122 in forward phase. If the spike threshold is not exceeded (e.g., the load voltage threshold is less than or equal to the spike threshold), the load type detector 114 may determine that voltage spike is not indicated and/or that the load 122 is a resistive load or capacitive load. For example, if the spike threshold is not exceeded, the load type detector 114 may control the switching circuitry 116 to drive the load 122 in reverse phase.

It should be noted that one or more spike thresholds may be utilized. For example, a positive spike threshold and a negative spike threshold may be utilized. For instance, the load type detector 114 may determine whether the load voltage measurement exceeds (e.g., is greater than) the positive spike threshold or whether the load voltage measurement exceeds (e.g., is less than or is greater in magnitude than) the negative spike threshold. A voltage spike may be indicated if the positive spike threshold or the negative spike threshold is exceeded. One or more voltage spike thresholds may be stored in memory in some implementations.

In some configurations, the spike threshold may be based on a line voltage. For example, the spike threshold may be relative to the line voltage. In some approaches, a spike threshold may be the line voltage. In other approaches, a spike threshold may be an amount below line voltage or above line voltage. In some configurations, the electronic device 102 may include line voltage measuring circuitry. The processor 112 (e.g., load type detector 114) may calculate the spike threshold based on a line voltage measurement produced by the line voltage measuring circuitry. For instance, the spike threshold(s) may be an amount (in voltage) above the line voltage measurement (and/or an amount below the line voltage measurement). Accordingly, the spike threshold(s) may be calculated relative to the line voltage measurement and may be compared to the load voltage measurement. Examples of approaches for load detection involving line voltage are given in relation to one or more of FIGS. 8-9. One or more line voltage samples and/or line voltage zero crossings may be stored in memory in some implementations.

In some configurations, the electronic device 102 (e.g., processor 112, load type detector 114, etc.) may determine a load type based on a current measurement and the load voltage measurement. For example, the electronic device 102 may include current measuring circuitry that measures a current (e.g., line current). For instance, the current measuring circuitry may capture one or more samples of a current waveform. One or more current samples and/or current zero crossings may be stored in memory in some implementations. Examples of current samples are given in relation to FIG. 19. Examples of current zero crossings are given in relation to FIG. 21. The load type detector 114 may compare a zero cross of the current measurement to a load voltage zero cross (of the load voltage measurement, for example). In some configurations, the electronic device 102 (e.g., current measuring circuitry, current scaling circuitry, processor 112, etc.) may scale the current measurement and/or current samples.

For example, the load type detector 114 may determine the load type based on the load voltage zero cross and a current zero cross. For instance, the load type detector 114 may determine a zero-cross difference (e.g., $\Delta_{ZX}=I_{ZX}-V_{ZX}$) between the load voltage measurement and the current measurement to determine the load type. If the load type detector 114 determines that the current zero cross occurs before (e.g., leads) the load voltage zero cross (e.g., $\Delta_{ZX}<0$), then the load type detector 114 may determine that the load 122 is a capacitive load type. In this case, the time associated with the current zero cross is before the time associated with the load voltage zero cross. In other words, if the current zero cross leads the load voltage zero cross, then the load 122 may be determined to have capacitive impedance. In this case, the processor 112 may control the switching circuitry 116 to drive the load 122 in reverse phase.

It should be noted that the term "difference" and variations thereof as used herein (e.g., a zero-cross difference, a slope difference, etc.) may include one or more types of conceptual difference and/or difference measures. For example, a "difference" may mean a mathematical subtraction, a ratio, a comparison (e.g., whether one quantity is greater than, equal to, or less than another quantity), an order (e.g., ranking), and/or a sequence (e.g., whether an event happens before, during, or after another event), etc.

If the load type detector 114 determines that the load voltage zero cross occurs before the current zero cross (e.g., $\Delta_{ZX}>0$), then the load type detector 114 may determine that the load 122 is an inductive load type. In this case, the time associated with the load voltage zero cross occurs before the time associated with the current zero cross. In other words, if the load voltage zero cross leads the current zero cross (e.g., the current zero cross lags the load voltage zero cross), then the load 122 may be determined to have inductive impedance. In this case, the processor 112 may control the switching circuitry 116 to drive the load 122 in forward phase.

If the load type detector 114 determines that the load voltage zero cross is equal to (or within a range of) the current zero cross (e.g., $\Delta_{ZX}\sim0$), then the load type detector 114 may determine that the load type is resistive. It should be noted that if the value of the load voltage zero cross is within a specified range of the value of the current zero cross, the load type detector 114 may treat the load voltage zero cross (time) and current zero cross (time) as equal. For example, if the load voltage zero cross is within one or more threshold or tolerance amounts of time or time samples of the current zero cross (leading and/or lagging), the load voltage zero cross and the current zero cross may be deemed equal in some configurations of the systems and methods disclosed herein. If the load voltage zero cross is equal to the current zero cross, then the load 122 may be determined to be a resistive load type. In this case, the processor 112 may control the switching circuitry 116 to drive the load 122 in reverse phase.

In some approaches, the load type detector 114 may simply determine whether the load voltage zero cross occurs before the current zero cross (e.g., $\Delta_{ZX}>0$) to indicate an inductive load type. If the load voltage zero cross occurs before the current zero cross, the processor 112 may control the switching circuitry 116 to drive the load 122 in forward phase (for an inductive load). Otherwise, the processor 112 may control the switching circuitry 116 to drive the load 122 in reverse phase (for a resistive or capacitive load).

In some configurations, the load type detector 114 may determine a slope (e.g., rise/run, crest factor, etc.) of one or more measurements. For example, the load type detector 114 may determine a slope (e.g., rise/run, crest factor, etc.) of the load voltage measurement and/or a slope (e.g., rise/run, crest factor, etc.) of the current measurement. For instance, the load type detector 114 may determine a slope difference (e.g., crest factor difference) between the load voltage measurement slope and the current measurement slope. The slope difference may indicate the load type. Additionally or alternatively, the load voltage measurement with the current measurement may be utilized to determine the crest factor. Different load types may have different crest factors. Accordingly, the load type detector 114 may detect a load type based on the crest factor.

In some configurations, the load type detector 114 may determine a load type based on a combination of factors. For example, the load type detector 114 may determine the load type based on whether a voltage spike is indicated by the load voltage measurement (e.g., voltage spike factor), based on a zero-cross difference between the load voltage measurement and the current measurement (e.g., zero-cross factor), and/or based on a slope difference between the load voltage measurement and the current measurement (e.g., slope factor). Each of the factors may be determined as described above. In some approaches, the load type may be determined based on a majority of factors. For example, if at least two of the three factors (e.g., two of the voltage spike factor, zero-cross factor, and slope factor) indicate the same load type, the load type detector 114 may determine that load type for the load 122. In some approaches, the load type may be determined based on unanimous factors. For example, two or three factors may be utilized, and the load type detector 114 may determine the load type only if all of the factors agree regarding the load type. If one or more factors disagree, the load type detection routine may be repeated until all of the factors are unanimous.

In some approaches, detection techniques may not be combined concurrently. For example, detection techniques (e.g., detection routines) may be utilized in a sequence. If the first detection is (or multiple detections are, for example) ambiguous, the next detection routine may be performed until a detection is successful.

In some approaches, in addition to one or more of the configurations and/or approaches described above, the load type detection routine may be performed (e.g., repeated) a number of times. Each load type detection may indicate a detected load type (e.g., inductive or not inductive; inductive, capacitive, or resistive; etc.). The load type detections may be utilized to make a (final) determination on the load type. In some approaches, a threshold number of agreeing load type detections may need be satisfied in order to make the load type determination. For example, at least three load type detections may be required to agree for the final load type determination. For instance, as soon as a number of (e.g., three) load type detections agree, the final load type determination may be the load type of the agreeing load type detections. In another example, the threshold may require a minimum proportion of load type detections (e.g., a minimum percentage of a minimum number of detections, at least 75% of at least four detection routines, etc.). The load type detection routine may be repeated until the one or more criteria are satisfied and/or until a failure threshold is reached. If the failure threshold is reached, a fault indication may be provided (e.g., a fault light may be activated, a fault message may be displayed, a fault message may be communicated to a control system, etc.) For example, if the one or more criteria are not satisfied with 10 load type detection routines, the fault indication may be provided.

The processor 112 may be configured to control the switching circuitry 116 to drive the load 122 based on the load type. For example, the processor 112 may control the switching circuitry 116 to drive the load 122 in forward phase if the load type is inductive or may control the switching circuitry 116 to drive the load 122 in reverse phase if the load type is capacitive or resistive.

In some configurations, the electronic device 102 (e.g., processor 112) may additionally or alternatively adjust how the load 122 is driven based on the load type. For example, the electronic device 102 may adjust its own impedance to improve the efficiency (e.g., power factor) for the circuit. Thus, the electronic device 102 may determine the load type to enhance the efficiency of the circuit. In some approaches, the processor 112 may adjust the driving voltage waveform and/or current waveform to enhance efficiency (e.g., increase the power factor by adjusting the phase margin). For example, the processor 112 may adjust the duty cycle and/or the amount of power delivered to the load 122 to enhance efficiency (e.g., limiting the watts provided to correspond with the watts consumed).

The electronic device 102 (e.g., processor 112 and/or switching circuitry 116) may control the amount of power delivered to the load 122. In some configurations (e.g., switch, dimmer, etc.), the switching circuitry 116 may turn on (e.g., activate) the power or turn off (e.g., deactivate) the power to the load 122. Additionally or alternatively, the electronic device 102 (e.g., processor 112 and/or switching circuitry 116) may adjust the amount of power that is delivered to the load 122 (e.g., enable, disable, adjust duty cycle, cut phase, increase phase, etc.). Examples of the switching circuitry 116 may include one or more switches (e.g., mechanical relay, solid state relay, MOSFETs, transistors, etc.). The switching circuitry 116 may include discrete components. In some configurations, the switching circuitry 116 may only include discrete components.

In some configurations, the electronic device 102 may be housed in a wall box. For example, the electronic device 102 may be configured to be contained within a wall box as an electrical device. A wall box (e.g., electrical box, outlet box, switch box, pattress, etc.) is the container for the body of an electrical device (e.g., light switch, power outlet, dimmer, etc.). While housed in the wall box, the face of the electrical device may be approximately flush with a wall. In general, the width of a wall box may be measured in "gangs," which indicates the number of electrical devices (e.g., light switches, power outlets, dimmers, etc.) that the wall box can hold. For example, a single-gang wall box may hold a single electrical device and a double-gang wall box may hold two electrical devices (side by side, for example). The depth of a wall box may be standard depth, shallow depth, or deep depth. In some configurations of the systems and methods disclosed herein, a wall box may be a single-gang standard depth wall box and a wall box device may be an electronic device 102 that may be held in a single-gang standard depth wall box. In one configuration, a European style wall box having a width of 86 millimeters, a height of 86 millimeters and a depth of 35 millimeters may be used. In another configuration, a United States style, single-gang, standard depth wall box may be used. It should be noted that other configurations of the systems and methods disclosed herein may not be housed in a wall box. For example, some configurations of the systems and methods disclosed herein may be implemented in lighting devices that are not housed in wall boxes. Additionally or alternatively, a spacer may be utilized in some configurations that places a portion of the device (e.g., an electronic device 102) outside of a wall box.

A wall box switch may be one example of an electronic device 102 with two discrete states that may be used to control a load 122. A wall box switch may be in an "off" state or in an "on" state. Thus, a wall box switch may turn on or off electrical power to the load 122. In one configuration, a wall box switch may use a relay (e.g., mechanical, solid state, etc.) to turn on or off electrical power to the load 122. A simple example of a wall box switch is a light switch that turns on or off electrical power to a light. The light switch may turn on the light by turning on electrical power to the light or turn off the light by turning off electrical power to the light.

A wall box dimmer is another example of an electronic device 102 with variable states that may be used to control a load 122. A wall box dimmer may variably adjust the amount of electrical power that is driven to the load 122 (e.g., by adjusting the root mean square (RMS) voltage, adjusting pulse-width modulation, adjusting duty cycle, adjusting a phase cut, etc.). For example, a wall box dimmer may provide 0% electrical power, 100% electrical power or some percentage in between. In one configuration, a wall box dimmer may use one or more semiconductors (e.g., MOSFETs, transistors, etc.) to control the load. A simple example of a wall box dimmer is a light dimmer that may turn on or off and variably control the brightness of a light. For example, the light dimmer may increase the brightness of the light by increasing the amount of electrical power driven to the light. Similarly, the light dimmer may decrease the brightness of the light by decreasing the amount of electrical power driven to the light. In some configurations, the wall box device may include switching and dimming capabilities.

It should be noted that one or more of the elements or components described in relation to FIG. 1 may be combined and/or divided in some configurations. For example, the zero-cross circuitry 106, switching circuitry 116, processor 112, and/or load voltage measuring circuitry 104 may be divided into smaller elements or components that perform a subset of the functions described herein. Additionally or alternatively, one or more of the zero-cross circuitry 106, switching circuitry 116, processor 112, and/or load voltage measuring circuitry 104 may be combined.

Figure 2:
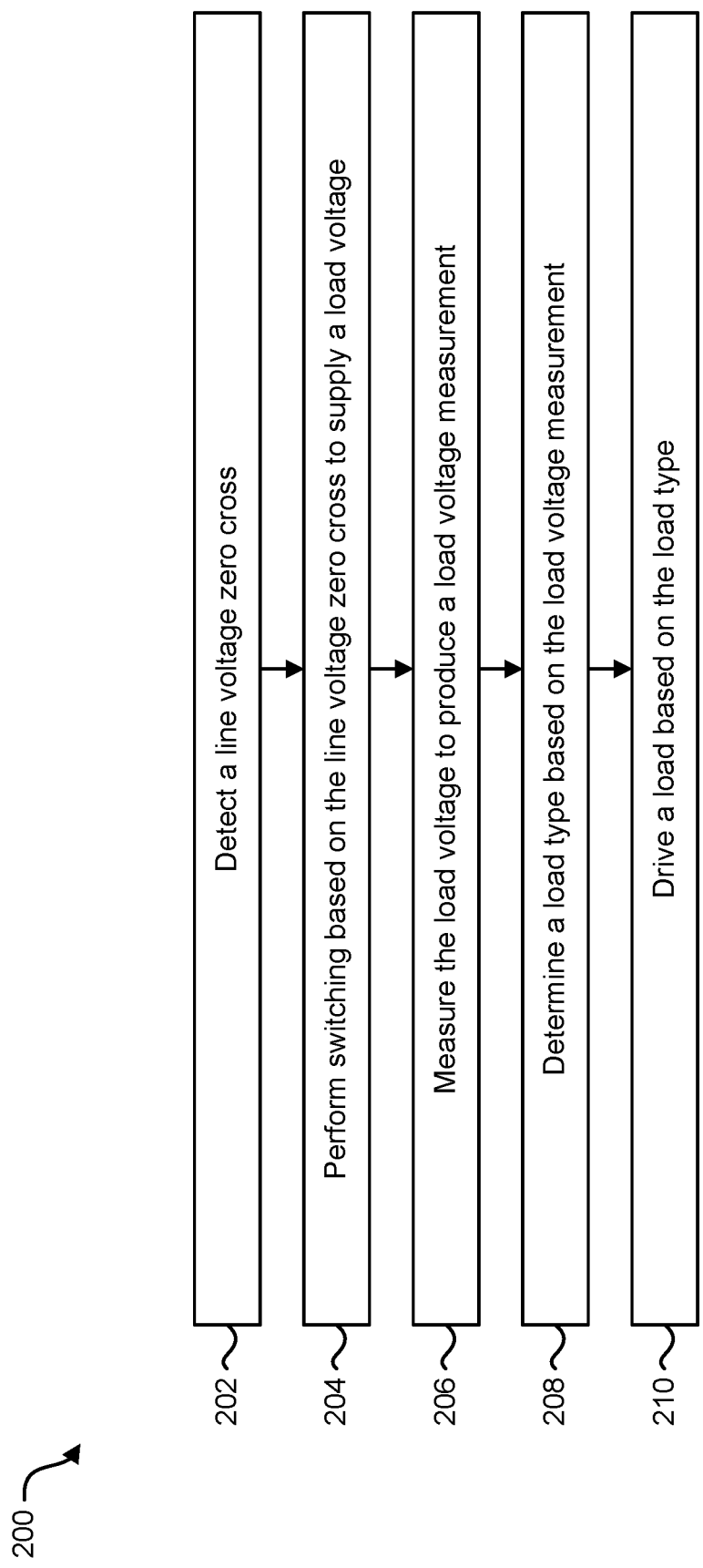
FIG. 2 is a flow diagram illustrating one configuration of a method for detecting a load type.

FIG. 2 is a flow diagram illustrating one configuration of a method 200 for detecting a load type. The method 200 may be performed by the electronic device 102 described in relation to FIG. 1. The electronic device 102 may detect 202 a line voltage zero cross. This may be accomplished as described in relation to FIG. 1. For example, the electronic device 102 (e.g., zero-cross circuitry 106) may detect when voltage polarity changes and/or when zero potential occurs between the line 108 and neutral 110.

The electronic device 102 may perform 204 switching based on the line voltage zero cross to supply a load voltage. This may be accomplished as described in relation to FIG. 1. For example, the processor 112 may control the switching circuitry 116 to supply one or more cycles of load voltage (to the load 122, for example). In some configurations, the processor 112 may time one or more switch activations and/or deactivations to synchronize (e.g., approximately synchronize) switching with one or more line voltage zero crossings.

The electronic device 102 may measure 206 the load voltage to produce a load voltage measurement. This may be accomplished as described in relation to FIG. 1. For example, the electronic device 102 (e.g., load voltage measuring circuitry 104) may measure 206 the load voltage as a load voltage measurement (e.g., a voltage waveform, a series of voltage data samples, etc.). The load voltage measurement may indicate the load voltage (e.g., voltage across a load 122) for one or more cycles (e.g., AC voltage cycles).

The electronic device 102 may determine 208 a load type based on the load voltage measurement. This may be accomplished as described in relation to FIG. 1. For example, the electronic device 102 (e.g., processor 112) may determine whether a load voltage spike is indicated by the load voltage measurement. A load voltage spike may be indicated in a case that the load voltage measurement exceeds a spike threshold (e.g., a predetermined spike threshold or a spike threshold determined based on measuring a line voltage). Additionally or alternatively, the electronic device 102 may compare a load voltage zero cross and a current zero cross. Additionally or alternatively, the electronic device 102 (e.g., processor 112) may compare a load voltage measurement slope (e.g., crest factor) and a current measurement slope (e.g., crest factor). One or more of these factors (e.g., voltage spike factor, zero-cross factor, and/or slope factor) may be utilized to determine the load type. For example, the presence of a load voltage spike may indicate an inductive load type, while the absence thereof may indicate a non-inductive (e.g., capacitive or resistive) load type. A lagging current zero cross may indicate an inductive load type, a leading current zero cross may indicate a capacitive load type, and/or approximately synchronized zero cross (between load voltage and current, for example) may indicate a resistive load type. Particular slope differences may indicate different load types. The load type may be determined based on one or more of these factors and/or based on one or more load type detection routines (e.g., performing load type detection a number of times) as described in relation to FIG. 1.

The electronic device 102 may drive 210 a load based on the load type. This may be accomplished as described in relation to FIG. 1. For example, the electronic device 102 may drive an inductive load in forward phase and may drive a resistive or capacitive load in reverse phase. In some configurations, the electronic device 102 may adjust one or more other aspects of operation based on the load type as described in relation to FIG. 1.

Figure 3:
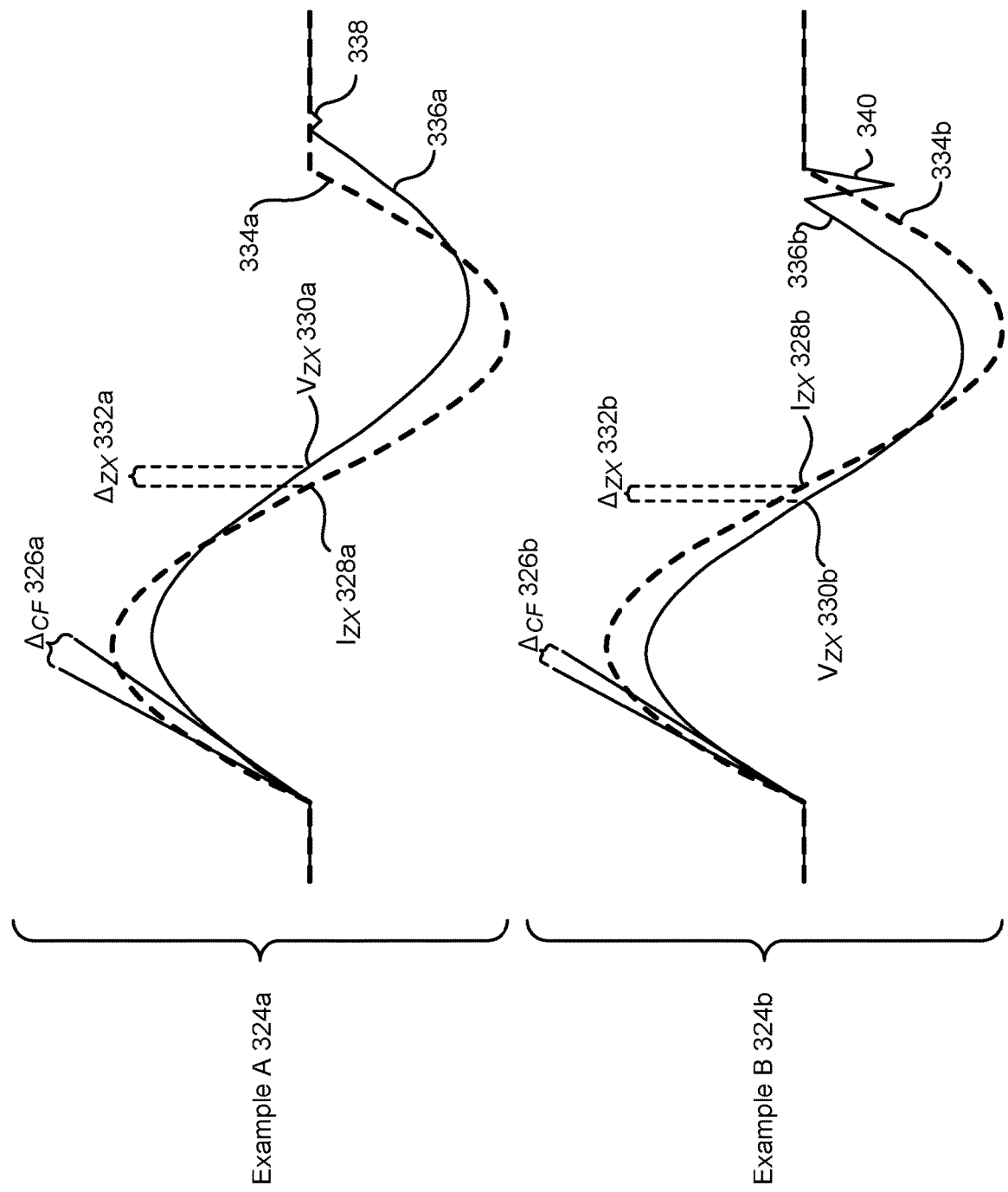
FIG. 3 is a diagram illustrating examples of voltages and currents.

FIG. 3 is a diagram illustrating examples 324a-b of voltages 336a-b and currents 334a-b. In particular, FIG. 3 illustrates examples 324a-b of characteristics of load voltages 336a-b and/or currents 334a-b that may be utilized to determine a load type in accordance with configurations of the systems and methods disclosed herein. For example, the electronic device 102 described in relation to FIG. 1 may utilize one or more of the characteristics to determine the load type. The load voltages 336a-b and/or currents 334a-b may be expressed as load voltage measurements and/or current measurements in accordance with some configurations of the systems and methods disclosed herein.

Example A 324a illustrates a load voltage 336a and a current 334a (e.g., line current) in a case of a capacitive load type. As illustrated, the current 334a leads the load voltage 336a. For example, the current zero cross 328a (e.g., $I_{ZX}$) occurs before the voltage zero cross 330a (e.g., $V_{ZX}$). When performing initial switching (e.g., during load type detection), an electronic device may approximately synchronize switching at voltage zero crossings. For example, the electronic device may activate or deactivate switches at each voltage zero cross. In example A 324a, switching may be performed at the beginning of the cycle, at the falling edge zero cross 330a, and/or at the rising edge zero cross of the load voltage 336a. As illustrated in example A 324a, a voltage spike does not occur 338 upon performing switching at the end of the cycle of the load voltage 336a, which may indicate a capacitive (or resistive) load type.

In example A 324a, a zero-cross difference 332a (e.g., $\Delta_{ZX} = I_{ZX} - V_{ZX}$) may indicate that the current 334a leads the load voltage 336a (e.g., the current zero cross 328a (e.g., $I_{ZX}$) occurs before the voltage zero cross 330a (e.g., $V_{ZX}$)), which may indicate a capacitive load type. Additionally or alternatively, a slope difference 326a (e.g., crest factor difference $\Delta_{CF}$) of a particular size may indicate a capacitive load type.

Example B 324b illustrates a load voltage 336b and a current 334b (e.g., line current) in a case of an inductive load type. As illustrated, the current 334b lags the load voltage 336b. For example, the current zero cross 328b (e.g., $I_{ZX}$) occurs after the voltage zero cross 330b (e.g., $V_{ZX}$). When performing initial switching (e.g., during load type detection), an electronic device may approximately synchronize switching at voltage zero crossings. For example, the electronic device may activate or deactivate switches at each voltage zero cross. In example B 324b, switching may be performed at the beginning of the cycle, at the falling edge zero cross 330b, and/or at the rising edge zero cross of the load voltage 336b. As illustrated in example B 324b, a voltage spike 340 occurs upon performing switching at the end of the cycle of the load voltage 336b, which may indicate an inductive load type.

In example B 324b, a zero-cross difference 332b (e.g., $\Delta_{ZX}=I_{ZX}-V_{ZX}$) may indicate that the current 334b lags the load voltage 336b (e.g., the current zero cross 328b (e.g., $I_{ZX}$) occurs after the voltage zero cross 330b (e.g., $V_{ZX}$)), which may indicate an inductive load type. Additionally or alternatively, a slope difference 326b (e.g., crest factor difference $\Delta_{CF}$) of a particular size may indicate an inductive load type.

Figure 4:
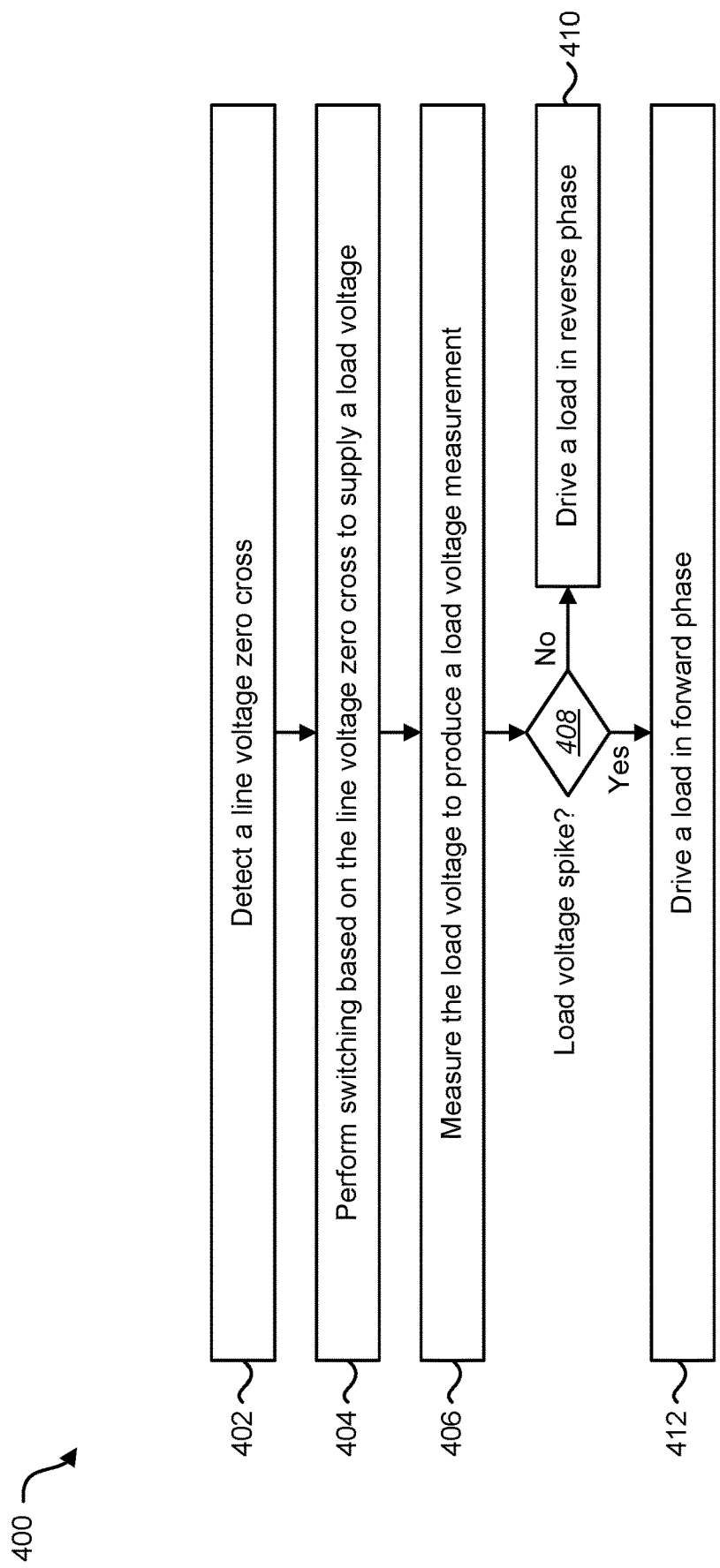
FIG. 4 is a flow diagram illustrating a more specific configuration of a method for detecting a load type.

FIG. 4 is a flow diagram illustrating a more specific configuration of a method 400 for detecting a load type. The method 400 may be performed by the electronic device 102 described in relation to FIG. 1. The electronic device 102 may detect 402 a line voltage zero cross. This may be accomplished as described in relation to one or more of FIGS. 1-2.

The electronic device 102 may perform 404 switching based on the line voltage zero cross to supply a load voltage. This may be accomplished as described in relation to one or more of FIGS. 1-3.

The electronic device 102 may measure 406 the load voltage to produce a load voltage measurement. This may be accomplished as described in relation to one or more of FIGS. 1-3.

The electronic device 102 may determine 408 whether a load voltage spike is indicated by the load voltage measurement. This may be accomplished as described in relation to FIG. 1. For example, the electronic device 102 (e.g., processor 112) may determine whether the load voltage measurement (e.g., a segment of the load voltage measurement) exceeds a predetermined spike threshold and/or a spike threshold based on a line voltage. For instance, if a segment of the load voltage measurement exceeds the spike threshold, the electronic device 102 may determine that a load voltage spike is indicated (e.g., has occurred).

In a case that a load voltage spike is indicated, the electronic device 102 may drive 412 a load in forward phase (for an inductive load, for example). This may be accomplished as described in relation to one or more of FIGS. 1-2. In a case that a load voltage spike is not indicated, the electronic device 102 may drive 410 a load in reverse phase (for a resistive or capacitive load, for example). This may be accomplished as described in relation to one or more of FIGS. 1-2. More detail regarding driving phase (e.g., forward phase and reverse phase) is given in relation to FIG. 5.

Figure 5:
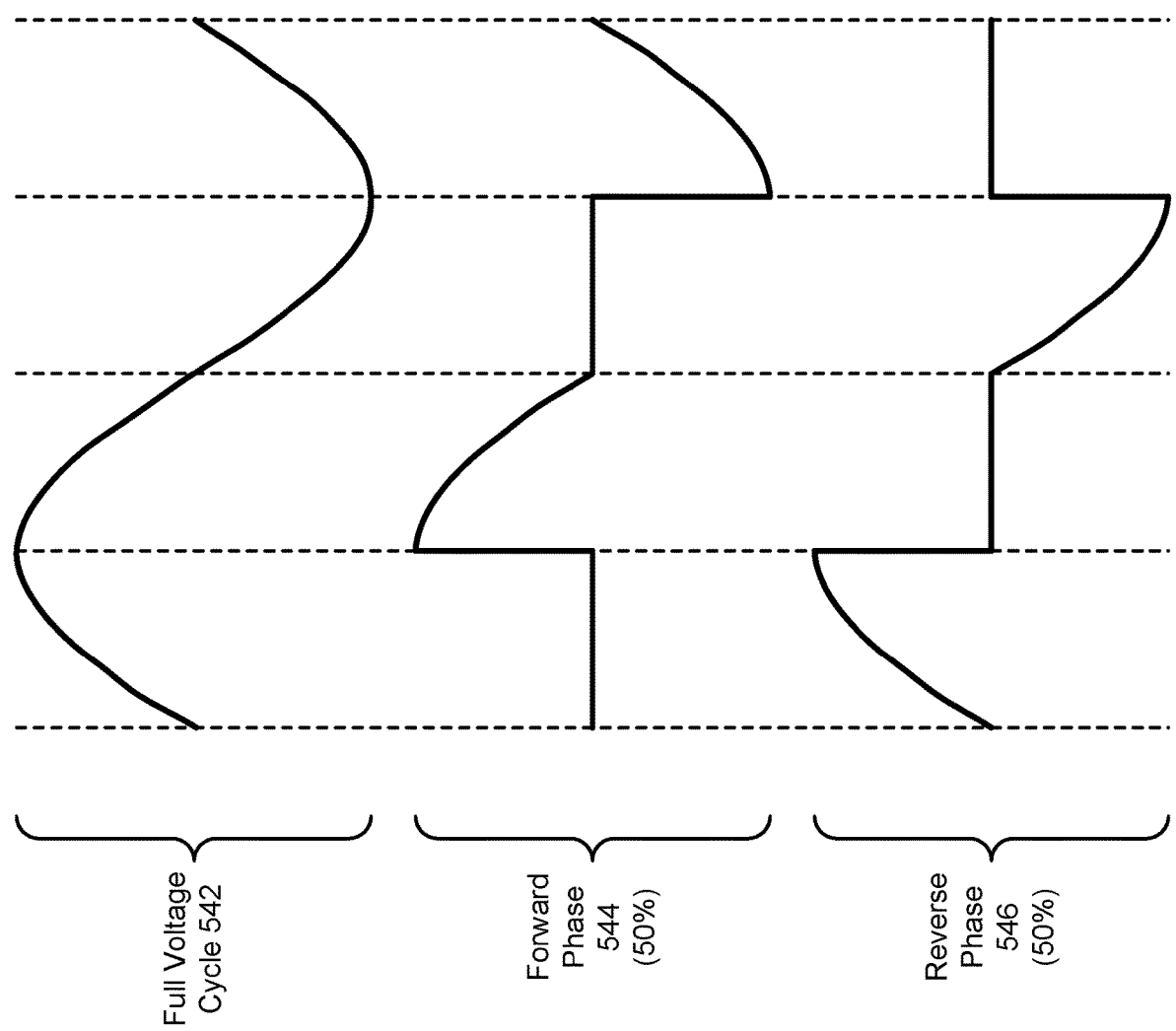
FIG. 5 is a diagram illustrating an example of a forward phase voltage waveform and a reverse phase voltage waveform.

FIG. 5 is a diagram illustrating an example of a forward phase 544 voltage waveform and a reverse phase 546 voltage waveform. In particular, FIG. 5 illustrates an example of a full voltage cycle 542 for an AC voltage. Some devices (e.g., phase-cut dimmers) may cut (e.g., switch off) one or more portions of a voltage cycle in order to drive a load at a particular level (e.g., power, voltage, etc.). For example, a "front" (e.g., initial) part of the upswing or downswing of a voltage cycle may be cut to drive a load in forward phase. A "back" (e.g., latter) part of the upswing or downswing of a voltage cycle may be cut to drive a load in reverse phase. Different amounts (e.g., proportions) of the voltage cycle may be cut in order to drive the load at different levels (e.g., different power levels).

In the forward phase 544 example illustrated in FIG. 5, the full voltage cycle 542 is cut by 50% in order to drive a load at a 50% level. As shown by the forward phase 544 example, half of the front (e.g., initial) part of the upswing is cut (e.g., switched off) and half of the front part of the downswing is cut (e.g., switched off). As described herein, it may be beneficial to drive inductive loads in forward phase.

In the reverse phase 546 example illustrated in FIG. 5, the full voltage cycle 542 is cut by 50% in order to drive a load at a 50% level. As shown by the reverse phase 546 example, half of the back (e.g., latter) part of the upswing is cut (e.g., switched off) and half of the back part of the downswing is cut (e.g., switched off). As described herein, it may be beneficial to drive resistive loads and/or capacitive loads in reverse phase.

Figure 6:
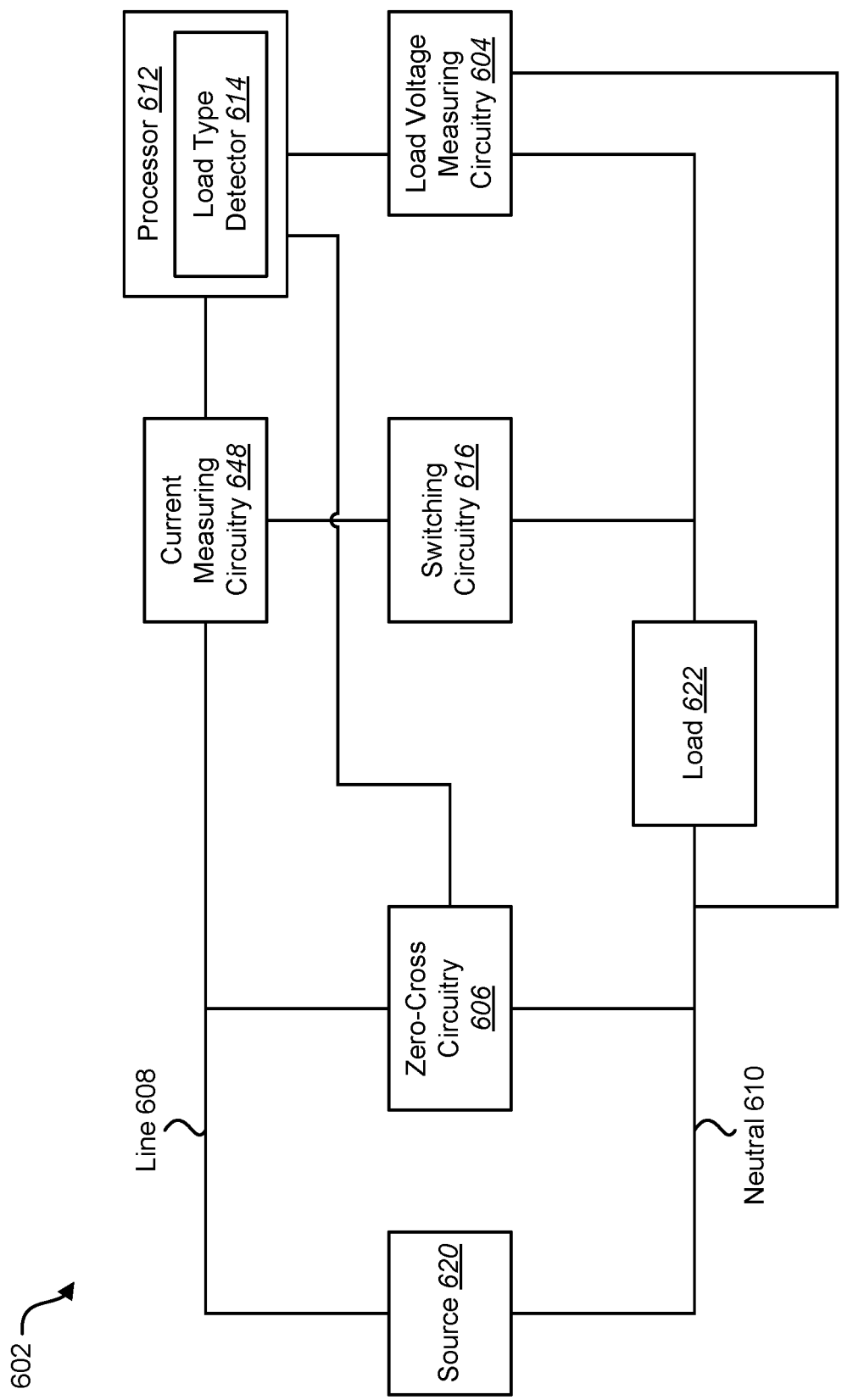
FIG. 6 is a block diagram illustrating a more specific configuration of an electronic device for detecting a load type.

FIG. 6 is a block diagram illustrating a more specific configuration of an electronic device 602 for detecting a load type. The electronic device 602 may include load voltage measuring circuitry 604, a processor 612, switching circuitry 616, zero-cross circuitry 606, and/or current measuring circuitry 648. The processor 612 may be coupled to the load voltage measuring circuitry 604, to the switching circuitry 616, to the zero-cross circuitry 606 and/or to the current measuring circuitry 648. The electronic device 602 described in relation to FIG. 6 may be an example of the electronic device 102 described in relation to FIG. 1. One or more of the elements or components described in relation to FIG. 6 may function similarly and/or may be implemented similarly to one or more corresponding elements or components described in relation to FIG. 1. For example, the source 620, load 622, zero-cross circuitry 606, switching circuitry 616, processor 612, load type detector 614, and/or load voltage measuring circuitry 604 of FIG. 6 may function and/or may be implemented as described in relation to the source 120, load 122, zero-cross circuitry 106, switching circuitry 116, processor 112, load type detector 114, and/or load voltage measuring circuitry 104 of FIG. 1. It should be noted that the source 620 and the load 622 may be separate from the electronic device 602, may be coupled to the electronic device 602, and/or may not be included in the electronic device 602.

The zero-cross circuitry 606 may detect a line voltage zero cross (e.g., one or more zero cross times for the line voltage between the line 608 and neutral 610). The processor 612 may utilize the line voltage zero cross(ings) to control the switching circuitry 616. For example, the processor 612 may control the state of the switching circuitry 616 (e.g., one or more states of one or more switches, MOSFETs, etc.) in order to coordinate the line voltage zero cross(ings) with switch activation and/or deactivation. The switching circuitry 616 may be configured to perform switching based on the line voltage zero cross to supply a load voltage (e.g., a load driving voltage when activated). For example, the switching circuitry 616 may perform switching based on a timing of the line voltage zero cross. The load voltage measuring circuitry 604 is configured to measure the load voltage to produce a load voltage measurement (e.g., a voltage waveform).

The current measuring circuitry 648 may be configured to measure a current (e.g., a line 608 current) to produce a current measurement (e.g., a current waveform). For example, the current measuring circuitry 648 may continuously capture the current measurement (e.g., current waveform) by sampling the current (on the line 608, for instance) for one or more cycles. The current measuring circuitry 648 may include discrete components. In some configurations, the current measuring circuitry 648 may only include discrete components. The current measuring circuitry 648 may be coupled in line with the feed line 608 so that the current flowing from the source 620 may be determined.

In some configurations, the current measuring circuitry 648 may capture a continuous time (e.g., analog) current waveform. For example, the current measuring circuitry 648 may capture a continuous time current waveform of the current flowing from the source 620 into the electronic device 602. The continuous time current waveform may indicate how the current varies over each cycle of the AC signal. An example of current waveform sampling is described in relation to FIG. 19. In some configurations, the electronic device 602 may additionally include an ADC for capturing a discrete time (e.g., digital) current waveform of the current (e.g., line 608 current) by sampling the continuous time current waveform. For example, the ADC may sample at sufficient intervals to capture how the current varies over one or more cycles. In some configurations, the ADC may sample the current to correspond to the sampling of the load voltage. The digital current waveform may be one example of the current measurement.

The processor 612 may include a load type detector 614 for performing load type detection. The load type detector 614 may determine a load type based on the load voltage measurement and the current measurement. For example, the electronic device 602 may utilize the current measurement from the current measuring circuitry 648 for determining the load type.

In some configurations, the electronic device 602 (e.g., current measuring circuitry 648 and/or the processor 612) may determine one or more current zero crossings. For example, the current measuring circuitry 648 and/or the processor 612 may determine one or more times when the current (e.g., line 608 current, current measurement, etc.) crosses zero current. In some approaches, the current measuring circuitry 648 and/or the processor 612 may determine the time when the current is zero following a time when the current is non-zero for a measurable duration. Additionally or alternatively, the current measuring circuitry 648 and/or the processor 612 may determine a time when the current crosses from a positive value to a negative value or crosses from a negative value to a positive value. Examples of current zero crossings are given in relation to FIG. 21.

In some implementations, the current measuring circuitry 648 may determine and/or indicate one or more current zero crossings to the processor 112. For example, the current measuring circuitry 648 may send a signal (e.g., a step signal, a bit, a code, etc.) to the processor 112 that indicates the timing for the one or more current zero crossings. Additionally or alternatively, the processor 612 may utilize the current measurement (e.g., current waveform) to determine one or more current zero crossings.

In some configurations, the processor 112 may utilize one or more current zero crossings to control the switching circuitry 116. For example, the processor 112 may control the state of the switching circuitry 116 (e.g., one or more states of one or more switches, MOSFETs, etc.) in order to coordinate switch activation and/or deactivation with one or more current zero crossings. For example, during a load type detection mode, the switching circuitry 616 may be operated in order to synchronize (e.g., approximately synchronize) switching with line voltage zero crossings. Once the load type is determined, the processor 612 may operate the switching circuitry in order to synchronize (e.g., approximately synchronize) switching with one or more current zero crossings, one or more line voltage zero crossings and/or one or more load voltage zero crossings. For example, if the load type is inductive, the processor 612 may control the switching circuitry to activate the load 622 at load voltage zero cross and to deactivate the load 622 at current zero cross.

In some configurations, the load type detector 614 may compare the current zero cross (of the current measurement, for instance) to the load voltage zero cross (of the load voltage measurement, for instance). For example, the load type detector 614 may determine the load type based on the load voltage zero cross and the current zero cross. For instance, the load type detector 614 may determine a zero-cross difference (e.g., $\Delta_{ZX}=I_{ZX}-V_{ZX}$) between the load voltage measurement and the current measurement to determine the load type. If the load type detector 614 determines that the current zero cross occurs before (e.g., leads) the load voltage zero cross (e.g., $\Delta_{ZX}<0$), then the load type detector 614 may determine that the load 622 is a capacitive load type. In this case, the time associated with the current zero cross is before the time associated with the load voltage zero cross. In other words, if the current zero cross leads the load voltage zero cross, then the load 622 may be determined to have capacitive impedance. In this case, the processor 612 may control the switching circuitry 616 to drive the load 622 in reverse phase.

If the load type detector 614 determines that the load voltage zero cross occurs before the current zero cross (e.g., $\Delta_{ZX}>0$), then the load type detector 614 may determine that the load 622 is an inductive load type. In this case, the time associated with the load voltage zero cross occurs before the time associated with the current zero cross. In other words, if the load voltage zero cross leads the current zero cross (e.g., the current zero cross lags the load voltage zero cross), then the load 622 may be determined to have inductive impedance. In this case, the processor 612 may control the switching circuitry 616 to drive the load 622 in forward phase.

If the load type detector 614 determines that the load voltage zero cross is equal to (or within a range of) the current zero cross (e.g., $\Delta_{ZX}\approx 0$), then the load type detector 614 may determine that the load type is resistive. It should be noted that if the value of the load voltage zero cross is within a specified range of the value of the current zero cross, the load type detector 614 may treat the load voltage zero cross (time) and current zero cross (time) as equal. For example, if the load voltage zero cross is within one or more threshold or tolerance amounts of time or time samples of the current zero cross (leading and/or lagging), the load voltage zero cross and the current zero cross may be deemed equal in some configurations of the systems and methods disclosed herein. If the load voltage zero cross is equal to the current zero cross, then the load 622 may be determined to be a resistive load type. In this case, the processor 612 may control the switching circuitry 616 to drive the load 622 in reverse phase.

In some approaches, the load type detector 614 may simply determine whether the load voltage zero cross occurs before the current zero cross (e.g., $\Delta_{ZX}>0$) to indicate an inductive load type. If the load voltage zero cross occurs before the current zero cross, the processor 612 may control the switching circuitry 616 to drive the load 622 in forward phase (for an inductive load). Otherwise, the processor 612 may control the switching circuitry 616 to drive the load 622 in reverse phase (for a resistive or capacitive load).

In some configurations, the load type detector 614 may determine a slope (e.g., rise/run, crest factor, etc.) of one or more measurements. For example, the load type detector 614 may determine a slope of the load voltage measurement and/or a slope of the current measurement. For instance, the load type detector 614 may determine a slope difference (e.g., rise/run difference, crest factor difference, etc.) between the load voltage measurement slope and the current measurement slope. The slope difference may indicate the load type as described in relation to FIG. 1. Additionally or alternatively, the crest factor itself may indicate a load type.

In some configurations, the load type detector 614 may determine a load type based on a combination of factors. For example, the load type detector 614 may determine the load type based on whether a voltage spike is indicated by the load voltage measurement (e.g., voltage spike factor), based on a zero-cross difference between the load voltage measurement and the current measurement (e.g., zero-cross factor), and/or based on a slope difference between the load voltage measurement and the current measurement (e.g., slope factor). This may be accomplished as described above in relation to one or more of FIGS. 1-2.

The processor 612 may be configured to control the switching circuitry 616 to drive the load 622 based on the load type. For example, the processor 612 may control the switching circuitry 616 to drive the load 622 in forward phase if the load type is inductive or may control the switching circuitry 616 to drive the load 622 in reverse phase if the load type is capacitive or resistive.

It should be noted that one or more of the elements or components described in relation to FIG. 6 may be combined and/or divided in some configurations. For example, the zero-cross circuitry 606, switching circuitry 616, processor 612, load voltage measuring circuitry 604, and/or current measuring circuitry 648 may be divided into smaller elements or components that perform a subset of the functions described herein. Additionally or alternatively, one or more of the zero-cross circuitry 606, switching circuitry 616, processor 612, load voltage measuring circuitry 604, and/or current measuring circuitry 648 may be combined.

Figure 7:
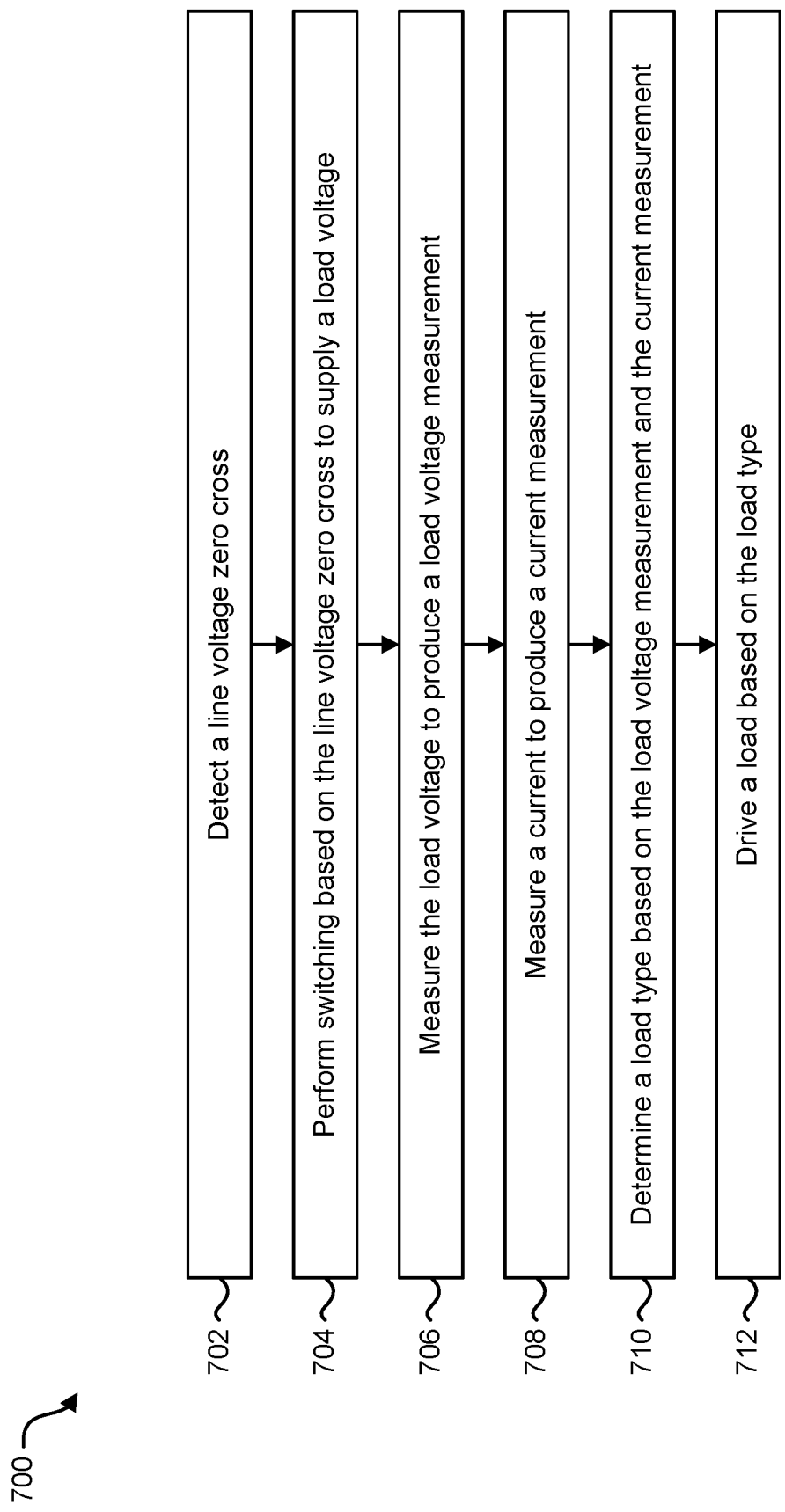
FIG. 7 is a flow diagram illustrating another more specific configuration of a method for detecting a load type.

FIG. 7 is a flow diagram illustrating another more specific configuration of a method 700 for detecting a load type. The method 700 may be performed by one or more of the electronic devices 102, 602 described in relation to one or more of FIGS. 1 and 6. The electronic device 602 may detect 702 a line voltage zero cross. This may be accomplished as described in relation to one or more of FIGS. 1-2, 4, and 6.

The electronic device 602 may perform 704 switching based on the line voltage zero cross to supply a load voltage. This may be accomplished as described in relation to one or more of FIGS. 1-2, 4, and 6.

The electronic device 602 may measure 706 the load voltage to produce a load voltage measurement. This may be accomplished as described in relation to one or more of FIGS. 1-2, 4, and 6. In some configurations, the electronic device 102 may determine one or more load voltage zero crossings and/or one or more load voltage measurement slopes (e.g., crest factors) based on the load voltage measurement.

The electronic device 602 may measure 708 a current (e.g., line current) to produce a current measurement. This may be accomplished as described in relation to one or more of FIGS. 1-2 and 6. For example, the electronic device 602 may utilize current measuring circuitry (e.g., current measuring circuitry 648) to measure the current for one or more cycles. One example of the current measurement is a discrete-time current waveform. In some configurations, the electronic device 602 may measure 706 the load voltage and measure 708 the current concurrently (e.g., in overlapping time periods, in the same time period, etc.). In some configurations, the electronic device 102 may determine one or more current zero crossings and/or one or more current measurement slopes (e.g., crest factors) based on the current measurement.

The electronic device 602 may determine 710 a load type based on the load voltage measurement and the current measurement. This may be accomplished as described in relation to one or more of FIGS. 1-2 and 6. For example, the electronic device 602 may compare a load voltage zero cross and a current zero cross. Additionally or alternatively, the electronic device 602 (e.g., processor 612) may compare a load voltage measurement slope (e.g., crest factor) and a current measurement slope (e.g., crest factor). In some configurations, the electronic device 602 may also determine whether a load voltage spike is indicated by the load voltage measurement. One or more of these factors (e.g., voltage spike factor, zero-cross factor, and/or slope factor) may be utilized to determine the load type. For example, the presence of a load voltage spike may indicate an inductive load type, while the absence thereof may indicate a non-inductive (e.g., capacitive or resistive) load type. A lagging current zero cross may indicate an inductive load type, a leading current zero cross may indicate a capacitive load type, and/or approximately synchronized zero cross (between load voltage and current, for example) may indicate a resistive load type. Particular slope differences may indicate different load types. The load type may be determined based on one or more of these factors and/or based on one or more load type detection routines (e.g., performing load type detection a number of times) as described in relation to one or more of FIGS. 1-2 and 6.

The electronic device 602 may drive 712 a load based on the load type. This may be accomplished as described in relation to one or more of FIGS. 1-2 and 6.

Figure 8:
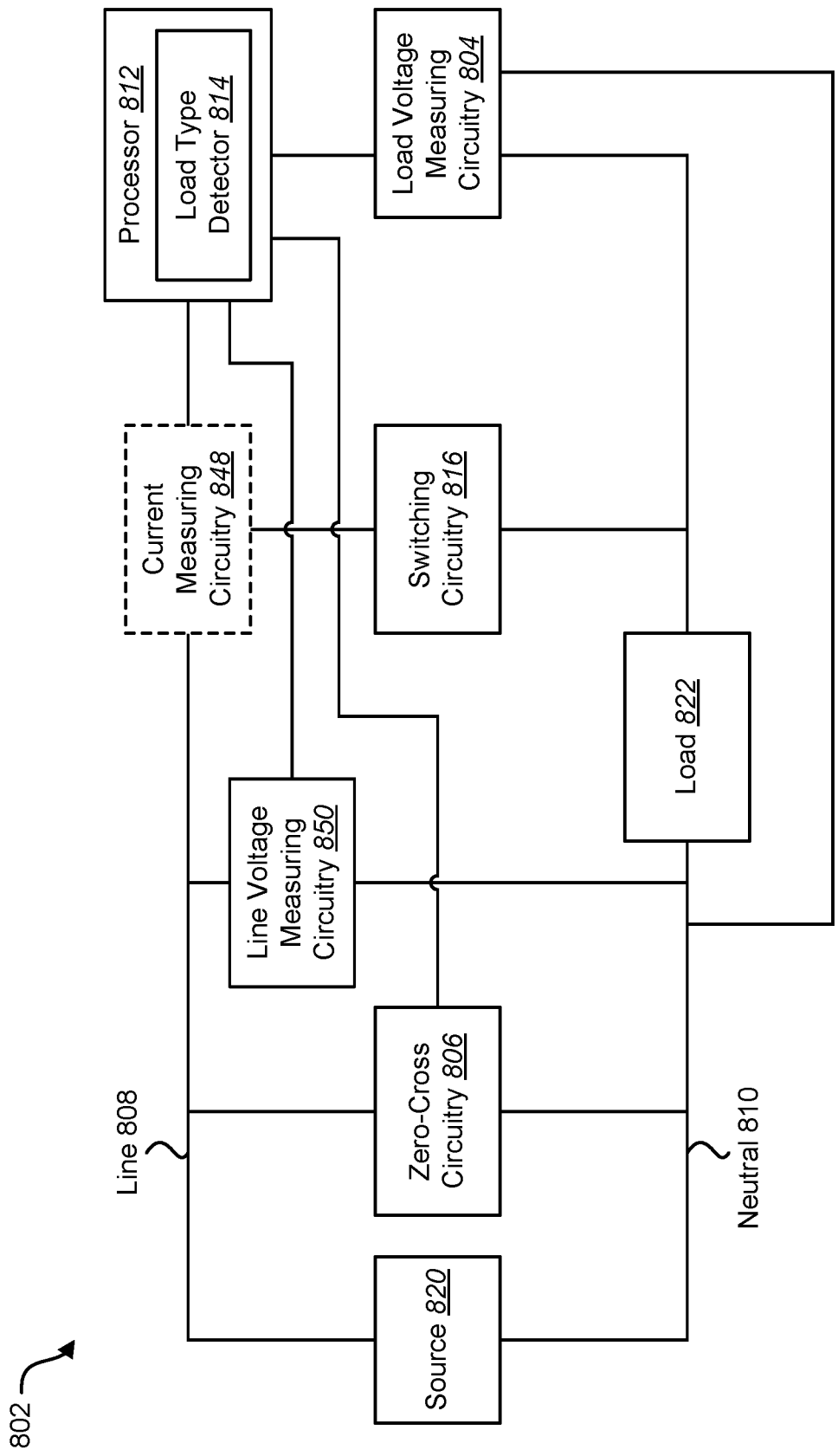
FIG. 8 is a block diagram illustrating a more specific configuration of an electronic device for detecting a load type.

FIG. 8 is a block diagram illustrating a more specific configuration of an electronic device 802 for detecting a load type. The electronic device 802 may include load voltage measuring circuitry 804, a processor 812, switching circuitry 816, zero-cross circuitry 806, current measuring circuitry 848 (optionally), and/or line voltage measuring circuitry 850. The processor 812 may be coupled to the load voltage measuring circuitry 804, to the switching circuitry 816, to the zero-cross circuitry 806, the current measuring circuitry 848, and/or to the line voltage measuring circuitry 850. The electronic device 802 described in relation to FIG. 8 may be an example of one or more of the electronic devices 102 described in relation to one or more of FIGS. 1 and 6. One or more of the elements or components described in relation to FIG. 8 may function similarly and/or may be implemented similarly to one or more corresponding elements or components described in relation to one or more of FIGS. 1 and 6. For example, the source 820, load 822, zero-cross circuitry 806, switching circuitry 816, processor 812, load type detector 814, current measuring circuitry 848, and/or load voltage measuring circuitry 804 of FIG. 8 may function and/or may be implemented as described in relation to one or more of the sources 120, 620, loads 122, 622, zero-cross circuitries 106, 606, switching circuitries 116, 616, processors 112, 612, load type detectors 114, 614, current measuring circuitry 648, and/or load voltage measuring circuitries 104, 604 of FIG. 1 and/or FIG. 6. It should be noted that the source 820 and the load 822 may be separate from the electronic device 802, may be coupled to the electronic device 802, and/or may not be included in the electronic device 802.

The zero-cross circuitry 806 may detect a line voltage zero cross (e.g., one or more zero cross times for the line voltage). The processor 812 may utilize the line voltage zero cross(ings) to control the switching circuitry 816. For example, the processor 812 may control the state of the switching circuitry 816 (e.g., one or more states of one or more switches, MOSFETs, etc.) in order to coordinate the line voltage zero cross(ings) with switch activation and/or deactivation. The switching circuitry 816 may be configured to perform switching based on the line voltage zero cross to supply a load voltage (e.g., a load driving voltage when activated). For example, the switching circuitry 816 may perform switching based on a timing of the line voltage zero cross. The load voltage measuring circuitry 804 is configured to measure the load voltage to produce a load voltage measurement (e.g., a voltage waveform). The current measuring circuitry 848 may be optionally configured to measure a current (e.g., a line 808 current) to produce a current measurement (e.g., a current waveform).

The line voltage measuring circuitry 850 may be configured to measure a voltage (e.g., a line 808 voltage) to produce a line voltage measurement (e.g., a line voltage waveform). For example, the line voltage measuring circuitry 850 may continuously capture the line voltage measurement (e.g., line voltage waveform) by sampling the voltage (between the line 808 and neutral 810, for instance) for one or more cycles. The line voltage measuring circuitry 850 may include discrete components. In some configurations, the line voltage measuring circuitry 850 may only include discrete components. The line voltage measuring circuitry 850 may be coupled between the feed line 808 and neutral 810 so that line voltage may be determined.

In some configurations, the line voltage measuring circuitry 850 may capture a continuous time (e.g., analog) voltage waveform. For example, the line voltage measuring circuitry 850 may capture a continuous time voltage waveform of the line voltage across the source 820. The continuous time voltage waveform may indicate how the line voltage varies over each cycle of the AC signal. Examples of sampling a voltage waveform are described in relation to FIG. 18. In some configurations, the electronic device 802 may additionally include an ADC for capturing a discrete time (e.g., digital) voltage waveform of the line voltage (e.g., line 808 voltage) by sampling the continuous time voltage waveform. For example, the ADC may sample at sufficient intervals to capture how the voltage varies over one or more cycles. In some configurations, the ADC may sample the line voltage to correspond to the sampling of the load voltage and/or the current. The digital line voltage waveform may be one example of the line voltage measurement.

One or more approaches may be implemented to determine the load type based on the load voltage measurement and the line voltage measurement. In some approaches, the load type detector 814 may determine the load type by determining whether a load voltage spike in indicated in the load voltage measurement. For example, inductive loads may produce a load voltage spike in some cases. In particular, if switching (e.g., deactivation) is not performed at a current zero cross, inductive loads may produce a load voltage spike, which may be indicated in the load voltage measurement. Because switching (e.g., deactivation) may be initially timed (e.g., approximately synchronized) with the line voltage zero cross, switching (e.g., deactivation) may not initially occur at the current zero cross, thereby producing a spike for inductive loads.

In some approaches, the load type detector 814 may determine whether a load voltage spike is indicated based on a spike threshold. For example, if the load voltage measurement exceeds the spike threshold, then the load type detector 814 may determine that the load voltage spike is indicated. In some configurations, the spike threshold may be based on the line voltage (e.g., line voltage measurement, line voltage waveform, etc.). The processor 812 (e.g., load type detector 814) may calculate the spike threshold based on the line voltage measurement produced by the line voltage measuring circuitry 850. For instance, the spike threshold(s) may be an amount (in voltage) above the line voltage measurement (and/or an amount below the line voltage measurement). Accordingly, the spike threshold(s) may be calculated relative to the line voltage measurement and may be compared to the load voltage measurement. As described above, the spike threshold value may be selected, set, and/or dependent on line voltage (e.g., 120 V, 230 V, etc.) in some configurations. Accordingly, different spike thresholds may be utilized for different configurations of the systems and methods disclosed herein. For example, the spike threshold may be the line voltage, may be below the line voltage, or may be above the line voltage.

In some approaches, the spike threshold (that is based on the line voltage measurement, for example) may be applied over one or more entire cycles. In other approaches the spike threshold may be applied to a particular time segment of the load voltage measurement. For example, a time segment of the load voltage measurement corresponding to a period after a switch deactivation may be compared to the spike threshold. In a case that the spike threshold is exceeded, the load type detector 814 may determine that a voltage spike is indicated and/or that the load 822 is an inductive load. For example, if the spike threshold is exceeded, the processor 812 may control the switching circuitry 816 to drive the load 822 in forward phase. If the spike threshold is not exceeded (e.g., the load voltage threshold is less than or equal to the spike threshold), the load type detector 814 may determine that voltage spike is not indicated and/or that the load 822 is a resistive load or capacitive load. For example, if the spike threshold is not exceeded, the load type detector 814 may control the switching circuitry 816 to drive the load 822 in reverse phase.

It should be noted that one or more spike thresholds may be utilized. For example, a positive spike threshold (above the line voltage measurement, for example) and a negative spike threshold (below the line voltage measurement, for example) may be utilized. For instance, the load type detector 814 may determine whether the load voltage measurement exceeds (e.g., is greater than) the positive spike threshold or whether the load voltage measurement exceeds (e.g., is less than or is greater in magnitude than) the negative spike threshold. A voltage spike may be indicated if the positive spike threshold or the negative spike threshold is exceeded.

The processor 812 may include a load type detector 814 for performing load type detection. The load type detector 814 may determine a load type based on the load voltage measurement and the line voltage measurement (and optionally the current measurement, for instance). For example, the electronic device 802 may utilize the line voltage measurement from the line voltage measuring circuitry 850 for determining the load type. For instance, if a voltage spike is indicated where the load voltage measurement exceeds the spike threshold, the load type detector 814 may detect that the load 822 is an inductive load. If the load voltage measurement does not exceed the spike threshold, the load type detector 814 may detect that the load 822 is not inductive (e.g., that the load 822 is a resistive or capacitive load).

In some configurations, the electronic device 802 (e.g., current measuring circuitry 848 and/or the processor 812) may determine one or more current zero crossings. In some configurations, the load type detector 814 may compare the current zero cross (of the current measurement, for instance) to the load voltage zero cross (of the load voltage measurement, for instance). The load type may be detected and/or determined based on whether the current zero cross lags, leads, or is simultaneous with the load voltage zero cross. Additionally or alternatively, the electronic device 802 may determine and/or compare slopes (e.g., crest factor) from the current measurement and the load voltage measurement to detect and/or determine load type.

In some configurations, the load type detector 814 may determine a load type based on a combination of factors. For example, the load type detector 814 may determine the load type based on whether a voltage spike is indicated by the load voltage measurement (e.g., voltage spike factor), based on a zero-cross difference between the load voltage measurement and the current measurement (e.g., zero-cross factor), and/or based on a slope difference between the load voltage measurement and the current measurement (e.g., slope factor). This may be accomplished as described above in relation to one or more of FIGS. 1-2.

In some approaches, the load type detector 814 may only analyze the current information (e.g., current waveform, current zero cross, and/or current slope) with the load voltage measurement depending on the load type detection based on a voltage spike. For example, if the load type detector 814 detects an inductive load type because a voltage spike threshold is exceeded, the load type detector 814 may not utilize (e.g., determine and/or compare current) current information (e.g., current zero cross and/or current slope). Additionally or alternatively, if the load type detector 814 detects an inductive load type because a voltage spike threshold is exceeded, the load type detector 814 may not utilize (e.g., determine and/or compare current) load voltage zero cross and/or load voltage slope. If the voltage spike analysis indicates that the load type is not inductive, current information (e.g., current zero cross and/or current slope) may be utilized to further determine whether the load type is resistive or capacitive.

The processor 812 may be configured to control the switching circuitry 816 to drive the load 822 based on the load type. For example, the processor 812 may control the switching circuitry 816 to drive the load 822 in forward phase if the load type is inductive or may control the switching circuitry 816 to drive the load 822 in reverse phase if the load type is capacitive or resistive.

It should be noted that one or more of the elements or components described in relation to FIG. 8 may be combined and/or divided in some configurations. For example, the zero-cross circuitry 806, switching circuitry 816, processor 812, load voltage measuring circuitry 804, current measuring circuitry 848, and/or line voltage measuring circuitry 850 may be divided into smaller elements or components that perform a subset of the functions described herein. Additionally or alternatively, one or more of the zero-cross circuitry 806, switching circuitry 816, processor 812, load voltage measuring circuitry 804, current measuring circuitry 848, and/or line voltage measuring circuitry 850 may be combined. For example, the line voltage measuring circuitry 850 may be combined with the zero-cross circuitry 806 in some configurations. Alternatively, the line voltage zero cross may be determined (by the line voltage measuring circuitry and/or the processor 812) based on the line voltage measurement (e.g., line voltage waveform).

Figure 9:
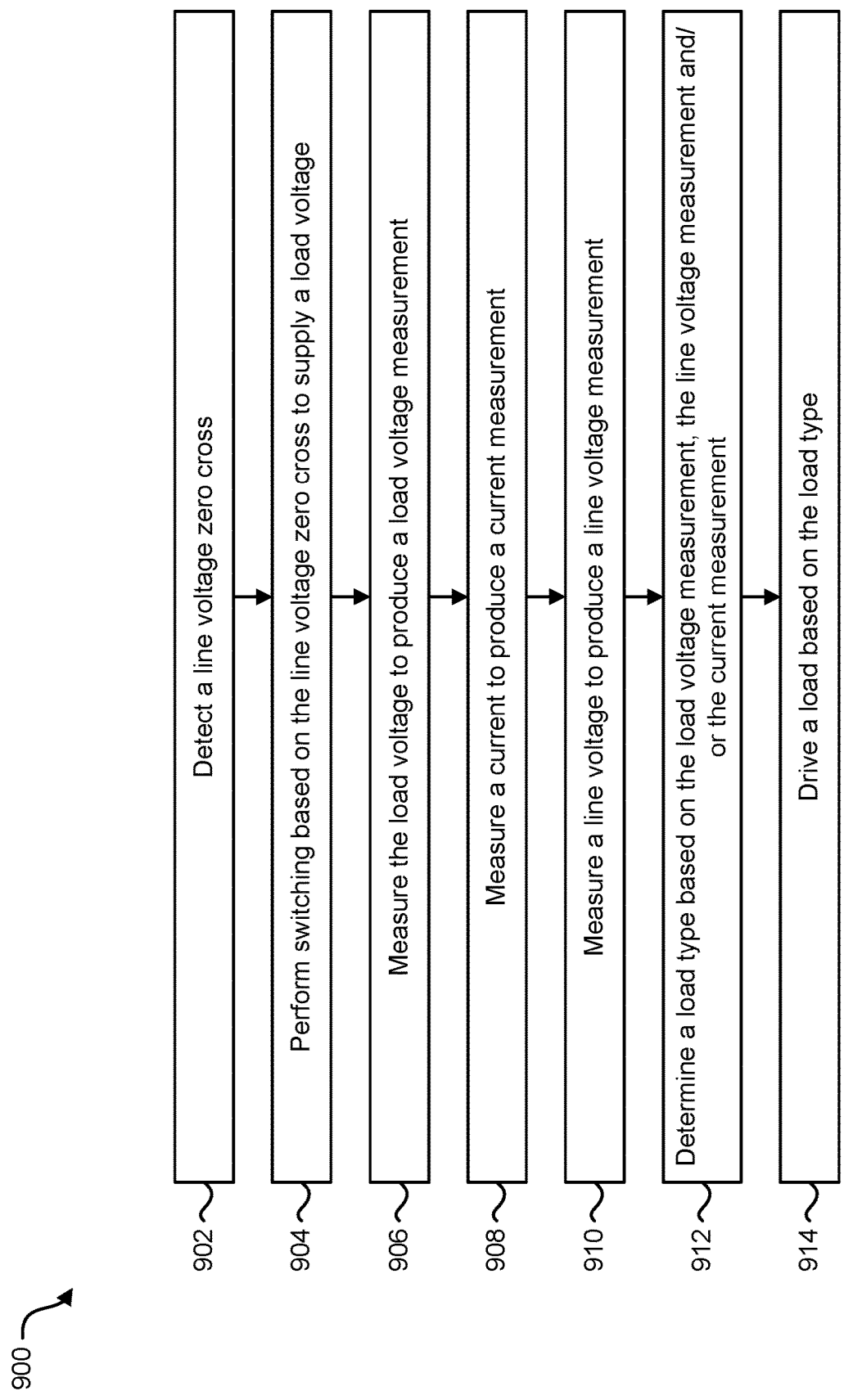
FIG. 9 is a flow diagram illustrating another more specific configuration of a method for detecting a load type.

FIG. 9 is a flow diagram illustrating another more specific configuration of a method 900 for detecting a load type. The method 900 may be performed by one or more of the electronic devices 102, 602, 802 described in relation to one or more of FIGS. 1, 6, and 8. The electronic device 802 may detect 902 a line voltage zero cross. This may be accomplished as described in relation to one or more of FIGS. 1-2, 4, and 6-8.

The electronic device 802 may perform 904 switching based on the line voltage zero cross to supply a load voltage. This may be accomplished as described in relation to one or more of FIGS. 1-2, 4, and 6.

The electronic device 802 may measure 906 the load voltage to produce a load voltage measurement. This may be accomplished as described in relation to one or more of FIGS. 1-2, 4, and 6-8. In some configurations, the electronic device 102 may determine one or more load voltage zero crossings and/or one or more load voltage measurement slopes (e.g., crest factors) based on the load voltage measurement.

The electronic device 802 may measure 908 a current (e.g., line current) to produce a current measurement. This may be accomplished as described in relation to one or more of FIGS. 1-2 and 6-8. For example, the electronic device 802 may utilize current measuring circuitry (e.g., current measuring circuitry 848) to measure the current for one or more cycles. In some configurations, the electronic device 102 may determine one or more current zero crossings and/or one or more current measurement slopes (e.g., crest factors) based on the current measurement.

The electronic device 802 may measure 910 a line voltage to produce a line voltage measurement. This may be accomplished as described in relation to one or more of FIGS. 1-2. For example, the electronic device 802 may include line voltage measuring circuitry (e.g., line voltage measuring circuitry 850) that measures a line voltage between a line feed and neutral. It should be noted that in some configurations, the line voltage measurement may be utilized to detect 902 the line voltage zero cross. For example, line voltage measuring circuitry (e.g., line voltage measuring circuitry 850) may include zero-cross circuitry (e.g., zero-cross circuitry 806) or zero-cross circuitry 806 may not be implemented separately.

The electronic device 802 may determine 912 a load type based on the load voltage measurement, the line voltage measurement, and/or the current measurement. This may be accomplished as described in relation to one or more of FIGS. 1-2 and 6-8. For example, the electronic device 802 may determine whether a load voltage spike is indicated by the load voltage measurement and the line voltage measurement. For instance, the electronic device 802 (e.g., processor 812, load type detector 814, etc.) may determine one or more spike thresholds based on the line voltage measurement (e.g., the line voltage measurement plus a value and/or minus a value). If the load voltage measurement exceeds a spike threshold, the electronic device 802 may determine 912 that the load type is inductive. If the load voltage measurement does not exceed a spike threshold, the electronic device 802 may determine 912 that the load type is non-inductive (e.g., resistive or capacitive).

In some configurations, the electronic device 802 may determine 912 the load type additionally or alternatively based on the current measurement. For example, the electronic device 802 may compare a load voltage zero cross and a current zero cross. Additionally or alternatively, the electronic device 802 (e.g., processor 812) may compare a load voltage measurement slope (e.g., crest factor) and a current measurement slope (e.g., crest factor). One or more of these factors (e.g., voltage spike factor, zero-cross factor, and/or slope factor) may be utilized to determine the load type. For example, the presence of a load voltage spike may indicate an inductive load type, while the absence thereof may indicate a non-inductive (e.g., capacitive or resistive) load type. A lagging current zero cross may indicate an inductive load type, a leading current zero cross may indicate a capacitive load type, and/or approximately synchronized zero cross (between load voltage and current, for example) may indicate a resistive load type. Particular slope differences may indicate different load types. The load type may be determined based on one or more of these factors and/or based on one or more load type detection routines (e.g., performing load type detection a number of times) as described in relation to one or more of FIGS. 1-2, 4, and 6-8.

The electronic device 802 may drive 914 a load based on the load type. This may be accomplished as described in relation to one or more of FIGS. 1-2, 4, and 6-8.

Figure 10:
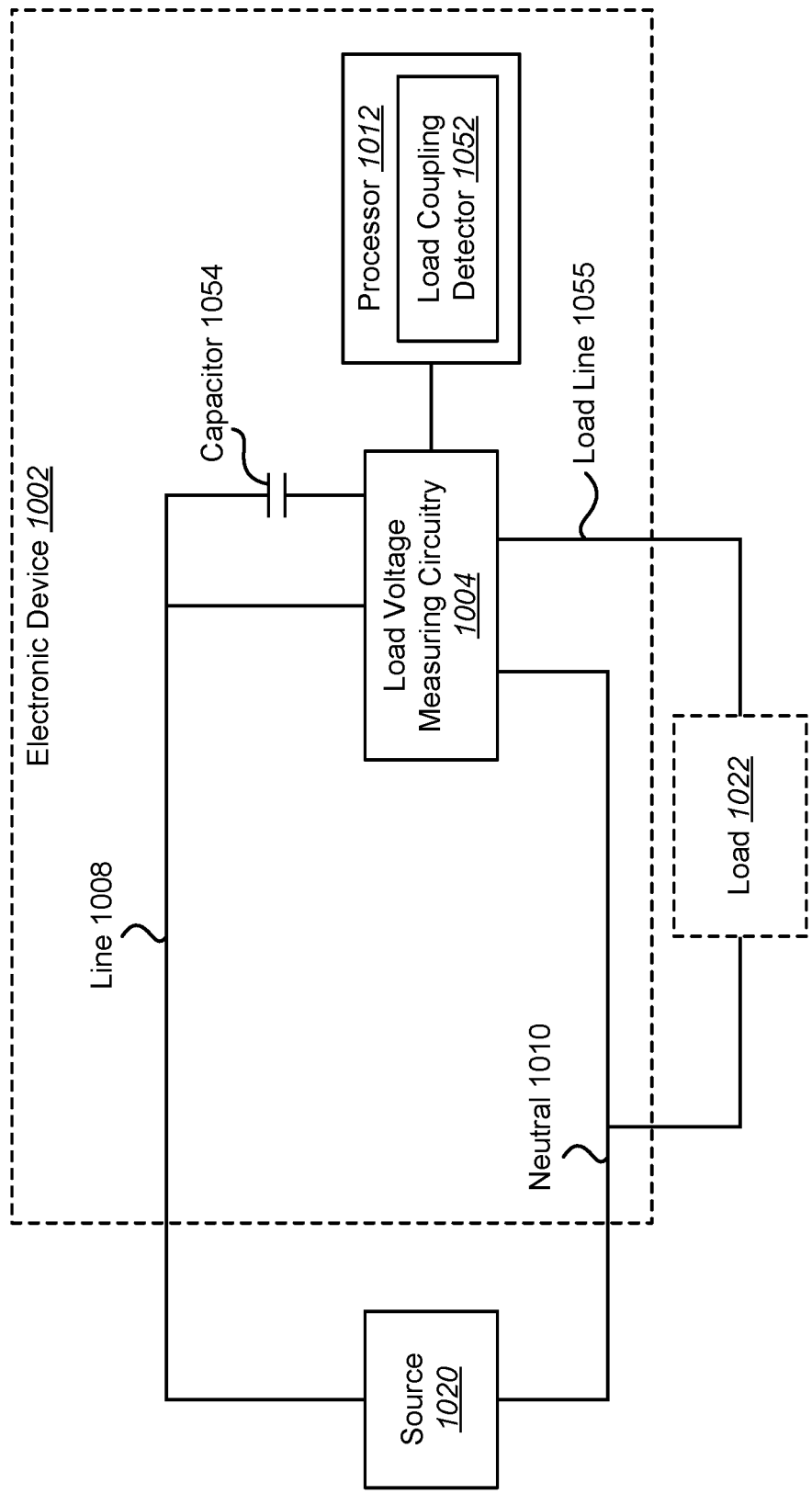
FIG. 10 is a block diagram illustrating a configuration of an electronic device for detecting load coupling.

FIG. 10 is a block diagram illustrating a configuration of an electronic device 1002 for detecting load coupling. The electronic device 1002 may include load voltage measuring circuitry 1004, a processor 1012, and/or a capacitor 1054. The processor 1012 may be coupled to the load voltage measuring circuitry 1004. In some configurations, the electronic device 1002 described in relation to FIG. 10 may be an example of one or more of the electronic devices 102, 602, 802 described in relation to one or more of FIGS. 1, 6, and 8. Additionally or alternatively, one or more of the electronic devices 102, 602, 802 described in relation to one or more of FIGS. 1, 6, and 8 may be examples of the electronic device 1002 described in relation to FIG. 10. One or more of the elements or components described in relation to FIG. 10 may function similarly and/or may be implemented similarly to one or more corresponding elements or components described in relation to one or more of FIGS. 1, 6, and 8. For example, the source 1020, load 1022, processor 1012, and/or load voltage measuring circuitry 1004 of FIG. 10 may function and/or may be implemented as described in relation to one or more of the sources 120, 620, 820, loads 122, 622, 822, processors 112, 612, 812, and/or load voltage measuring circuitries 104, 604, 804 of FIG. 1, FIG. 6, and/or FIG. 8. It should be noted that the source 1020 may be separate from the electronic device 1002, may be coupled to the electronic device 1002, and/or may not be included in the electronic device 1002.

As illustrated in FIG. 10, a load 1022 may or may not be coupled to the electronic device 1002. The electronic device 1002 may be configured to determine whether a load 1022 is coupled to the electronic device 1002 without activating a load supply. For example, the electronic device 1002 may determine whether a load 1022 is coupled to the electronic device 1002 without activating (e.g., switching on) a load voltage and/or while the load voltage is deactivated.

The load voltage measuring circuitry 1004 is configured to measure the load voltage to produce a load voltage measurement (e.g., a voltage waveform). For example, the load voltage measuring circuitry 1004 may continuously capture the voltage measurement (e.g., voltage waveform) by sampling the load voltage for one or more cycles of AC voltage. The measured load voltage and/or load voltage measurement may be provided to the processor 112. The load voltage measuring circuitry 1004 may include discrete components (e.g., one or more resistors, capacitors, transistors, amplifiers, chip packages, etc.). In some configurations, the load voltage measuring circuitry 1004 may only include discrete components.

In some configurations, the load voltage measuring circuitry 1004 may capture a continuous time (e.g., analog) voltage waveform. The continuous time voltage waveform may represent how the load voltage varies over each cycle. In some configurations, the electronic device 102 may include and/or utilize an ADC for capturing a discrete time (e.g., digital) voltage waveform of the load voltage by sampling the continuous time voltage waveform. For example, the ADC may sample at sufficient intervals to capture how the load voltage varies over one or more cycles. Examples of sampling a voltage waveform are given in relation to FIG. 18. The digital voltage waveform may be one example of the load voltage measurement.

It should be noted that a load voltage may be measurable (e.g., may exist) regardless of whether a load 1022 is coupled to the electronic device 1002. In case where a load 1022 is not coupled to the electronic device 1002, for example, a voltage may be measurable between a load line 1055 (e.g., output, terminal, etc.) and neutral 1010.

The load voltage measuring circuitry 1004 may measure the load voltage to produce a load voltage measurement without activating the load voltage (e.g., without turning on the load 1022). For example, the electronic device 1002 (e.g., switching circuitry) may not activate (e.g., switch on, turn on) the load 1022 while the load voltage is being measured for load coupling detection.

In some configurations, the electronic device 1002 may optionally include line voltage measuring circuitry and/or zero-cross circuitry (for detecting a line-voltage zero cross, for example). The line voltage measuring circuitry may produce a line voltage measurement (e.g., line voltage waveform) that indicates the line voltage between the line 1008 and neutral 1010. The line voltage measurement and/or one or more line voltage zero crossings may be utilized to detect and/or determine a load coupling in some configurations.

The processor 1012 may include a load coupling detector 1052 for performing load coupling detection. The load coupling detector 1052 may determine whether a load 1022 is coupled to the electronic device 1002 based on the load voltage measurement (and optionally a line voltage measurement, for instance). In some configurations, the load coupling detector 1052 may perform one or more load coupling detections. For example, each time the electronic device 1002 power cycles (e.g., each time power is initially provided and/or restored to the electronic device 1002), the load coupling detector 1052 may detect the load coupling. In some approaches, load coupling detection and/or determination may be performed while the electronic device 1002 is in an initial set-up mode (e.g., during "boot-up," during a detection mode, etc.). In some configurations, the load coupling detector 1052 may perform load coupling detection multiple times to determine the load coupling. For example, the load coupling detector 1052 may perform load coupling detection a number of times (e.g., three) and may determine a load coupling if all of the detections indicated the same load coupling. In another example, the load coupling detector 1052 may perform load coupling detection a number of times (e.g., three, five, etc.) and may determine a load coupling that is indicated the most. For example, if four detections out of five indicate load coupling and one detection indicates no coupling, the load coupling detector 1052 may determine that a load 1022 is coupled to the electronic device 1002.

The load voltage measurement may differ based on whether a load 1022 is coupled to the electronic device 1002. For example, the load voltage measurement may differ in one or more amplitude aspects and/or one or more timing aspects.

When a load 1022 is coupled to the electronic device 1002, for example, the load voltage measurement (e.g., loaded measurement, loaded waveform, etc.) may have a relatively small amplitude. For instance, a loaded waveform may have a peak amplitude that is smaller than a peak amplitude of line voltage. In contrast, when a load 1022 is not coupled to the electronic device 1002, for example, the load voltage measurement (e.g., unloaded measurement, unloaded waveform) may have a relatively larger amplitude. For instance, an unloaded waveform may have a higher peak amplitude that may be closer to a peak amplitude of line voltage.

Additionally or alternatively, when a load 1022 is coupled to the electronic device 1002, for example, the load voltage measurement (e.g., loaded measurement, loaded waveform, etc.) may exhibit little or no skew (e.g., regular zero crossings, similar upswing and downswing lengths, etc.). For instance, a loaded waveform may have a zero crossing that is the same as or very close to a zero crossing of line voltage. In contrast, when a load 1022 is not coupled to the electronic device 1002, for example, the load voltage measurement (e.g., unloaded measurement, unloaded waveform) may exhibit greater skew (e.g., an irregular zero crossing, different upswing and downswing lengths, etc.). For example, timing of the load voltage waveform zero cross may be skewed when the electronic device 1002 (e.g., dimmer) is not loaded. For instance, an unloaded waveform may have shifted zero crossing and/or different upswing and downswing widths.

One or more approaches may be utilized to determine whether a load 1022 is coupled to the electronic device 1002 (e.g., whether the electronic device 1002 is loaded or properly loaded). For example, the processor 1012 (e.g., load coupling detector 1052) may be configured to compare one or more aspects of the load voltage measurement to one or more thresholds. Additionally or alternatively, the processor 1012 (e.g., load coupling detector 1052) may be configured to compare one or more aspects of the load voltage measurement to one or more aspects of the line voltage measurement (e.g., amplitude aspects, timing aspects, line voltage peak value(s), line voltage zero cross(ings), for instance). Examples of aspects that may be compared may include amplitude aspects (e.g., peak amplitude, magnitude, etc.), timing aspects (e.g., zero cross(ings), upswing/downswing length differences), root mean square (RMS) values, etc. It should be noted that an RMS value may be considered an amplitude aspect, a timing aspect, or both.

In some approaches, the load coupling detector 1052 may utilize one or more amplitude thresholds for detecting a load coupling. The one or more amplitude thresholds may be predetermined and/or may be calculated (based on a line voltage measurement, for instance). For example, a predetermined amplitude threshold may be a set voltage (in millivolts (mV), for instance) (e.g., 160 mV). A calculated threshold may be some proportion of the line voltage amplitude (e.g., 50%, 10%, etc.). In some approaches, if the amplitude (e.g., peak amplitude, RMS value, etc.) of the load voltage measurement is below an amplitude threshold, the load coupling detector 1052 may detect and/or determine that the electronic device 1002 is coupled to a load (e.g., is loaded). For example, if the load voltage measurement is not an AC waveform, if the load voltage measurement peak is below a threshold (e.g., 160 mV, 50% of line voltage peak, 10% of line voltage peak, etc.), then the electronic device 1002 (e.g., dimmer) may be coupled to a load 1022 (e.g., may be loaded).

In some approaches, if the amplitude (e.g., peak amplitude, RMS value, etc.) of the load voltage measurement is above an amplitude threshold, the load coupling detector 1052 may detect and/or determine that the electronic device 1002 is not coupled to a load (e.g., is unloaded). For example, if the load voltage measurement peak is greater than or equal to an amplitude threshold (e.g., a predetermined threshold or a threshold based on line voltage), then the electronic device 1002 (e.g., dimmer) may not be coupled to a load 1022. For instance, a predetermined amplitude threshold may be a set voltage (in millivolts (mV), for instance) (e.g., 160 mV). A calculated threshold may be some proportion of the line voltage (e.g., 93%, 50%, 10%, etc.). For example, the peak(s) of the load voltage measurement may be closer to the peak(s) of the line voltage (e.g., line voltage measurement) when a load is not coupled. In some approaches, the processor 1012 (e.g., load coupling detector 1052) may compare a peak value of the load voltage measurement to a peak value of the line voltage measurement. If the difference between the load voltage peak value and the line voltage peak value is greater than a specified value (e.g., peak difference threshold), then the electronic device 1002 (e.g., dimmer) may be loaded. If the difference between the load voltage peak value and the line voltage peak value is less than or equal to a specified value (e.g., peak difference threshold), then the electronic device 1002 (e.g., dimmer) may be unloaded.

It should be noted that multiple amplitude thresholds may be utilized in some configurations. For example, a positive amplitude threshold and a negative amplitude threshold may be utilized. The positive amplitude threshold and negative amplitude threshold may have different magnitudes. Additionally or alternatively, the amplitude threshold(s) may differ based on the source 1020 (e.g., 120 V, 240 V, etc.). As described above, the load voltage measurement may exhibit different positive and negative peaks. When the electronic device 1002 is not coupled to a load 1022, for example, the load voltage measurement may exhibit about 93% of the line voltage positive peak amplitude and about 100% of the line voltage negative peak amplitude at 240 V. Also, when the electronic device 1002 is not coupled to a load 1022, the load voltage measurement may exhibit about 91% of the line voltage positive peak amplitude and about 18% of the line voltage negative peak amplitude at 120 V. Accordingly, multiple thresholds may be utilized for positive voltage, negative voltage, and/or source voltages.

The load voltage measurement (e.g., waveform) may be shifted in time (e.g., skewed) when the electronic device 1002 is not coupled to a load. For example, the zero crossings at the rising edges of the load voltage measurement may be approximately synchronous with the zero crossings of the line voltage (e.g., line voltage measurement). Zero crossings at the falling edges of the load voltage measurement may be shifted relative to the halfway point between the rising edge zero crossings (of the load voltage measurement) and/or relative to falling edge zero crossings of the line voltage (e.g., line voltage measurement). Accordingly, the zero crossings and/or upswing and downswing lengths may be irregular. In other words, the load voltage measurement may exhibit asymmetry when the electronic device 1002 is not coupled to a load (e.g., is unloaded). For instance, the trailing edge on the negative side may shift in time by an amount (e.g., a threshold amount, 960 microseconds (μs) to 1 millisecond (ms), etc.) in a working frequency range at 60% of the peak voltage. Additionally or alternatively, the leading edge on the positive side may shift by an amount (e.g., a threshold amount, by 260 μs, etc.) at 31% of the peak voltage.

The skew (e.g., irregularity, asymmetry, and/or time shift) in the load voltage measurement may occur due to a capacitor 1054. The capacitor 1054 may be utilized in the electronic device 1002 in order to cause the skew in the load voltage measurement when the electronic device 1002 is not coupled to a load 1022. Additionally or alternatively, the capacitor 1054 may be utilized in the electronic device 1002 in order to filter the line 1008 (e.g., line frequency and/or line noise). Accordingly, the skewing behavior may be a beneficial side effect of utilizing a filtering capacitor 1054 in some configurations.

The load coupling detector 1152 may utilize one or more time thresholds to detect and/or determine whether a load 1022 is coupled to the electronic device 1002. The time threshold(s) may be predetermined and/or calculated based on the load voltage measurement and/or a line voltage measurement. For example, a time threshold may be set as a predetermined amount of time (e.g., half cycle, 8.33 ms, etc.) after the beginning of a cycle. If the falling edge zero cross of the load voltage measurement occurs before the time threshold (e.g., is less than the time threshold), then the load coupling detector 1052 may detect and/or determine that the electronic device 1002 is not coupled to a load 1022. If the falling edge zero cross of the load voltage measurement occurs at or after (e.g., is greater than or equal to the time threshold), then the load coupling detector 1052 may detect and/or determine that the electronic device 1002 is coupled to a load 1022.

In another approach, the load coupling detector 1052 may determine the time threshold based on the load voltage measurement. For example, the load coupling detector 1052 may calculate the time threshold as a proportion of (e.g., half of) the cycle period of the load voltage measurement. If the falling edge zero cross of the load voltage measurement occurs before the time threshold (e.g., is less than the time threshold), then the load coupling detector 1052 may detect and/or determine that the electronic device 1002 is not coupled to a load 1022. If the falling edge zero cross of the load voltage measurement occurs at or after (e.g., is greater than or equal to the time threshold), then the load coupling detector 1052 may detect and/or determine that the electronic device 1002 is coupled to a load 1022.

In another approach, the load coupling detector 1052 may determine the time threshold based on the load voltage measurement, a line voltage measurement, and/or a line voltage zero cross. For example, the load coupling detector 1052 may compare a zero cross of the load voltage measurement (e.g., a falling edge zero cross) to a falling edge zero cross of a line voltage (from the line voltage measurement and/or a line voltage zero cross detection). If the falling edge zero cross of the load voltage measurement occurs before the time threshold (e.g., is less than the time threshold), then the load coupling detector 1052 may detect and/or determine that the electronic device 1002 is not coupled to a load 1022. If the falling edge zero cross of the load voltage measurement occurs at or after (e.g., is greater than or equal to the time threshold), then the load coupling detector 1052 may detect and/or determine that the electronic device 1002 is coupled to a load 1022.

In another approach, the load coupling detector 1052 may compare upswing and downswing widths (e.g., lengths in time) of the load voltage measurement. For example, the load coupling detector 1052 may calculate an upswing width as a time difference between a rising edge zero cross of the load voltage measurement and a falling edge zero cross of the load voltage measurement. Also, the load coupling detector 1052 may calculate a downswing width as a time difference between a falling edge zero cross of the load voltage measurement and a rising edge zero cross of the load voltage measurement. If the difference between upswing width and downswing width is greater than a threshold (e.g., a time threshold), the load coupling detector 1052 may detect and/or determine that the electronic device 1002 is not coupled to a load 1022. Otherwise, the load coupling detector 1052 may detect and/or determine that the electronic device 1002 is coupled to a load 1022.

In some cases, the differential may be very small at zero cross. One or more of the approaches described herein may alternatively be utilized at one or more different points (e.g., percentages) of the load voltage measurement (e.g., waveform). For example, one or more of the foregoing approaches may be applied at percentages of the load voltage waveform (e.g., at 60% trailing edge and 31% leading edge of load voltage). For instance, a percentage trailing edge of load voltage may be compared to a time threshold and/or a percentage leading edge of load voltage may be compared to a time threshold (instead of a zero cross) to determine whether a load 1022 is coupled or not. One example is provided in connection with FIG. 25.

In some approaches, the processor 1012 (e.g., load coupling detector 1052) may calculate an RMS voltage of a line voltage measurement. The processor may compare the RMS voltage of the line voltage measurement to the load voltage measurement (and/or an RMS voltage of the load voltage measurement). If the load voltage measurement is within a threshold range, the load coupling detector 1052 may determine that the electronic device (e.g., dimmer) is not coupled to a load (e.g., is unloaded).

In some configurations, the processor 1012 (e.g., load coupling detector 1052) may utilize a combination of aspects to determine whether a load 1022 is coupled. For example, the load coupling detector 1052 may determine the load coupling based on one or more amplitude aspects (e.g., peak amplitude, RMS, etc.) and/or based on one or more time aspects (e.g., zero-cross aspect, zero-cross difference between the load voltage measurement and line voltage, time difference at one or more measurement points, etc.). Each of the detections may be performed in accordance with the aspects as described above. In some approaches, the load coupling may be determined based on a majority of aspects. For example, if at least two of three aspects (e.g., peak amplitude, RMS, and zero-cross) indicate the same load coupling, the load coupling detector 1052 may determine that load coupling. In some approaches, the load coupling may be determined based on unanimous aspects. For example, a number of aspects may be utilized, and the load coupling detector 1052 may determine the load coupling only if all of the aspects (e.g., a time aspect and an amplitude aspect, etc.) agree regarding the load coupling. If one or more aspects disagree, the load coupling detection routine may be repeated until all of the aspects are unanimous in some approaches.

In some approaches, in addition to one or more of the configurations and/or approaches described above, the load coupling detection routine may be performed (e.g., repeated) a number of times. Each load coupling detection may indicate a detected load coupling (e.g., loaded or unloaded etc.). The load coupling detections may be utilized to make a (final) determination on the load coupling. In some approaches, a threshold number of agreeing load coupling detections may need be satisfied in order to make the load coupling determination. For example, at least three load coupling detections may be required to agree for the final load coupling determination. For instance, as soon as a number of (e.g., three) load coupling detections agree, the final load coupling determination may be the load coupling of the agreeing load coupling detections. In another example, the threshold may require a minimum proportion of load coupling detections (e.g., a minimum percentage of a minimum number of detections, at least 75% of at least four detection routines, etc.). The load coupling detection routine may be repeated until the one or more criteria are satisfied and/or until a failure threshold is reached. If the failure threshold is reached, a fault indication may be provided (e.g., a fault light may be activated, a fault message may be displayed, a fault message may be communicated to a control system, etc.) For example, if the one or more criteria are not satisfied with 10 load coupling detection routines, the fault indication may be provided.

In some configurations, the processor 1012 may be configured to disable a load activation capability in a case that no load 1022 is coupled to the electronic device 1002. For example, the processor 1012 may control switching circuitry to remain in an off state (e.g., to not provide power, voltage, etc., to load terminals and/or lines). The load activation capability may be disabled until a load coupling is detected. For instance, if the electronic device 1002 (e.g., dimmer) is unloaded, the electronic device 1002 may show a fault and may not allow the user (e.g., installer) to turn the electronic device 1002 on until the electronic device 1002 is loaded properly. One benefit of disabling the activation capability may be protecting the electronic device 1002. For example, disabling the activation capability may prevent harmful currents and/or voltages from damaging the circuitry (e.g., transistors, MOSFETs, etc.). This may extend the life of the electronic device 1002. Additionally or alternatively, disabling the activation capability may protect a user (e.g., installer) from electrocution.

In some configurations, the processor 1012 may be configured to indicate (e.g., output) a fault status in a case that no load 1022 is coupled to the electronic device 1002. For example, the processor 1012 may activate a fault indication (e.g., light, light emitting diode (LED), light color, text display, tactile signal, audio output message, etc.) to indicate a fault. In some configurations, the fault indication may indicate a reason for the fault (e.g., "no load detected.") Additionally or alternatively, indicating a fault status may include sending a fault message to another device (e.g., to a control system). For example, the electronic device 1002 may send a message (e.g., code) to another device (e.g., home automation system) indicating a fault and/or a reason for the fault. The electronic device 1002 may continue to indicate the fault status until a load coupling is detected.

In some configurations, the processor 1012 may be configured to enable a load activation capability, to indicate (e.g., output) a no fault (e.g., "okay") status, and/or to perform one or more procedures (e.g., detect a load type) in a case that a load 1022 is coupled to the electronic device 1002. For example, the processor 1012 may control switching circuitry to enable activation (e.g., enable switching on, dimming, etc.). The load activation capability may be enabled when a load coupling is detected. Additionally or alternatively, the processor 1012 may activate a no fault indication (e.g., light, light emitting diode (LED), light color, text display, tactile signal, audio output message, etc.) to indicate no fault and/or that a load is detected. Additionally or alternatively, indicating a fault status may include sending a no fault message to another device (e.g., to a control system). For example, the electronic device 1002 may send a message (e.g., code) to another device (e.g., home automation system) indicating that no fault is detected (e.g., that the electronic device 1102 is operational). Additionally or alternatively, the processor 1012 may be configured to perform one or more procedures (e.g., detect a load type, perform one or more additional detections/tests, boot-up procedures, etc.) in a case that a load 1022 is coupled (e.g., in a case that not fault is detected).

It should be noted that one or more of the elements or components described in relation to FIG. 10 may be combined and/or divided in some configurations. For example, the processor 1012, load voltage measuring circuitry 1004, and/or capacitor 1054 into smaller elements or components that perform a subset of the functions described herein. Additionally or alternatively, one or more of the processor 1012, load voltage measuring circuitry 1004, and/or capacitor 1054 may be combined. For example, the capacitor 1054 may be part of the load voltage measuring circuitry 1004 in some configurations.

Figure 11:
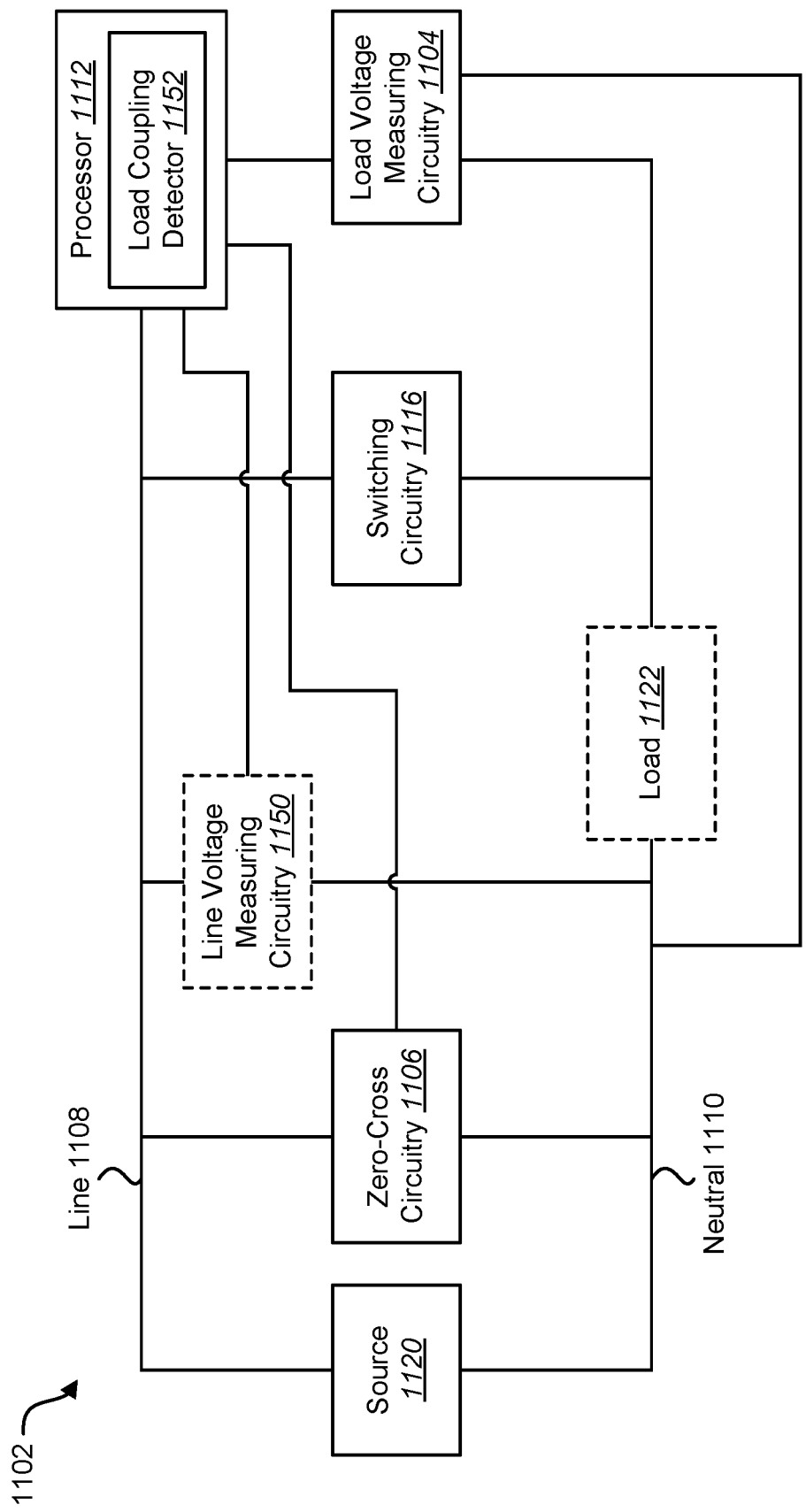
FIG. 11 is a block diagram illustrating a more specific configuration of an electronic device for detecting a load coupling.

FIG. 11 is a block diagram illustrating a more specific configuration of an electronic device 1102 for detecting a load coupling. The electronic device 1102 may include load voltage measuring circuitry 1104, a processor 1112, switching circuitry 1116, zero-cross circuitry 1106, and/or line voltage measuring circuitry 1150 (optionally). The processor 1112 may be coupled to the load voltage measuring circuitry 1104, to the switching circuitry 1116, to the zero-cross circuitry 1106, and/or to the line voltage measuring circuitry 1150. The electronic device 1102 described in relation to FIG. 11 may be an example of one or more of the electronic devices 102 described in relation to one or more of FIGS. 1, 6, 8, and 10. One or more of the elements or components described in relation to FIG. 11 may function similarly and/or may be implemented similarly to one or more corresponding elements or components described in relation to one or more of FIGS. 1, 6, 8, and 10. For example, the source 1120, load 1122, zero-cross circuitry 1106, switching circuitry 1116, processor 1112, load coupling detector 1152, and/or load voltage measuring circuitry 1104 of FIG. 11 may function and/or may be implemented as described in relation to one or more of the sources 120, 620, 820, 1020, loads 122, 622, 822, 1022, zero-cross circuitries 106, 606, 806, switching circuitries 116, 616, 816, processors 112, 612, 812, 1012, and/or load voltage measuring circuitries 104, 604, 804, 1004 of FIG. 1, FIG. 6, FIG. 8, and/or FIG. 10. It should be noted that the source 1120 may be separate from the electronic device 1102, may be coupled to the electronic device 1102, and/or may not be included in the electronic device 1102. A load 1122 may or may not be coupled to the electronic device 1102.

The zero-cross circuitry 1106 may detect a line voltage zero cross (e.g., one or more zero cross times for the line voltage between the line 1108 and neutral 1110). The switching circuitry 1116 may be configured to perform switching. For example, the switching circuitry 1116 may perform switching if a load 1122 is detected or may be disabled if a load 1122 is not detected. The load voltage measuring circuitry 1104 is configured to measure the load voltage to produce a load voltage measurement (e.g., a voltage waveform). The line voltage measuring circuitry 1150 may be optionally configured to measure a voltage (e.g., a line 1108 voltage) to produce a line voltage measurement (e.g., a line voltage waveform).

The processor 1112 (e.g., load coupling detector 1152) may be configured to detect and/or determine whether a load 1122 is coupled to the electronic device 1102. For example, the processor 1112 (e.g., load coupling detector 1152) may detect whether a load 1122 is coupled to the electronic device 1102 based on a load voltage measurement. This may be accomplished as described in relation to FIG. 10. In some configurations, the load coupling detection may be additionally performed based on a line voltage measurement and/or one or more line voltage zero crossings. This may be accomplished as described in relation to FIG. 10.

In some configurations, the processor 1112 may be configured to disable a load activation capability and/or indicate a fault status in a case that no load 1122 is coupled to the electronic device 1102. This may be accomplished as described in relation to FIG. 10. Additionally or alternatively, the processor 1112 may be configured to enable a load activation capability and/or indicate a no fault status in a case that a load 1122 is coupled to the electronic device 1102. This may be accomplished as described in relation to FIG. 10.

It should be noted that one or more of the elements or components described in relation to FIG. 11 may be combined and/or divided in some configurations. For example, the zero-cross circuitry 1106, switching circuitry 1116, processor 1112, load voltage measuring circuitry 1104, and/or line voltage measuring circuitry 1150 may be divided into smaller elements or components that perform a subset of the functions described herein. Additionally or alternatively, one or more of the zero-cross circuitry 1106, switching circuitry 1116, processor 1112, load voltage measuring circuitry 1104, and/or line voltage measuring circuitry 1150 may be combined. For example, the line voltage measuring circuitry 1150 may be combined with the zero-cross circuitry 1106 in some configurations. Alternatively, the line voltage zero cross may be determined (by the line voltage measuring circuitry and/or the processor 1112) based on the line voltage measurement (e.g., line voltage waveform).

Figure 12:
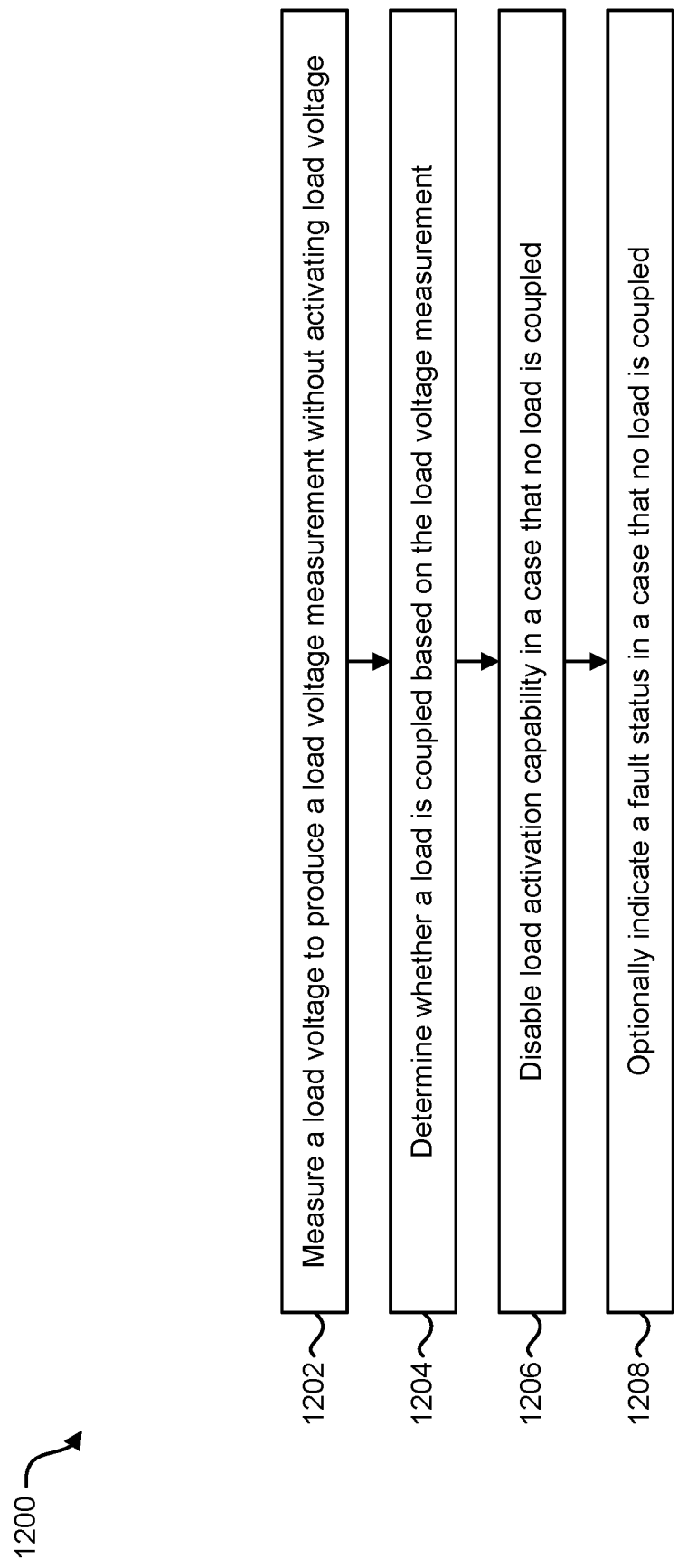
FIG. 12 is a flow diagram illustrating one configuration of a method for detecting a load coupling.

FIG. 12 is a flow diagram illustrating one configuration of a method 1200 for detecting a load coupling. The method 1200 may be performed by one or more of the electronic devices 1002, 1102 described in relation to one or more of FIGS. 10-11. The electronic device 1002 may measure 1202 the load voltage to produce a load voltage measurement without activating load voltage. This may be accomplished as described in relation to FIG. 10. For example, the electronic device 1002 (e.g., load voltage measuring circuitry 1004) may measure 1202 the load voltage as a load voltage measurement (e.g., a voltage waveform, a series of voltage data samples, etc.) while load voltage is not activated (e.g., while a load is not being driven). The load voltage measurement may indicate the load voltage for one or more cycles (e.g., AC voltage cycles).

The electronic device 1002 may determine 1204 whether a load is coupled to the electronic device 1002 based on the load voltage measurement. This may be accomplished as described in relation to FIG. 10. For example, the electronic device 1002 (e.g., processor 1012) may utilize one or more aspects (e.g., amplitude, timing, skew, etc.) of the load voltage measurement to determine whether a load is coupled to the electronic device 1002. For instance, one or more aspects of the load voltage measurement may be compared with one or more thresholds and/or one or more aspects of a line voltage measurement. In some configurations, if a load voltage measurement amplitude (e.g., peak amplitude) is greater than a threshold, the electronic device 1002 may determine that a load is not coupled to the electronic device 1002. If a load voltage measurement amplitude (e.g., peak amplitude) is less than or equal to a threshold, the electronic device 1002 may determine that a load is coupled to the electronic device 1002. Additionally or alternatively, if a load voltage zero cross is skewed (relative to a threshold and/or to a line voltage zero cross, for example), the electronic device 1002 may determine that a load is not coupled to the electronic device 1002. If a load voltage zero cross is not skewed (relative to a threshold and/or to a line voltage zero cross, for example), the electronic device 1002 may determine that a load is coupled to the electronic device 1002. Additionally or alternatively, the electronic device 1002 may compare RMS values between the load voltage measurement and the line voltage measurement to determine a load coupling.

The electronic device 1002 may disable 1206 a load activation capability in a case that no load is coupled. This may be accomplished as described in relation to FIG. 10. This may protect an installer from electrocution in a case that a load is not properly coupled to the electronic device 1002. Additionally or alternatively, the electronic device 1002 may indicate 1208 a fault status in a case that no load is coupled. This may be accomplished as described in relation to FIG. 10.

Figure 13:
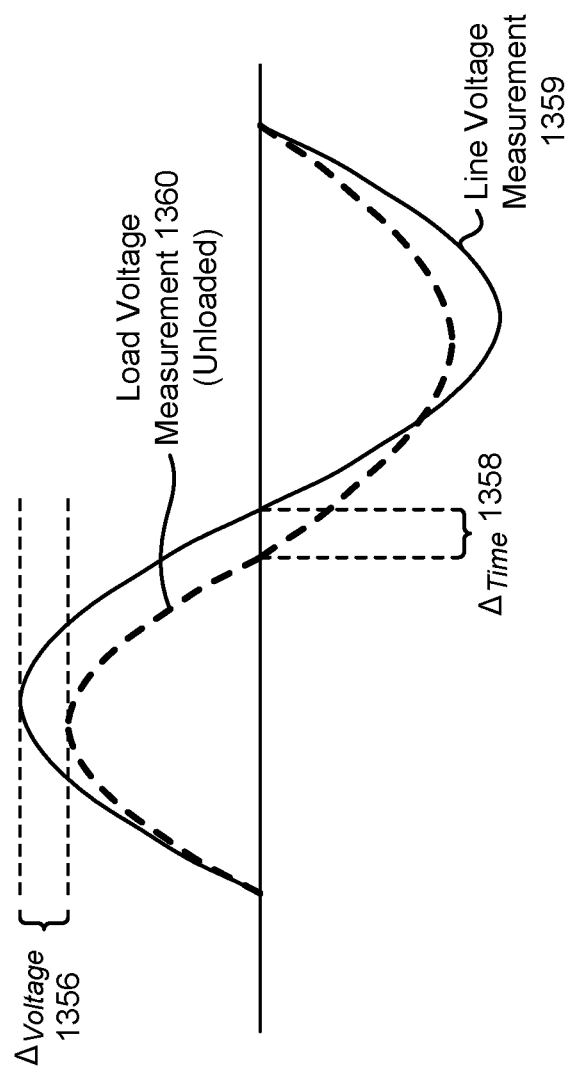
FIG. 13 is a diagram illustrating an example of an unloaded load voltage measurement and a line voltage measurement.

FIG. 13 is a diagram illustrating an example of an unloaded load voltage measurement 1360 and a line voltage measurement 1359. As illustrated in FIG. 13, the unloaded load voltage measurement 1360 and the line voltage measurement 1359 differ in amplitude by a voltage 1356 (e.g., $\Delta_{Voltage}$) and in timing by a time 1358 (e.g., $\Delta_{Time}$). One or more of these aspects (e.g., amplitude and/or skew) may be utilized to determine whether or not a load is coupled to an electronic device. For example, the unloaded load voltage measurement 1360 amplitude may be lower than the line voltage measurement 1359 amplitude. Additionally or alternatively, the load voltage measurement 1360 may be skewed by a time 1358 relative to the line voltage measurement 1359.

Figure 14:
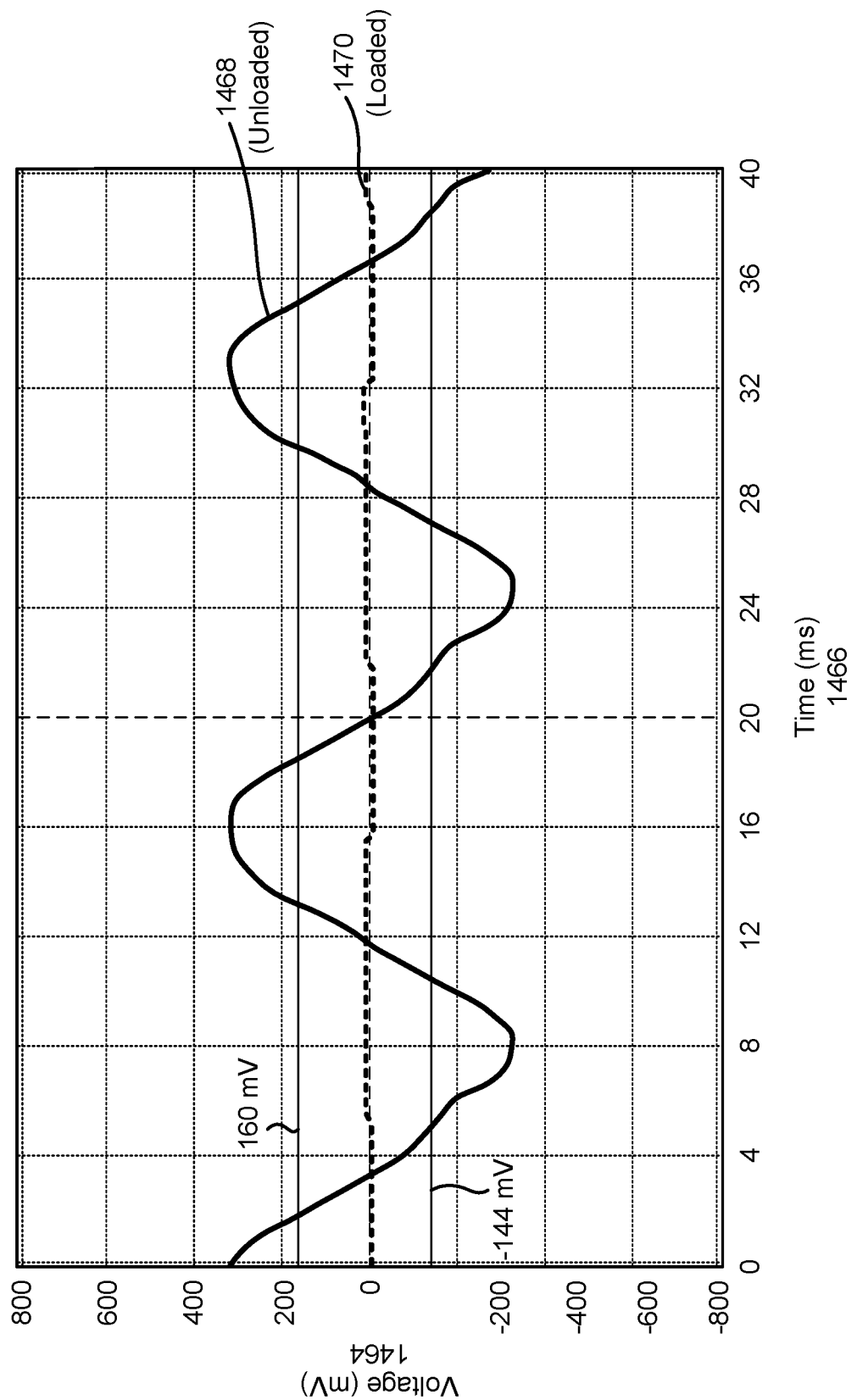
FIG. 14 is a graph that illustrates an example of an unloaded load voltage measurement and a loaded load voltage measurement.

FIG. 14 is a graph that illustrates an example of an unloaded load voltage measurement 1468 and a loaded load voltage measurement 1470. The graph is given in voltage (mV) 1464 over time (ms) 1466. As illustrated in FIG. 14, the unloaded load voltage measurement 1468 exhibits a higher amplitude than the loaded load voltage measurement 1470. A positive amplitude threshold (e.g., 160 mV) and/or a negative amplitude threshold (e.g., −144 mV) may be utilized to determine whether or not a load is coupled to an electronic device (without activating the load voltage, for example). It should be noted that FIGS. 13 and 14 may illustrate different approaches to determine whether an electronic device (e.g., electronic device 1002) is loaded. For example, some approaches may rely only on the load voltage measurement, while others may rely on the load voltage measurement and the line voltage measurement.

Figure 15:
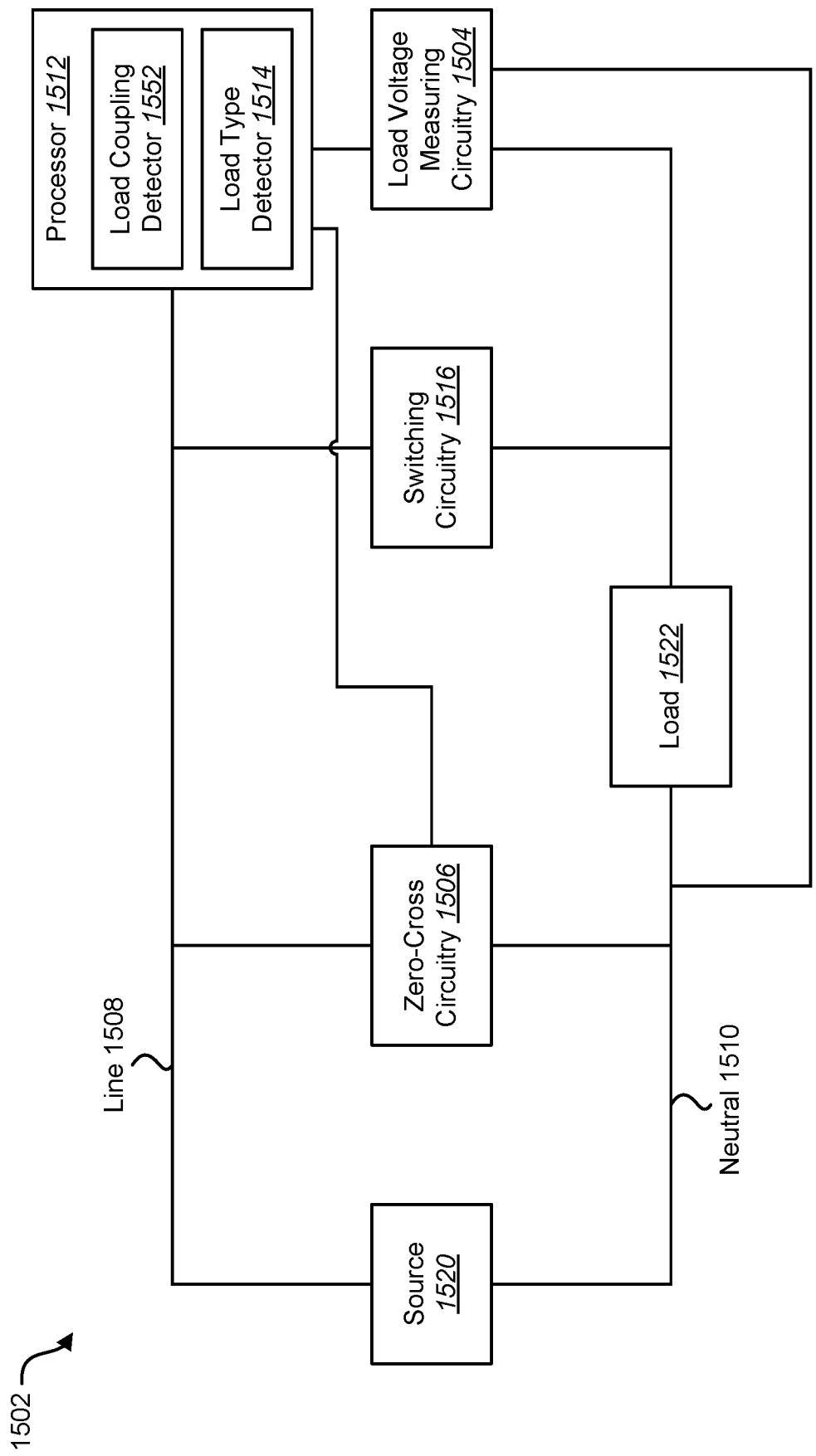
FIG. 15 is a block diagram illustrating a configuration of an electronic device for detecting a load coupling and detecting a load type.

FIG. 15 is a block diagram illustrating a configuration of an electronic device 1502 for detecting a load coupling and detecting a load type. The electronic device 1502 may include load voltage measuring circuitry 1504, a processor 1512, switching circuitry 1516, zero-cross circuitry 1506. In some configurations, the electronic device 1502 may optionally include current measuring circuitry and/or line voltage measuring circuitry. The processor 1512 may be coupled to the load voltage measuring circuitry 1504, to the switching circuitry 1516, and/or to the zero-cross circuitry 1506. The electronic device 1502 described in relation to FIG. 15 may be an example of one or more of the electronic devices 102, 602, 802, 1002, 1102 described in relation to one or more of FIGS. 1, 6, 8, and 10-11. One or more of the elements or components described in relation to FIG. 15 may function similarly and/or may be implemented similarly to one or more corresponding elements or components described in relation to one or more of FIGS. 1, 6, 8, and 10-11. For example, the source 1520, load 1522, zero-cross circuitry 1506, switching circuitry 1516, processor 1512, load coupling detector 1552, and/or load type detector 1514 of FIG. 15 may function and/or may be implemented as described in relation to one or more of the sources 120, 620, 820, 1020, 1120, loads 122, 622, 822, 1022, 1122, zero-cross circuitries 106, 606, 806, 1106, switching circuitries 116, 616, 816, 1116, processors 112, 612, 812, 1012, 1112, load type detectors 114, 614, 814, and/or load voltage measuring circuitries 104, 604, 804, 1004, 1104 of FIG. 1, FIG. 6, FIG. 8, FIG. 10 and/or FIG. 11. It should be noted that the source 1520 and the load 1522 may be separate from the electronic device 1502, may be coupled to the electronic device 1502, and/or may not be included in the electronic device 1502. A load 1522 may or may not be coupled to the electronic device 1502.

The zero-cross circuitry 1506 may detect a line voltage zero cross (e.g., one or more zero cross times for the line voltage between the line 1508 and neutral 1510). The switching circuitry 1516 may be configured to perform switching. The load voltage measuring circuitry 1504 is configured to measure the load voltage to produce a load voltage measurement (e.g., a voltage waveform). The optional current measuring circuitry may be optionally configured to measure a current (e.g., a line 1508 current) to produce a current measurement (e.g., a current waveform). The optional line voltage measuring circuitry may be optionally configured to measure a voltage (e.g., a line 1508 voltage) to produce a line voltage measurement (e.g., a line voltage waveform).

The load coupling detector 1552 may perform load coupling detection and/or determination as described in relation to one or more of the configurations described herein (in relation to one or more of FIGS. 10-14, for example). The load type detector 1514 may perform load type detection and/or determination as described in relation to one or more of the configurations described herein (in relation to one or more of FIGS. 1-9, for example). In some configurations, load coupling detection may be performed first and load type detection may be performed only in a case that load coupling detection indicates that a load 1522 is coupled to the electronic device 1502.

It should be noted that one or more of the elements or components described in relation to FIG. 15 may be combined and/or divided in some configurations. For example, the zero-cross circuitry 1506, switching circuitry 1516, processor 1512, and/or load voltage measuring circuitry 1504 may be divided into smaller elements or components that perform a subset of the functions described herein. Additionally or alternatively, one or more of the zero-cross circuitry 1506, switching circuitry 1516, processor 1512, and/or load voltage measuring circuitry 1504, may be combined. In some configurations, the load coupling detector 1552 and the load type detector 1514 may be combined.

Figure 16:
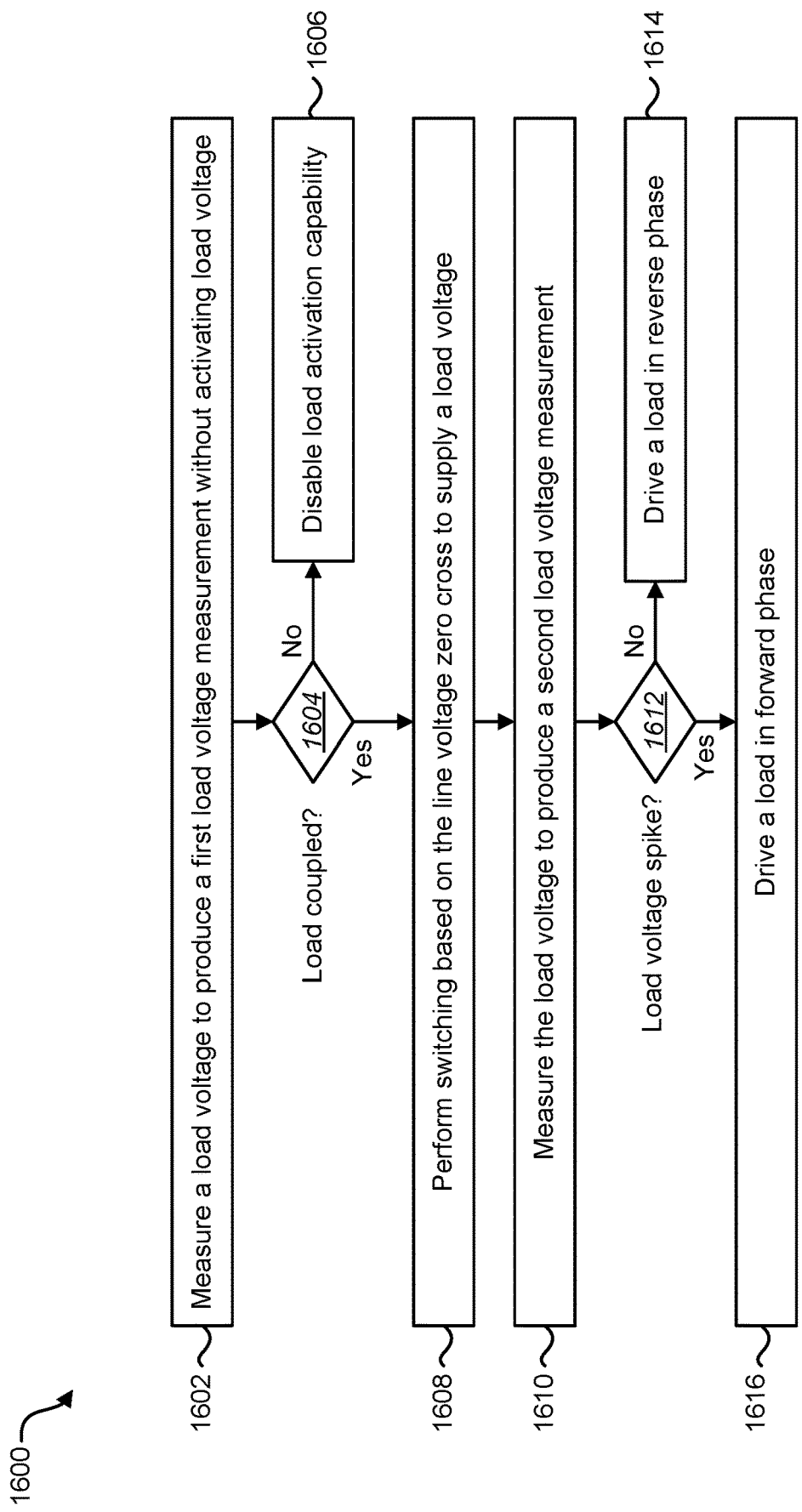
FIG. 16 is a flow diagram illustrating one configuration of a method for detecting a load coupling and detecting a load type.

FIG. 16 is a flow diagram illustrating one configuration of a method 1600 for detecting a load coupling and detecting a load type. The method 1600 may be performed by one or more of the electronic devices described herein (e.g., the electronic device 1502). The electronic device 1502 may measure 1602 a load voltage to produce a load voltage measurement without activating load voltage. This may be accomplished as described in relation to FIG. 10.

The electronic device 1502 may determine 1604 whether a load is coupled to the electronic device 1502 based on the load voltage measurement. This may be accomplished as described in relation to FIG. 10.

If a load is not coupled to the electronic device 1502, the electronic device 1502 may disable 1606 a load activation capability in a case that no load is coupled. This may be accomplished as described in relation to FIG. 10. Additionally or alternatively, the electronic device 1502 may indicate a fault status in a case that no load is coupled. This may be accomplished as described in relation to FIG. 10.

If a load is coupled to the electronic device 1502, the electronic device 1502 may perform 1608 switching based on a line voltage zero cross to supply a load voltage. This may be accomplished as described in relation to one or more of FIGS. 1-3.

The electronic device 1502 may measure 1610 the load voltage to produce a load voltage measurement. This may be accomplished as described in relation to one or more of FIGS. 1-3.

The electronic device 1502 may determine 1612 whether a load voltage spike is indicated by the load voltage measurement. This may be accomplished as described in relation to one or more of FIGS. 1 and 3-4.

In a case that a load voltage spike is indicated, the electronic device 1502 may drive 1616 a load in forward phase (for an inductive load, for example). This may be accomplished as described in relation to one or more of FIGS. 1-2 and 4-5. In a case that a load voltage spike is not indicated, the electronic device 1502 may drive 1614 a load in reverse phase (for a resistive or capacitive load, for example). This may be accomplished as described in relation to one or more of FIGS. 1-2 and 4-5. It should be noted that common or separate load voltage measurements, zero-cross measurements, line voltage measurements and/or current measurements may be performed for detecting a load coupling and detecting load type.

Figure 17:
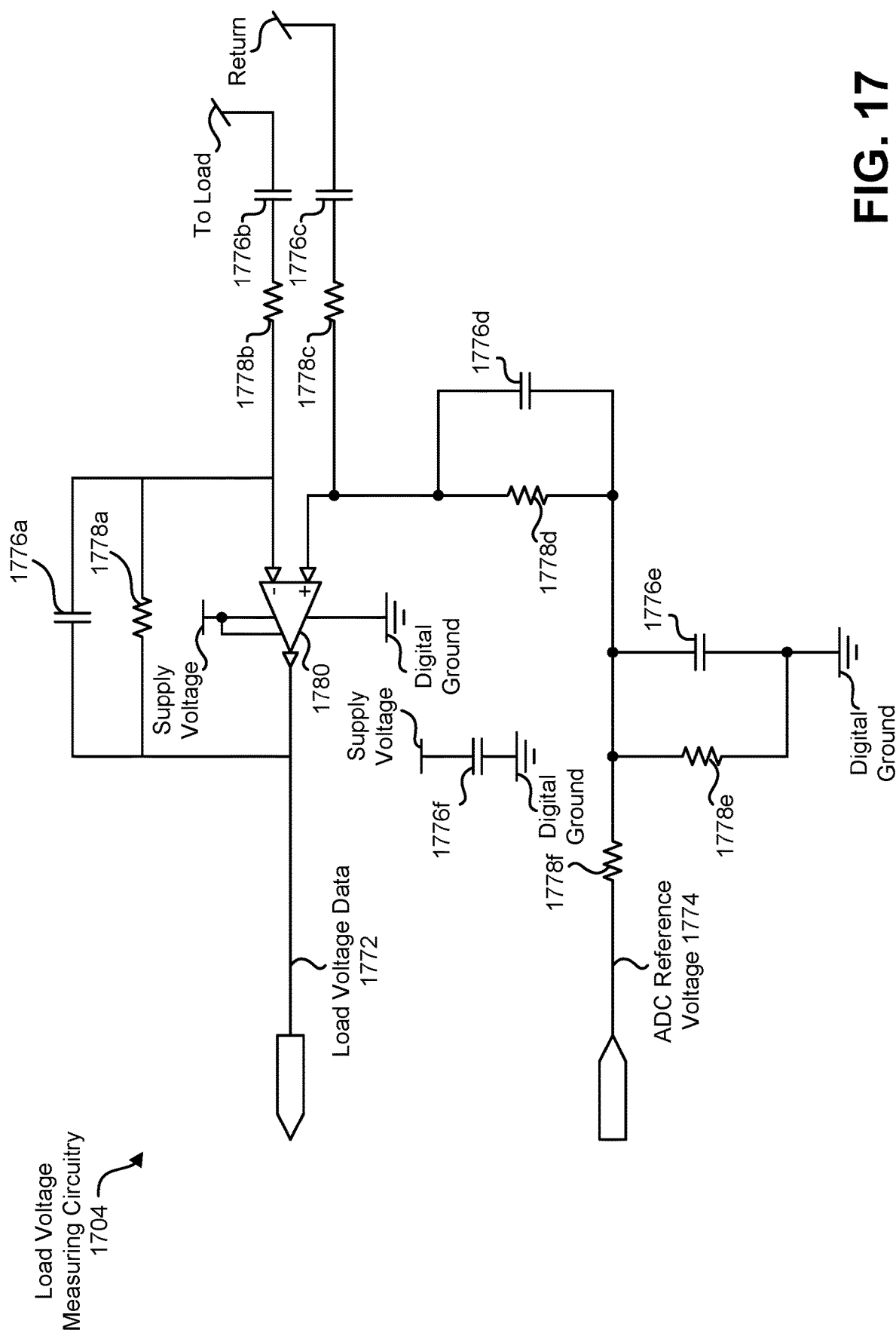
FIG. 17 is a circuit diagram illustrating one example of load voltage measuring circuitry that may be implemented in accordance with some configurations of the systems and methods disclosed herein.

FIG. 17 is a circuit diagram illustrating one example of load voltage measuring circuitry 1704 that may be implemented in accordance with some configurations of the systems and methods disclosed herein. As illustrated in FIG. 17, the load voltage measuring circuitry may include capacitors 1776*a-f*, resistors 1778*a-f*, and an amplifier 1780. The load voltage measuring circuitry 1704 may include a load coupling (e.g., terminal) and a return (e.g., neutral) coupling (e.g., terminal). The load voltage measuring circuitry 1704 may be coupled to a supply voltage (e.g., 3 V) and to digital ground. The load voltage measuring circuitry 1704 may receive an ADC reference voltage 1774. The ADC reference voltage 1774 may be a reference voltage (e.g., 1.2 V) from a processor in some configurations.

In some configurations, example values for the capacitors 1776*a-f* and resistors 1778*a-f* may be given as follows. Capacitor A 1776*a* may have a 10 picofarad (pF) capacitance, capacitor B 1776*b* may have a 22 microfarad (μF) capacitance, capacitor C 1776*c* may have a 22 μF capacitance, capacitor D 1776*d* may have a 10 pf capacitance, capacitor E 1776*e* may have a 47 μF capacitance, and/or capacitor F 1776*f* may have a 0.1 μF capacitance. Resistor A 1778*a* may have a 3.3 kiloohm (kΩ) resistance, resistor B 1778*b* may have a 3.3 megaohm (MΩ) resistance, resistor C 1778c may have a 3.3 MΩ resistance, resistor D 1778d may have a 3.3 kΩ resistance, resistor E 1778e may have a 10 kΩ resistance, and/or resistor F 1778f may have a 10 kΩ resistance. The load voltage measuring circuitry 1704 may measure (e.g., sample) the load voltage between the load and the return couplings. For example, the amplifier 1780 may provide load voltage data 1772 (e.g., one or more load voltage samples) to a processor. The load voltage data 1772 may provide or be an example of the load voltage measurement described herein. For example, a series of load voltage data 1772 (over one or more cycles, for example) may provide a load voltage measurement. The load voltage measuring circuitry 1704 may take the differential between return and load. The differential may be direct current (DC) decoupled and then amplified to be centered between the ADC reference voltage.

Figure 18:
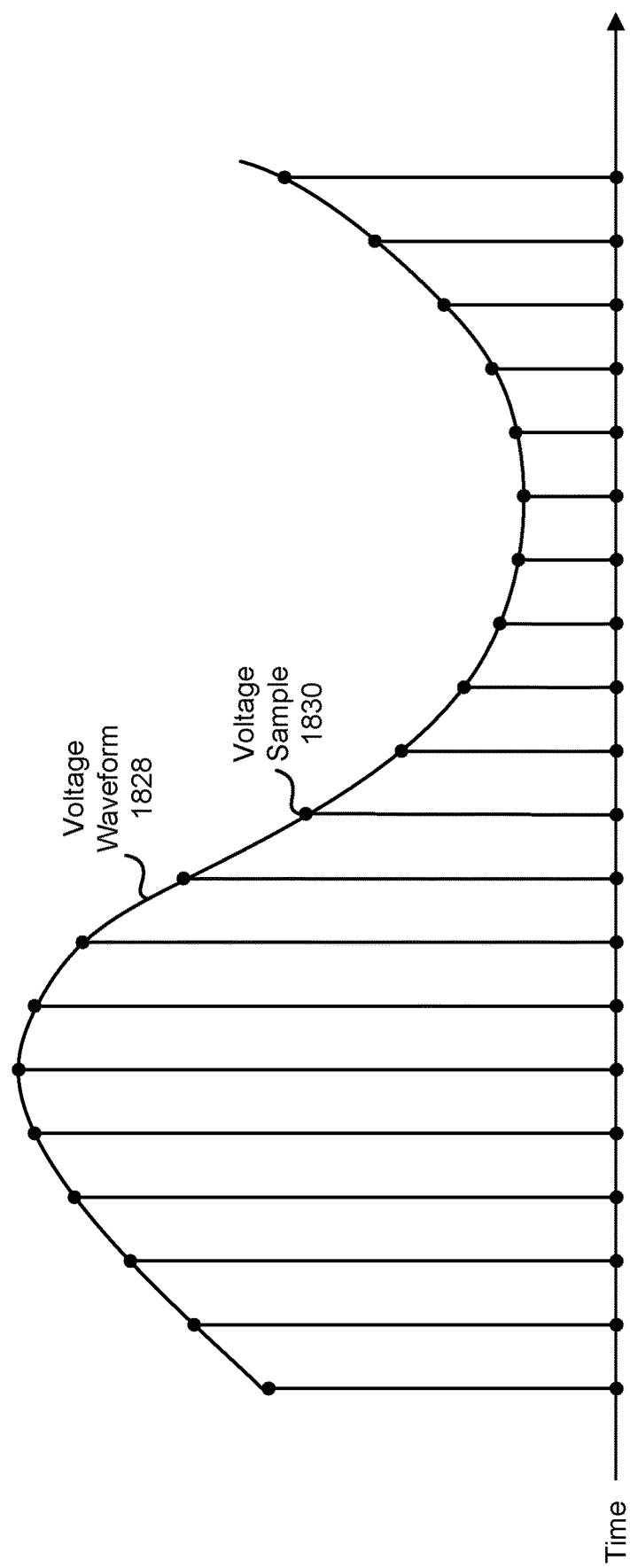
FIG. 18 illustrates an example of a voltage waveform.

FIG. 18 illustrates an example of a voltage waveform 1828. The voltage waveform 1828 may correspond to a continuous alternating current (AC) voltage signal. The voltage waveform 1828 may be captured by sampling the continuous AC signal to produce a discrete (e.g., digital) signal. For example, the voltage waveform 1828 may include multiple voltage samples 1830. Each voltage sample 1830 may correspond to a voltage amplitude measured at discrete time intervals. Therefore, each voltage sample 1830 may be associated with a particular voltage amplitude and a particular time.

In some configurations, the voltage waveform 1828 may be captured by one or more of the electronic devices described herein. For example, load voltage measurement circuitry may continuously capture the voltage waveform 1828 by sampling the voltage waveform 1828 for one or more cycles of AC. For example, the load voltage measurement circuitry may sample the voltage waveform 1828 across a load. In some configurations, the line voltage measurement circuitry may similarly sample a voltage waveform between a line feed and neutral. The electronic device may use an ADC for capturing a discrete time (e.g., digital) voltage waveform 1828 of the AC signal by sampling the continuous time voltage waveform 1828 captured by the voltage sensor. In some implementations, the electronic device may place the voltage samples 1830 in memory (e.g., on-board processor memory, separate memory, etc.) for use in detecting a load type and/or detecting load coupling. In some configurations, a processor (e.g., processor 112, processor 1012, etc.) may include a set of program instructions for utilizing the load voltage measuring circuitry to capture the voltage waveform 1828.

Figure 19:
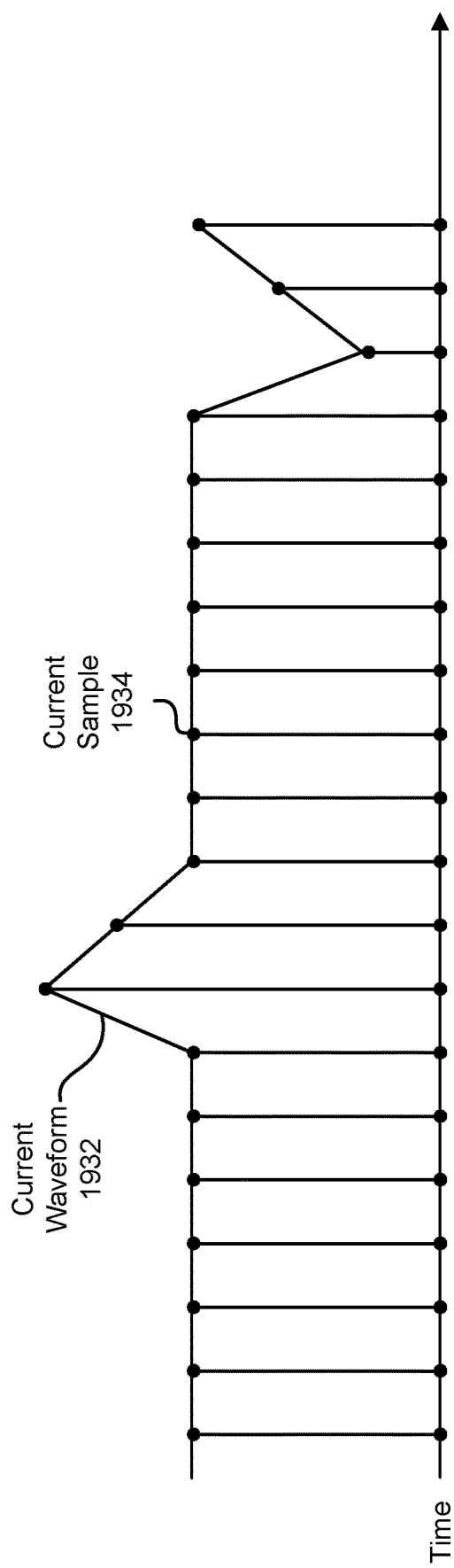
FIG. 19 illustrates an example of a current waveform.

FIG. 19 illustrates an example of a current waveform 1932. The current waveform 1932 may correspond to a continuous alternating current (AC) signal. The current waveform 1932 may be captured by sampling the continuous AC signal to produce a discrete (e.g., digital) signal. For example, the current waveform 1932 may include multiple current samples 1934. Each current sample 1934 may correspond to current amplitude measured at discrete time intervals. Therefore, each current sample 1934 may be associated with a particular current amplitude and a particular time.

In one configuration, the current waveform 1932 may be captured by an electronic device (e.g., current measuring circuitry) as described herein. For example, current measuring circuitry may continuously capture the current waveform 1932 by sampling the current waveform 1932 for one or more cycles of AC. The current measuring circuitry may capture a continuous time current waveform 1932 of the current from the source. The electronic device may use an ADC for capturing a discrete time (e.g., digital) current waveform 1932 of the AC signal by sampling the continuous time current waveform 1932 captured by the current measuring circuitry. In some configurations, the electronic device may place the current samples 1934 in memory (e.g., on-board processor memory, separate memory, etc.) for use in detecting a load type. In some configurations, a processor (e.g., processor 112) may include a set of program instructions for utilizing the current measuring circuitry to capture the current waveform 1932.

Figure 20:
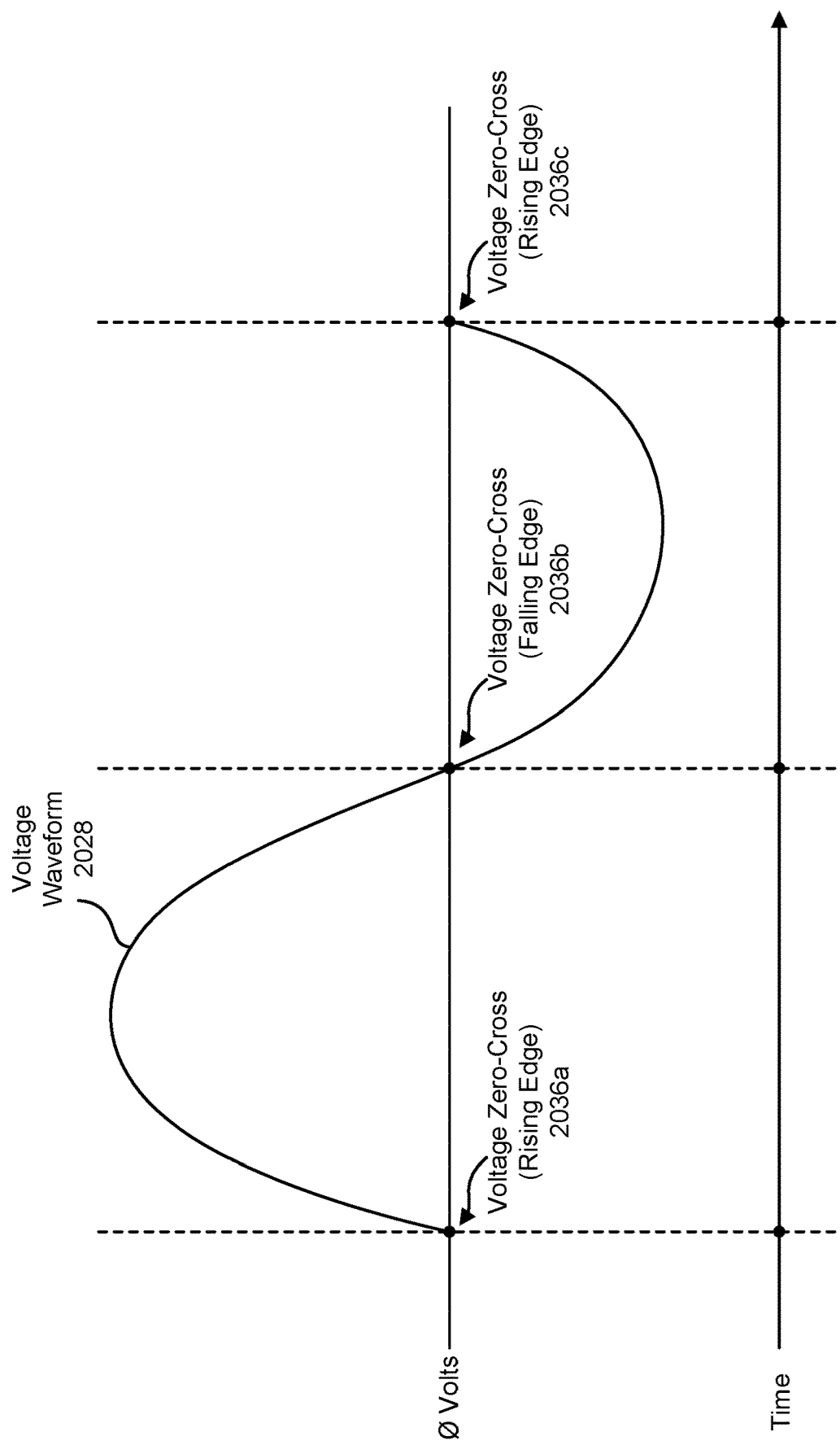
FIG. 20 illustrates multiple examples of voltage zero crossings associated with a voltage waveform.

FIG. 20 illustrates multiple examples of voltage zero crossings 2036 associated with a voltage waveform 2028. The voltage waveform 2028 may correspond to an alternating current (AC) signal. As the polarity of the AC signal alternates between positive and negative over an AC cycle, the voltage waveform 2028 will cross a zero-point where the value of the voltage is zero. The time corresponding to the point when the value of the voltage is zero is the voltage zero cross 2036. If the voltage is increasing when the voltage waveform 2028 crosses the zero point, the voltage zero cross 2036 is a rising edge voltage zero cross 2036a, c. If the voltage is decreasing when the voltage waveform 2028 crosses the zero-point, the voltage zero cross 2036 is a falling edge voltage zero cross 2036b.

The voltage waveform 2028 may be captured by sampling the continuous AC signal to produce a discrete (e.g., digital) signal as described above in relation to FIG. 18. The sampled voltage waveform 2028 may be stored in memory. The electronic device 102 may obtain the voltage zero cross 2036 based on the sampled voltage waveform 2028. For example, the electronic device 102 may determine when the value of the voltage changes sign (e.g., from positive to negative). The time associated with the voltage sample following the change in voltage sign may be the voltage zero cross 2036. Additionally or alternatively, the electronic device (e.g., electronic device 102, electronic device 1002) may include a simple AC circuit that produces a pulse each time the voltage waveform 2028 crosses zero volts in some configurations.

Figure 21:
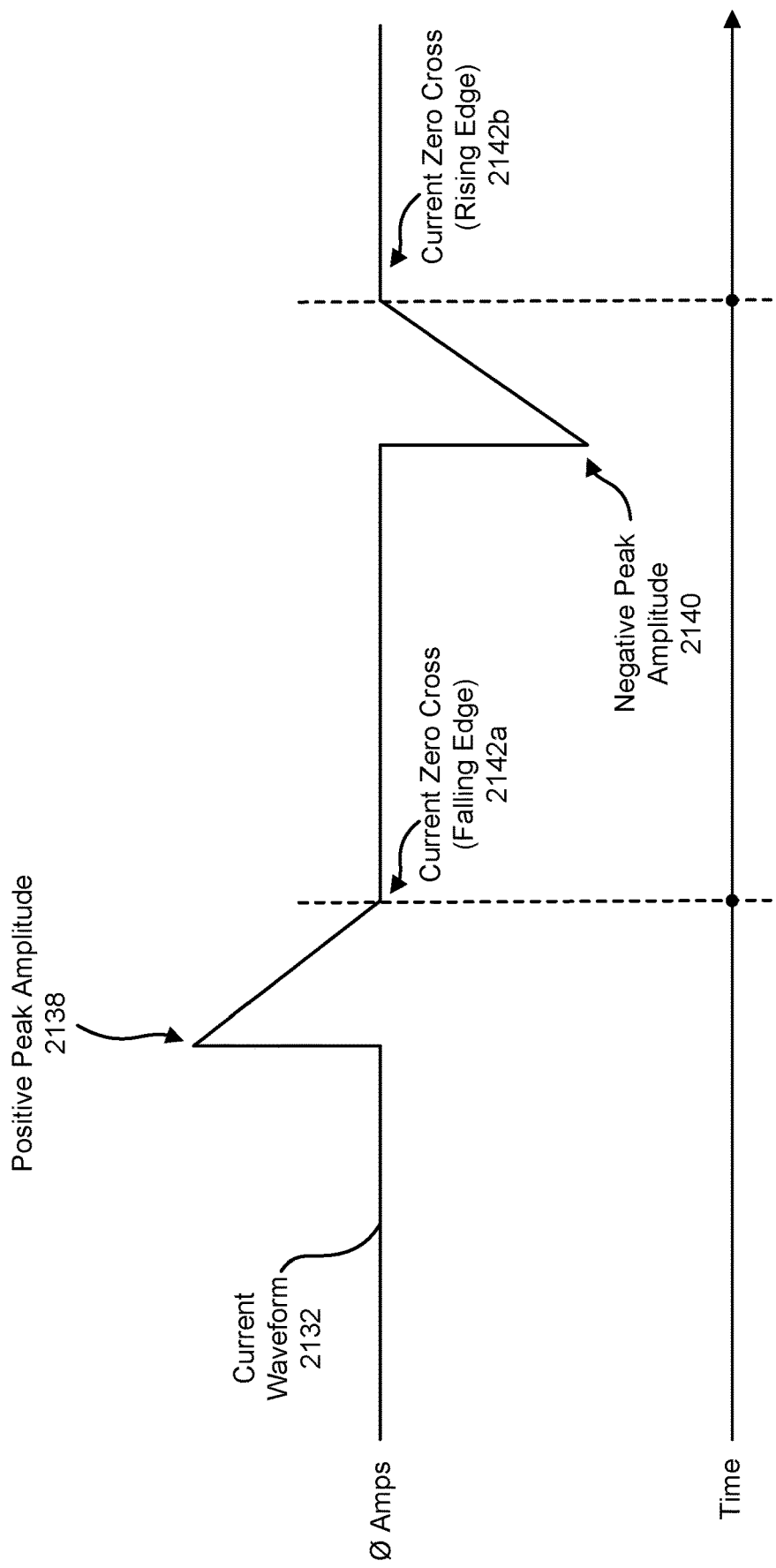
FIG. 21 illustrates multiple examples of current zero crossings associated with a current waveform.

FIG. 21 illustrates multiple examples of current zero crossings 2142 associated with a current waveform 2132. The current waveform 2132 may correspond to an alternating current (AC) signal. As the polarity of the AC signal alternates between positive and negative over an AC cycle, the current waveform 2132 will also alternate between positive and negative values. The current zero cross 2142 occurs at the time where the current is zero following an earlier point where the current is non-zero for a measurable duration. Therefore, the current zero cross 2142 may be the first point when the amplitude of the current is zero following a peak (positive or negative) current amplitude. For example, in FIG. 21, the value of the current is initially zero and then rises to a positive peak amplitude 2138 and decreases to zero amps. In this example, the current zero cross 2142a is the first time when the current equals zero after rising to the measurable positive peak amplitude 2138. If the current is decreasing (from a positive peak amplitude 2138, for instance) when the current waveform 2132 equals zero, the current zero cross 2142 is a falling edge current zero cross 2142a. If the current is increasing (from a negative peak amplitude 2140, for instance) when the current waveform 2132 equals zero, the current zero cross 2142 is a rising edge current zero cross 2142b.

The current waveform 2132 may be captured by sampling the continuous AC signal to produce a discrete (e.g., digital) signal as described above in relation to FIG. 19. The sampled current waveform 2132 may be stored in memory.

An electronic device (e.g., electronic device 102) may obtain the current zero cross 2142 based on the sampled current waveform 2132. For example, the electronic device 102 may determine when the value of the current initially changes from zero to non-zero. The electronic device may then determine when the current reaches zero again. The time associated with the current reaching zero may be the current zero cross 2142. In some configurations, the electronic device 102 may utilize an analog-to-digital converter (ADC) to capture the current waveform and determine the current zero cross 2142.

Figure 22:
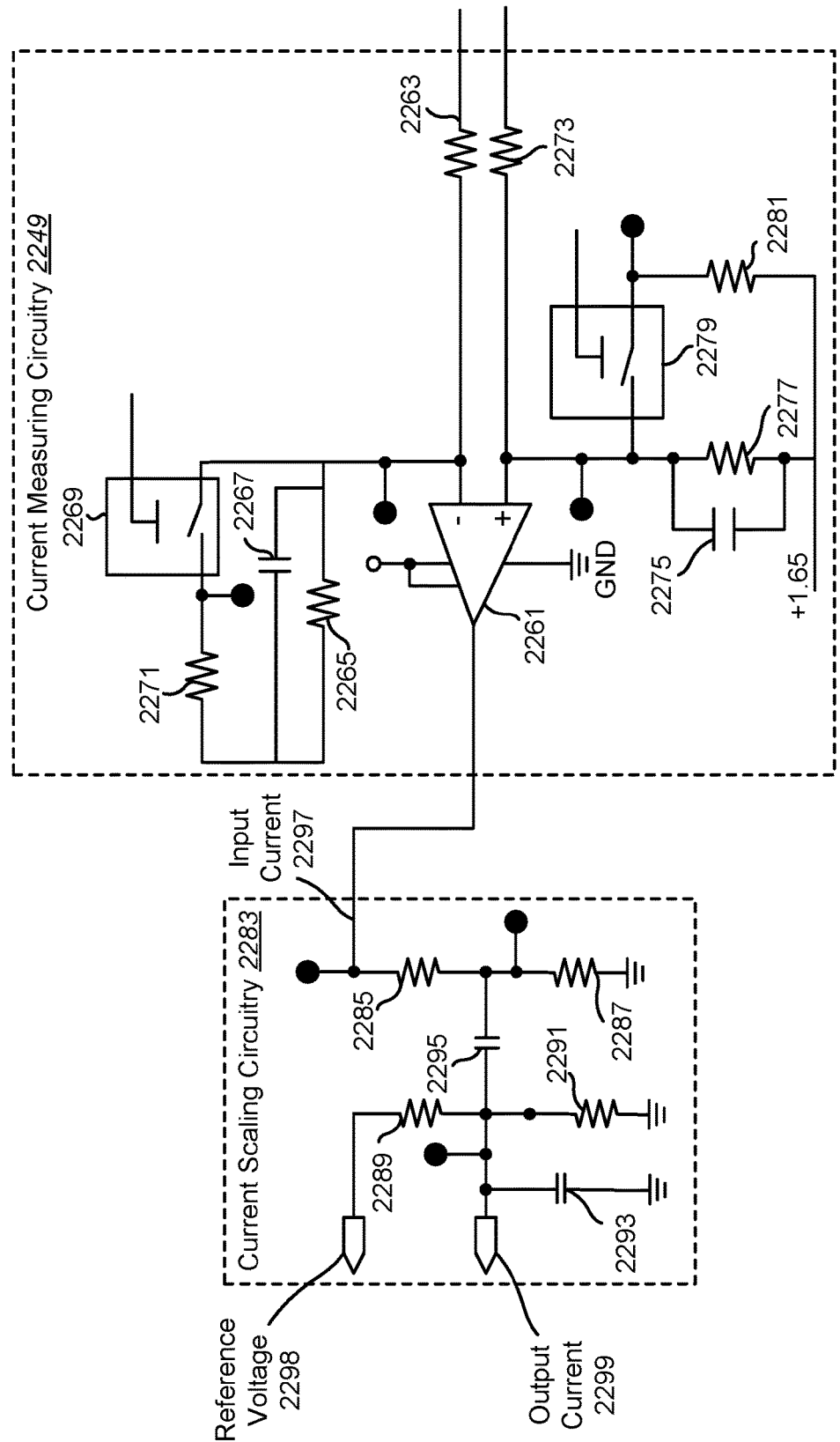
FIG. 22 is a circuit diagram illustrating one configuration of circuitry that may be implemented in one or more of the current measuring circuitries described herein.

FIG. 22 is a circuit diagram illustrating one configuration of circuitry that may be implemented in one or more of the current measuring circuitries described herein (e.g., current measuring circuitry 648, current measuring circuitry 848, etc.). In some configurations, the current measuring circuitry may include circuitry to implement a current measuring circuitry 2249.

The circuitry of FIG. 22 shows one configuration of resistors, capacitors and other discrete components that may be implemented within the current measuring circuitry 2249. For example, the current measuring circuitry 2249 may include an amplifier 2261. The amplifier 2261 may be coupled to a supply voltage and to ground. The output of the amplifier 2261 may be coupled to other components within an electronic device (e.g., electronic device, electronic device 602, electronic device 802, electronic device 1002, electronic device 1102, electronic device 1502, etc.). The negative input of the amplifier 2261 may be coupled to a first resistor 2263. The negative input of the amplifier 2261 may also be coupled to other components within the electronic device. The negative input of the amplifier 2261 may also be coupled to a second resistor 2265 and a first capacitor 2267 in parallel. The negative input of the amplifier 2261 may also be coupled to a first analog switch 2269 connected to a third resistor 2271 and other components within the electronic device. The first analog switch 2269 and the third resistor 2271 may be in parallel to the first capacitor 2267 and the second resistor 2265. The positive input of the amplifier 2261 may be coupled to a fourth resistor 2273. The positive input of the amplifier 2261 may be coupled to other components within the electronic device. The positive input of the amplifier 2261 may also be coupled to a second capacitor 2275 and a fifth resistor 2277 in parallel. The positive input of the amplifier 2261 may also be coupled to a second analog switch 2279, which is coupled to a sixth resistor 2281. The second analog switch 2279 and the sixth resistor 2281 may be in parallel to the fifth resistor 2277 and the second capacitor 2275. The second capacitor 2275, fifth resistor 2277 and sixth resistor 2281 may be coupled to a reference voltage between the supply voltage and the ground.

The current measuring circuitry 2249 may include a first analog switch 2269 and a second analog switch 2279. The analog switches 2269, 2279 may be used to control a threshold value of current flowing through the electronic device. For example, a specific load 122 may have an inrush current and settling time specifications that indicate different levels of current that may safely flow through the electronic device at a given time of operation. The analog switches 2269, 2279 may be used to modify a threshold value based on an appropriate amount of current that should be allowed to pass through the electronic device. The analog switches 2269, 2279 may be adjusted multiple times during operation of a load to adjust for current variations.

In some configurations, the current measuring circuitry may also include circuitry to implement current scaling circuitry 2283. The current scaling circuitry 2283 may be implemented in some configurations of the current measuring circuitry described herein. For example, the current scaling circuitry 2283 may interface between current measuring circuitry 2249 and a processor (e.g., microprocessor). The current scaling circuitry 2283 may include a network of resistors for scaling a current. The network of resistors may include a first resistor 2285, second resistor 2287, third resistor 2289, and fourth resistor 2291. The first resistor 2285 may be coupled to other components within the electronic device. The first resistor 2285 may also be coupled to the second resistor 2287. The second resistor 2287 may be coupled to ground. The third resistor 2289 may be coupled to a reference voltage 2298. The third resistor 2289 may also be coupled to the fourth resistor 2291 and/or to other components within the electronic device. The fourth resistor 2291 may be coupled in parallel to a first capacitor 2293 and a current reference. The fourth resistor 2291 and first capacitor 2293 may each be coupled to ground. Each of the first resistor 2285, second resistor 2287, third resistor 2289, and fourth resistor 2291 may be coupled together via a second capacitor 2295. The inputs of the current scaling circuitry 2283 may include an input current 2297 (from the current measuring circuitry 2249, for instance). The outputs of the current scaling circuitry 2283 may include an output current 2299 and a reference voltage 2298.

Figure 23:
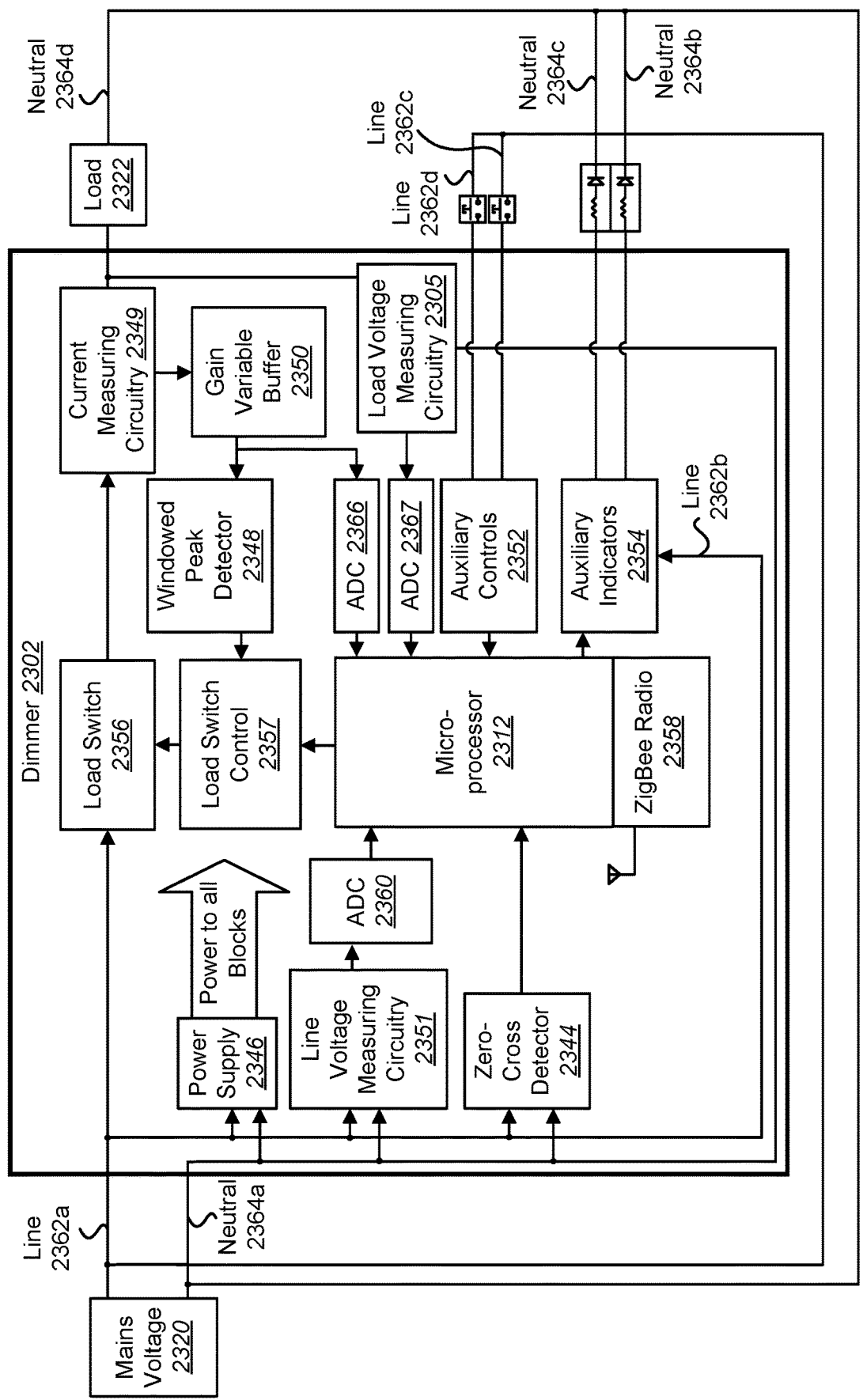
FIG. 23 is a block diagram illustrating one configuration of a dimmer in which systems and methods for detecting load coupling and/or systems and methods for detecting a load type may be implemented.

FIG. 23 is a block diagram illustrating one configuration of a dimmer 2302 in which systems and methods for detecting load coupling and/or systems and methods for detecting a load type may be implemented. The dimmer 2302 of FIG. 23 may be one example of the electronic device 102 described above in connection with FIG. 1. In some configurations, one or more of the elements described in connection with FIG. 23 may be configured with similar functionality to corresponding elements described herein.

The dimmer 2302 may receive a voltage waveform from a mains voltage 2320. The dimmer 2302 may also include an internal power supply 2346 coupled to the mains voltage 2320 that provides power to each module/block within the dimmer 2302. The mains voltage 2320 may provide power to the dimmer 2302 via a line 2362a-d coupled to a load switch 2356, a power supply 2346, a line voltage measuring circuitry 2351, a zero-cross detector 2344, auxiliary indicators 2354, and/or auxiliary controls 2352. The mains voltage 2320 may also be coupled to the power supply 2346, the line voltage measuring circuitry 2351, the zero-cross detector 2344, the auxiliary indicators 2354, and a load 2322 via a neutral line 2364a-d. The neutral line 2364a-d may be a return line for different modules/blocks within the dimmer 2302 providing a return to a ground reference voltage.

The dimmer 2302 may include a microprocessor 2312. The microprocessor 2312 may include some or all of the components of one or more of the processors (e.g., processor 112, 612, 812, 1012, 1112, 1512, etc.) described herein. The microprocessor 2312 may include or be coupled to a ZigBee radio 2358. The ZigBee radio 2358 may be used for communicating with other electronic devices (e.g., a control system, other devices, etc.). The line voltage measuring circuitry 2351 may be coupled to the microprocessor 2312 via an ADC 2360. Load voltage measuring circuitry 2305 may be coupled across the load 2322 (if any). The load voltage measuring circuitry 2305 may be coupled to the microprocessor 2312 via a third ADC 2367. The current measuring circuitry 2349 may be coupled to the microprocessor 2312 via a second ADC 2366. The current measuring circuitry 2349 may also be coupled to a gain variable buffer 2350. The gain variable buffer 2350 may be coupled to a windowed peak detector 2348 and the second ADC 2366. In some configurations, the ADCs 2360, 2366, 2367 are part of the microprocessor 2312. The microprocessor 2312 may also be coupled to the zero-cross detector 2344, the auxiliary controls 2352, and the auxiliary indicators 2354. The microprocessor 2312 may also be coupled to the load switch 2356 for engaging or disengaging the load 2322 via instruction from a load switch control 2357.

Figure 24:
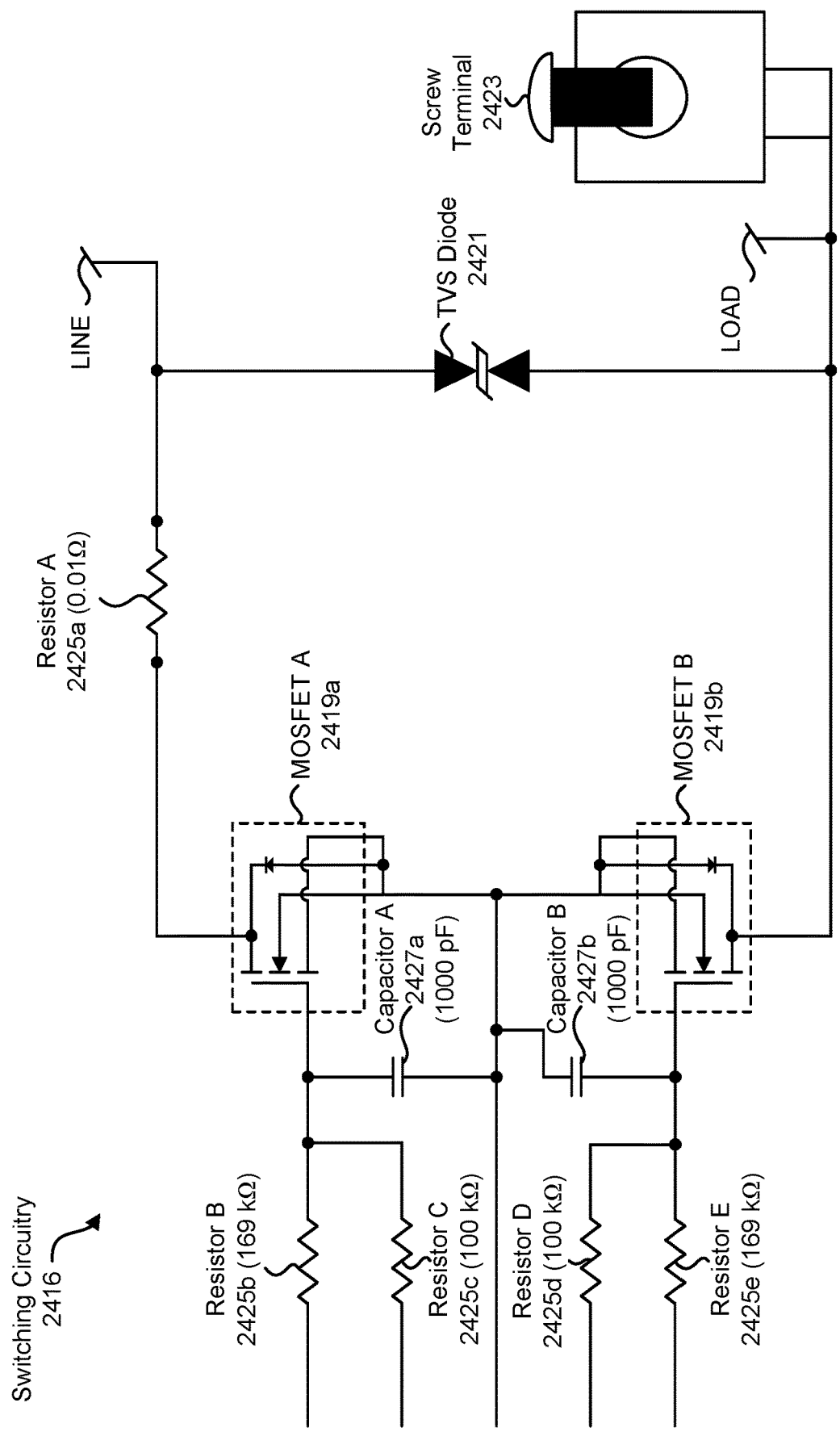
FIG. 24 is a diagram illustrating one example of switching circuitry that may be implemented in accordance with the systems and methods disclosed herein.

FIG. 24 is a diagram illustrating one example of switching circuitry 2416 that may be implemented in accordance with the systems and methods disclosed herein. The switching circuitry 2416 may be an example of one or more of the switching circuitries 116, 616, 816, 1116, 1516 described herein. In this example, the switching circuitry 2416 includes MOSFET A 2419a, MOSFET B 2419b, resistor A 2425a, resistor B 2425b, resistor C 2425c, resistor D 2425d, resistor E 2425e, capacitor A 2427a, capacitor B 2427b, a transient-voltage-suppression (TVS) diode 2421, and a screw terminal 2423. It should be noted that the values for the resistors and capacitors given in FIG. 24 may be examples. Other values may be implemented. The switching circuitry 2416 may be coupled to a line (e.g., line voltage) and to a load. When an AC signal is applied to the line (e.g., 120 V, 230 V, etc.), MOSFET A 2419a will conduct in the positive phase and MOSFET B 2419b will conduct in the negative phase if the gates of the MOSFETs 2419a-b are enabled (Vgs is satisfied). When the gates of the MOSFETs 2419a-b are not enabled, the MOSFETs 2419a-b will not activate (e.g., turn on) and will block the positive and negative AC voltage.

Figure 25:
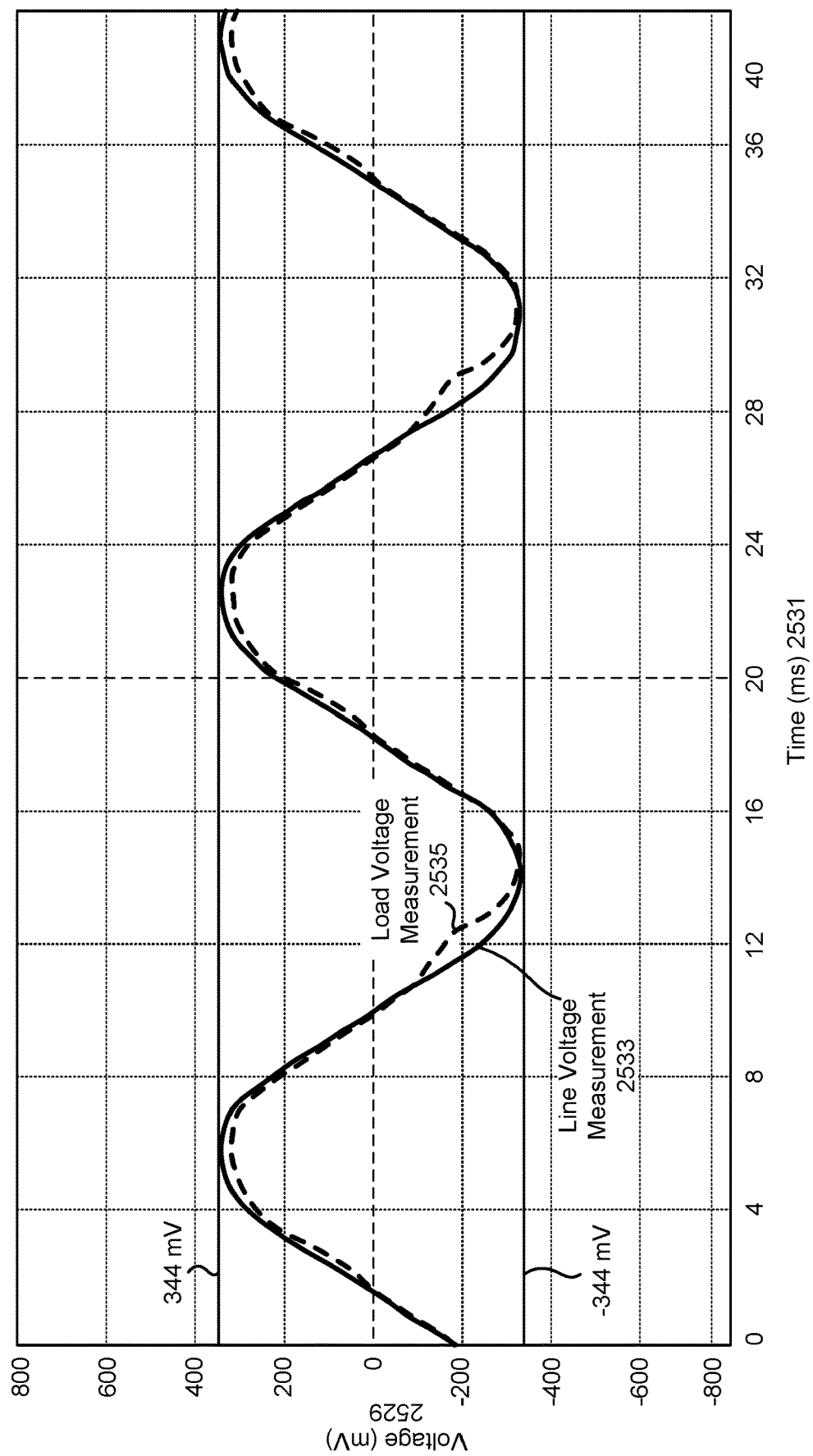
FIG. 25 is a graph illustrating an example of a load voltage measurement and a line voltage measurement.

FIG. 25 is a graph illustrating an example of a load voltage measurement 2535 and a line voltage measurement 2533. The graph is illustrated in voltage 2529 (mV) over time 2531 (ms). As can be observed in FIG. 25, one or more aspects of a load voltage measurement 2535 may be compared to one or more aspects of a line voltage measurement 2533 to determine whether a load is coupled or not. For example, the electronic device 1002 may compare an amplitude of the load voltage measurement 2535 to an amplitude of the line voltage measurement 2533. For instance, the load voltage measurement 2535 indicates peak amplitudes that are approximately 93% of the line voltage measurement 2533 peak on the positive side (e.g., above a threshold) and approximately 100% of the line voltage measurement 2533 peak on the negative side. This may indicate that the electronic device 1002 is unloaded.

Additionally or alternatively, the electronic device 1002 may compare a time aspect of the load voltage measurement 2535 to a time aspect of the line voltage measurement 2533. As can be observed in FIG. 25, the time difference at zero cross may be small. It may be beneficial to compare one or more time differences at one or more different measurement points. For example, a time difference at 60% of the trailing edge or 31% of the leading edge may be larger than at zero cross. As illustrated in FIG. 25, the load voltage measurement 2535 may indicate a time difference that is beyond a time threshold, which may indicate that the electronic device 1002 is unloaded.

Figure 26:
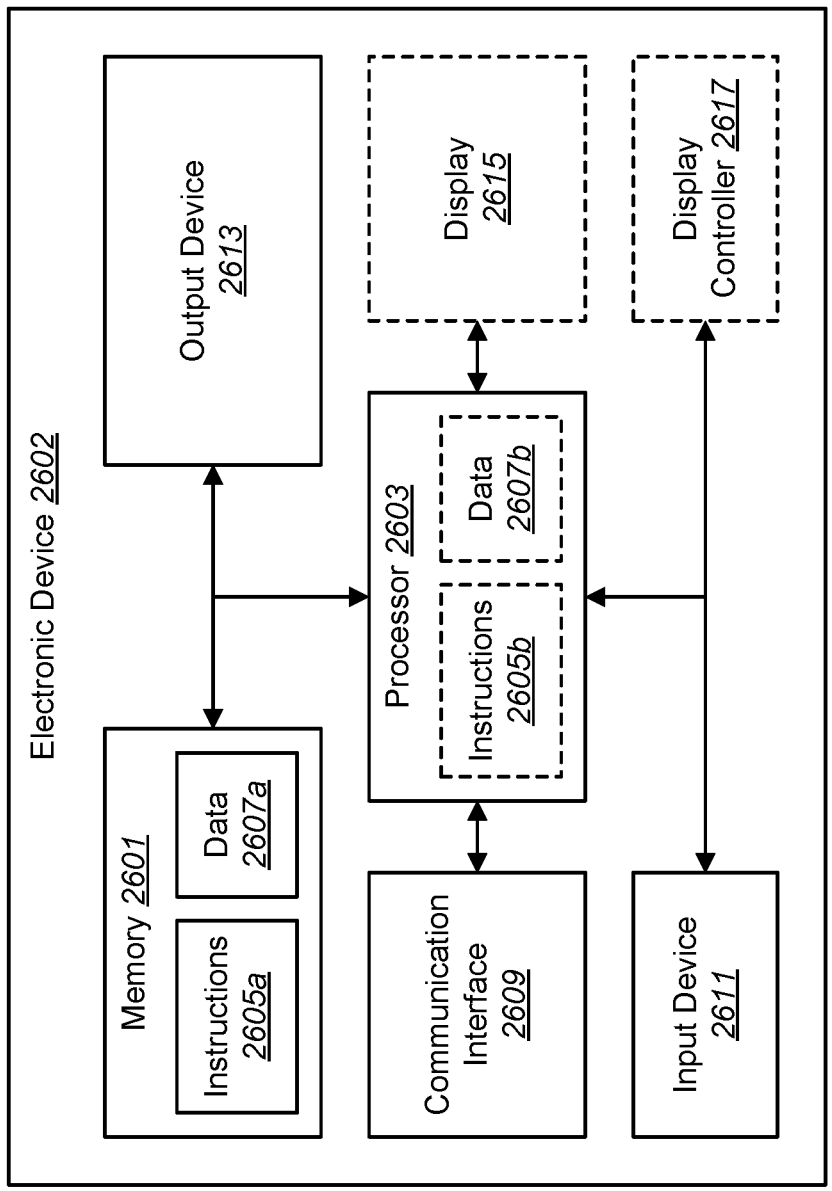
FIG. 26 illustrates various components that may be utilized in an electronic device.

FIG. 26 illustrates various components that may be utilized in an electronic device 2602. The electronic device 2602 described in connection with FIG. 26 may be configured in accordance with one or more of the electronic devices 102, 602, 802, 1002, 1102, 1502 described herein. For example, the electronic device 2602 may be configured to perform one or more of the methods 200, 400, 700, 900, 1200, 1600 described above. The electronic device 2602 may include a memory 2601, a communication interface 2609, an input device 2611, a processor 2603, an output device 2613, a display 2615, and/or a display controller 2617. The memory 2601 may store instructions 2605a and data 2607a. The processor 2603 may operate on instructions 2605b and data 2607b. It should be noted that the display 2615 and/or display controller 2617 may be optional. For example, some configurations of the electronic device 2602 may not have a display. Additionally or alternatively, some configurations of the electronic device 2602 may include a button interface (e.g., an input device 2611). Some configurations of the electronic device 2602 may be controlled on a remote display device (e.g., a touch panel) with communication through a remote device (e.g., a controller, home automation controller, etc.).

The term "discrete circuit" refers to an electronic circuit built out of discrete components. Examples of discrete components include resistors, capacitors, inductors, transformers, transistors, etc. In some configurations, a discrete circuit may not be a solid state integrated circuit that performs all of the functions described herein. However, a discrete circuit may include one or more discrete components contained in the same packaging (e.g., bridge rectifier, solid state relay, etc.). In some configurations, a discrete circuit made from discrete components refers to a circuit having separate components or circuits that perform individual finite functions. For instance, examples of a discrete circuit may include load voltage measuring circuitry, switching circuitry, a processor, line voltage measuring circuitry, and/or current measuring circuitry that may perform separate and discrete functions while being implemented within an electronic device. An electronic device may be housed within a wall box. Moreover, each module within an electronic device may include discrete components or discrete circuits. In some instances, the term "circuit" may refer to a circuit in its entirety, for example, including the impedance of the wall box device and the impedance of the load.

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The term "computer-readable medium" refers to any available medium that can be accessed by a computer or processor. A computer-readable medium may be non-transitory and tangible. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk, and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the systems, methods, and apparatus described herein without departing from the scope of the claims.

What is claimed is:

1. An electronic device for detecting a load type, comprising:
    zero-cross circuitry configured to detect a line voltage zero cross;
    switching circuitry configured to perform switching based on the line voltage zero cross to supply a load voltage;
    load voltage measuring circuitry configured to measure the load voltage to produce a load voltage measurement, wherein the load voltage measuring circuitry is coupled between terminal lines for a load; and
    a processor coupled to the zero-cross circuitry, to the switching circuitry, and to the load voltage measuring circuitry, wherein the processor is configured to determine a voltage spike threshold relative to a line voltage measurement, the processor is configured to determine a load type based on the load voltage measurement and the voltage spike threshold, and wherein the processor is configured to control the switching circuitry to drive the load based on the load type.

2. The electronic device of claim 1, wherein the processor is configured to determine the load type based on the load voltage measurement by determining whether a load voltage spike is indicated by the load voltage measurement.

3. The electronic device of claim 2, wherein a load voltage spike is indicated in a case that the load voltage measurement exceeds the voltage spike threshold.

4. The electronic device of claim 3, further comprising line voltage measuring circuitry configured to produce the line voltage measurement.

5. The electronic device of claim 2, wherein in a case that a load voltage spike is indicated, the processor is configured to control the switching circuitry to drive the load in forward phase, and in case that a load voltage spike is not indicated, the processor is configured to control the switching circuitry to drive the load in reverse phase.

6. The electronic device of claim 1, further comprising current measuring circuitry configured to measure a current to produce a current measurement, wherein the processor is configured to determine the load type based on the load voltage measurement and the current measurement.

7. The electronic device of claim 6, wherein the processor is configured to determine a zero-cross difference between the load voltage measurement and the current measurement to determine the load type or is configured to determine a slope difference between the load voltage measurement and the current measurement to determine the load type.

8. A method for detecting a load type by an electronic device, comprising:
    detecting a line voltage zero cross;
    performing switching based on the line voltage zero cross to supply a load voltage;
    determining a voltage spike threshold relative to a line voltage measurement;
    measuring, using load voltage measuring circuitry that is coupled between terminal lines for a load, the load voltage to produce a load voltage measurement;
    determining a load type based on the load voltage measurement and the voltage spike threshold; and
    driving the load based on the load type.

9. The method of claim 8, wherein determining the load type based on the load voltage measurement comprises determining whether a load voltage spike is indicated by the load voltage measurement.

10. The method of claim 9, wherein a load voltage spike is indicated in a case that the load voltage measurement exceeds the voltage spike threshold.

11. The method of claim 10, further comprising:
    measuring a line voltage to produce the line voltage measurement.

12. The method of claim 9, wherein driving the load comprises driving the load in forward phase in a case that a load voltage spike is indicated or driving the load in reverse phase in case that a load voltage spike is not indicated.

13. The method of claim 8, further comprising:
    measuring a current to produce a current measurement; and
    determining the load type based on the load voltage measurement and the current measurement.

14. The method of claim 13, further comprising determining a zero-cross difference between the load voltage measurement and the current measurement to determine the load type or determining a slope difference between the load voltage measurement and the current measurement to determine the load type.

* * * * *